United States Patent
Park et al.

(10) Patent No.: US 12,490,563 B2
(45) Date of Patent: Dec. 2, 2025

(54) DISPLAY DEVICE

(71) Applicant: Samsung Display Co., LTD., Yongin-si (KR)

(72) Inventors: Do Yeong Park, Hwaseong-si (KR); Chong Chul Chai, Seoul (KR); Sung Chul Hong, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 434 days.

(21) Appl. No.: 18/191,063

(22) Filed: Mar. 28, 2023

(65) Prior Publication Data

US 2023/0317910 A1     Oct. 5, 2023

(30) Foreign Application Priority Data

Mar. 31, 2022 (KR) .................. 10-2022-0040348

(51) Int. Cl.
| | | |
|---|---|---|
| H01L 33/62 | (2010.01) | |
| H01L 25/075 | (2006.01) | |
| H01L 25/16 | (2023.01) | |
| H10D 86/40 | (2025.01) | |
| H10D 86/60 | (2025.01) | |
| H10H 20/857 | (2025.01) | |

(52) U.S. Cl.
CPC ....... *H10H 20/857* (2025.01); *H01L 25/0753* (2013.01); *H01L 25/167* (2013.01); *H10D 86/441* (2025.01); *H10D 86/60* (2025.01)

(58) Field of Classification Search
None
See application file for complete search history.

(56) References Cited

FOREIGN PATENT DOCUMENTS

| | | |
|---|---|---|
| JP | 2017-098509 | 6/2017 |
| JP | 2020-086452 | 6/2020 |
| JP | 2021-150577 | 9/2021 |
| KR | 10-2017-0141305 | 12/2017 |
| KR | 10-2018-0009014 | 1/2018 |
| KR | 10-2018-0011404 | 2/2018 |
| KR | 10-2021-0143350 | 11/2021 |
| KR | 10-2022-0037015 | 3/2022 |

*Primary Examiner* — William C Trapanese
(74) *Attorney, Agent, or Firm* — Womble Bond Dickinson (US) LLP

(57) ABSTRACT

A display device includes a first voltage line and a second voltage line extending in a first direction and spaced apart from each other in a second direction, a data line disposed between the first voltage line and the second voltage lines and extending in the first direction, a first electrode extending in the first direction and electrically connected to the first voltage line, a second electrode extending in the first direction and electrically connected to the second voltage line, light emitting elements on the first electrode and the second electrode, and a first connection pattern layer spaced apart from the first electrode and the second electrode and electrically connected to the first voltage line, and a second connection pattern layer electrically connected to the data line. The first connection pattern layer, the second connection pattern layer, the first electrode, and the second electrode are on a same layer.

20 Claims, 29 Drawing Sheets

DISPLAY DEVICE

CROSS-REFERENCE TO RELATED APPLICATION(S)

This application claims priority to and benefits of Korean Patent Application No. 10-2022-0040348 under 35 U.S.C. § 119, filed on Mar. 31, 2022, in the Korean Intellectual Property Office (KIPO), the entire contents of which are incorporated herein by reference.

BACKGROUND

1. Technical Field

Embodiments relate to a display device.

2. Description of the Related Art

The importance of display devices has steadily increased with the development of multimedia technology. Various types of display devices such as an organic light emitting display (OLED), a liquid crystal display (LCD) and the like have been used in various fields.

A device for displaying an image of a display device includes a self-light emitting display device with a light emitting element. The self-light emitting display device includes a light emitting element such as an organic light emitting display device implemented by using an organic material and an inorganic light emitting display device implemented by using an inorganic material.

SUMMARY

Embodiments provide a display device including a connection pattern layer that is the trace of electrical connection with two different wires and capable of preventing misalignment of a light emitting element.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a first voltage line and a second voltage line extending in a first direction and spaced apart from each other in a second direction intersecting the first direction, a data line disposed between the first voltage line and the second voltage line and extending in the first direction, a first electrode extending in the first direction and electrically connected to the first voltage line, a second electrode spaced apart from the first electrode in the second direction and extending in the first direction and electrically connected to the second voltage line, a plurality of light emitting elements disposed between the first electrode and the second electrode, and a first connection pattern layer spaced apart from the first electrode and the second electrode and electrically connected to the first voltage line, and a second connection pattern layer electrically connected to the data line, wherein the first connection pattern layer, the second connection pattern layer, the first electrode, and the second electrode may be disposed on a same layer, and the first connection pattern layer and the second connection pattern layer may be spaced apart from each other.

In an embodiment, the display device may further include a third voltage line extending in the second direction to intersect the first voltage line and in contact with the first voltage line, and a first bridge pattern layer overlapping the data line, wherein the first connection pattern layer may overlap the first voltage line and the third voltage line and may be in contact with the third voltage line, and the second connection pattern layer may overlap the first bridge pattern layer and is in contact with the first bridge pattern layer.

In an embodiment, the third voltage line and the first bridge pattern layer may be disposed at a higher level than the first voltage line and the second voltage line, and the third voltage line and the first bridge pattern layer may be disposed at a lower level than the first connection pattern layer and the second connection pattern layer.

In an embodiment, the display device may further include a fourth voltage line extending in the second direction, and an electrode pattern layer disposed between the third voltage line and the fourth voltage line, wherein the third voltage line, the fourth voltage line, and the first bridge pattern layer may be disposed on the same layer, the first electrode may be in contact with the electrode pattern layer, and the second electrode may be in contact with the fourth voltage line.

In an embodiment, the display device may further include an initialization voltage line extending in the first direction between the first voltage line and the data line, a second bridge pattern layer overlapping the initialization voltage line and in contact with the initialization voltage line, and a third connection pattern layer overlapping the second bridge pattern layer and in contact with the second bridge pattern layer.

In an embodiment, the third connection pattern layer, the first electrode and the second electrode, the first connection pattern layer, and the second connection pattern layer may be disposed on a same layer, and the third connection pattern layer may be spaced apart from the first connection pattern layer and the second connection pattern layer.

In an embodiment, the third connection pattern layer may be spaced apart from the second connection pattern layer in the first direction, and the first connection pattern layer may be spaced apart from the second connection pattern layer in the second direction.

In an embodiment, the display device may further include a third electrode spaced apart from the first electrode in the second direction, wherein the first electrode and the third electrode may extend in the first direction and may be spaced apart from another first electrode and another third electrode in the first direction by a first separation portion, and the second electrode may be disposed so as not to overlap the first separation portion in the first direction.

In an embodiment, the first connection pattern layer and the second connection pattern layer may be spaced apart from each other in the second direction by the third electrode on a side of the first separation portion in the first direction, and the third connection pattern layer may be disposed on another side of the first separation portion in the first direction and disposed between the first electrode and the third electrode.

In an embodiment, the display device may further include a bank layer including portions extending in the first direction and the second direction and surrounding a region where the light emitting elements are disposed, wherein the second electrode may intersect the portion of the bank layer extending in the second direction, and the first separation portion may be disposed outside the region surrounded by the bank layer.

In an embodiment, the display device may further include a display area in which the light emitting elements and the first and second electrodes are disposed, a non-display area disposed around the display area, a first bridge pattern layer overlapping the first connection pattern layer and the first voltage line in the non-display area, and a second bridge pattern layer overlapping the second connection pattern layer and the data line in the non-display area.

In an embodiment, the first connection pattern layer and the second connection pattern layer may be spaced apart from each other by a second separation portion, the second separation portion being disposed in the non-display area.

In an embodiment, the first bridge pattern layer and the second bridge pattern layer may be respectively disposed above the first voltage line and the data line and are disposed on a layer disposed below the first connection pattern layer and the second connection pattern layer.

According to an embodiment, a display device may include a display area and a non-display area surrounding the display area, a first voltage line and a second voltage line extending in a first direction in the display area and the non-display area and spaced apart from each other in a second direction intersecting the first direction, at least one data line extending in the first direction and disposed between the first voltage line and the second voltage line, an initialization voltage line extending in the first direction and disposed between the first voltage line and the data line, a plurality of bridge pattern layers disposed in the non-display area and in contact with any one of the first voltage line, the data line, and the initialization voltage line, a plurality of connection pattern layers electrically connected to any one of the first voltage line, the data line, and the initialization voltage line, and in contact with any one of the plurality of bridge pattern layers in the non-display area, a first electrode and a second electrode extending in the first direction in the display area and spaced apart from each other in the second direction, and a plurality of light emitting elements disposed on the first electrode and the second electrode, wherein the connection pattern layers, the first electrode, and the second electrode may be disposed on a same layer.

In an embodiment, the plurality of bridge pattern layers may be disposed at a higher level than the first voltage line and disposed at a lower level than the connection pattern layers.

In an embodiment, the first electrode and the plurality of bridge pattern layers may be disposed on a same layer as and may be in direct contact with an electrode pattern layer connected (e.g., electrically connected) to the first voltage line, and the second electrode and the plurality of bridge pattern layers may be disposed on a same layer as and may be in direct contact with a third voltage line in contact with the second voltage line.

In an embodiment, the data line may include a plurality of data lines disposed between the initialization voltage line and the second voltage line, each of the plurality of bridge pattern layers may include a first bridge pattern layer in contact with the first voltage line, a plurality of second bridge pattern layers respectively in contact with the plurality of data lines, and a third bridge pattern layer in contact with the initialization voltage line, the connection pattern layers may include a first connection pattern layer in contact with the first bridge pattern layer, a plurality of second connection pattern layers respectively in contact with the plurality of second bridge pattern layers, and a third connection pattern layer in contact with the third bridge pattern layer, and the first connection pattern layer, the second connection pattern layers, and the third connection pattern layer may be spaced apart from each other.

In an embodiment, the display device may further include a plurality of scan lines extending in the first direction and disposed across the display area and the non-display area, wherein any one of the plurality of bridge pattern layers may be in contact with any one of the scan lines, and any one of the connection pattern layers may be in direct contact with the plurality of bridge pattern layers in contact with the scan line.

In an embodiment, the display device may further include a plurality of sub-pixels arranged in the first direction and the second direction in the display area, the sub-pixel including the first electrode, the second electrode, and the light emitting elements, wherein each of the connection pattern layers and the plurality of bridge pattern layers may be disposed in the non-display area disposed on a side of the display area in the first direction, and may correspond to each column of the sub-pixels arranged in the second direction.

In an embodiment, the display device may further include a plurality of pixels arranged in the first direction and the second direction in the display area, the pixel including the first electrode, the second electrode, and the light emitting elements, wherein each of the connection pattern layers and the plurality of bridge pattern layers may be disposed in the non-display area disposed on another side of the display area in the first direction, and may correspond to each column of the pixels arranged in the second direction.

The display device according to an embodiment may suppress generation of an electric field that causes misalignment of the light emitting elements in an alignment process of the light emitting elements. Accordingly, in the display device, the misalignment rate of the light emitting elements may be reduced, thereby improving a product quality and a manufacturing yield.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
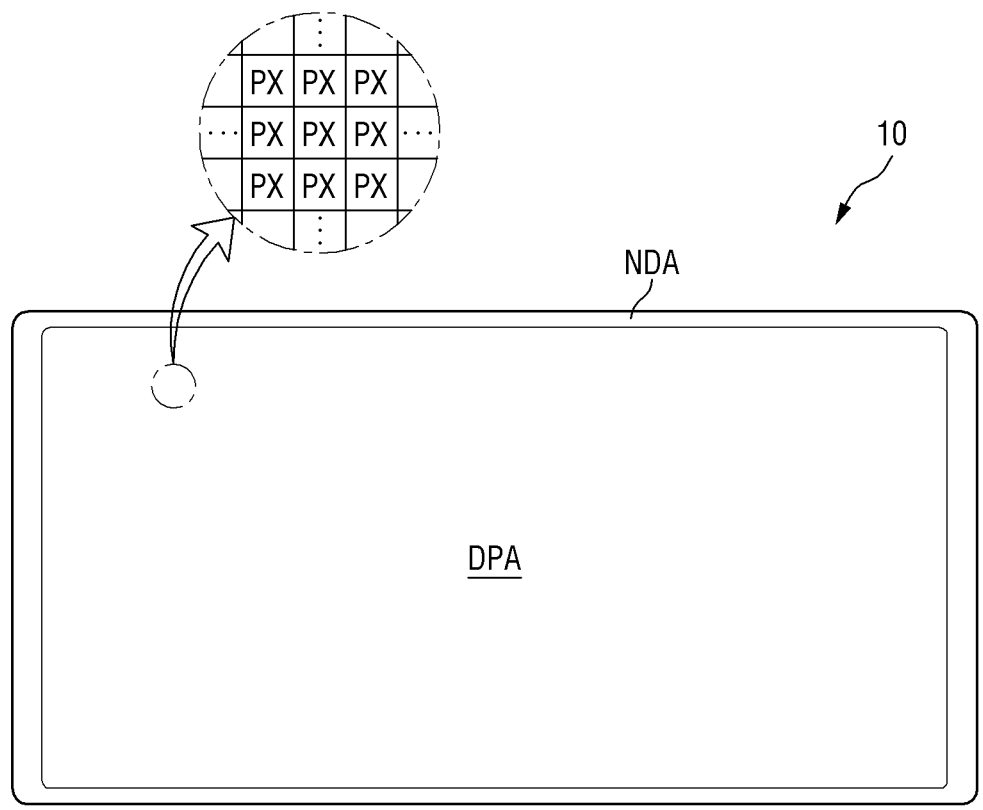
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, specific embodiments will be described with reference to the accompanying drawings.

FIG. 1 is a schematic plan view of a display device according to an embodiment.

Referring to FIG. 1, a display device 10 may display a moving image or a still image. The display device 10 may refer to electronic devices with a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but embodiments are not limited thereto, and other display panels may be applied to embodiments.

The shape of the display device 10 may be variously modified. For example, the display device 10 may have a shape such as a rectangular shape elongated in a horizontal direction (e.g., a second direction DR2), a rectangular shape elongated in a vertical direction (e.g., a first direction DR1), a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in the second direction DR2.

The display device 10 may include the display area DPA and a non-display area NDA. The display area DPA may be an area where a screen may be displayed, and the non-display area NDA is an area where a screen is not displayed. The display area DPA may also be referred to as an active region, and the non-display area NDA may also be referred to as a non-active region. The display area DPA may substantially cover the center area of the display device 10.

The display device 10 may include pixels PXs disposed in the display area DPA. The pixels PX may be arranged in a matrix. For example, different pixels PX may be arranged in the first direction DR1 and the second direction DR2. The shape of each pixel PX may be a rectangular or a square shape in a plan view. However, embodiments are not limited thereto. For example, each pixel PX may have a rhombic shape in which each side is inclined with respect to a direction. The pixels PX may be arranged in a stripe pattern or an island pattern. For example, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
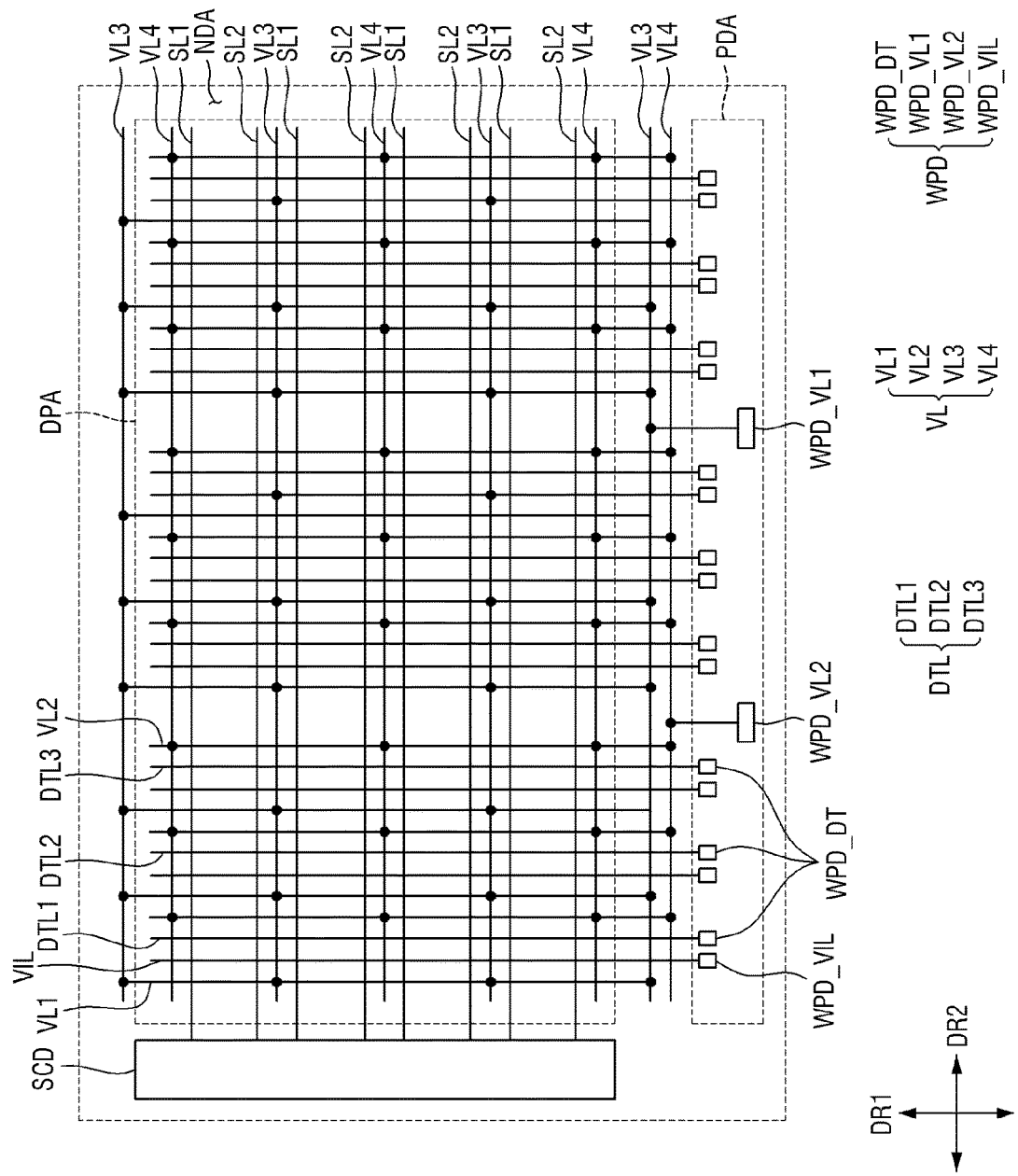
FIG. 2 is a schematic plan view illustrating arrangement of wires of a display device according to an embodiment.

FIG. 2 is a schematic plan view illustrating schematic arrangement of wires of a display device according to an embodiment.

Referring to FIG. 2, the display device 10 may include wires. The display device 10 may include scan lines SL1 and SL2, data lines DTL1, DTL2, and DTL3, an initialization voltage line VIL, and voltage lines VL (e.g., VL1, VL2, VL3, and VL4). For example, other wires may be further provided in the display device 10. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the second direction DR2. The first scan line SL1 and the second scan line SL2, which form a pair of scan lines, may be spaced apart from each other in the first direction DR1, and different pairs of the first scan line SL1 and the second scan line SL2 may be repeatedly arranged in the first direction DR1. The first scan line SL1 and the second scan line SL2 may be connected (e.g., electrically connected) to a scan driver SCD disposed at a side of the display area DPA in the second direction DR2. The first scan line SL1 and the second scan line SL2 may be disposed in the non-display area NDA to cross the display area DPA from the scan driver SCD in the second direction DR2.

The term "connected" as used herein may mean not only that a member is connected to another member through a physical contact, but also that a member is connected to another member through yet another member. This may also be understood as a part and another part as integral elements are connected into an integral element via another element. Furthermore, in case that an element is connected to another element, this may be construed as a meaning including an electrical connection via another element in addition to a direct connection in physical contact.

The data lines DTL may extend in the first direction DR1. The data lines DTL may include a first data line DTL1, a second data line DTL2, and a third data line DTL3, and each one of the first to third data lines DTL1, DTL2, and DTL3 may form a pair. The first to third data lines DTL1, DTL2, and DTL3 may be spaced apart from each other in the second direction DR2, and other wires may be disposed therebetween. Each of the data lines DTL1, DTL2, and DTL3 may extend from the pad area PDA disposed in the non-display area NDA to the display area DPA.

The initialization voltage line VIL may extend in the first direction DR1. The initialization voltage line VIL may be disposed between the data lines DTL and the first voltage line VL1. The initialization voltage line VIL may extend in the first direction DR1 from the pad area PDA disposed in the non-display area NDA to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DPA, and as for the third voltage line VL3 and the fourth voltage line VL4, some of the wires may be disposed in the display area DPA and other wires may be disposed in the non-display area NDA disposed on sides (e.g., opposite sides) of the display area DPA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the voltage lines VL may have a mesh structure in the entire display area DPA. However, embodiments are not limited thereto.

The data line DTL, the initialization voltage line VIL, the first voltage line VL1, and the second voltage line VL2 may be connected (e.g., electrically connected) to at least one wiring pad WPD. Each wiring pad WPD may be disposed in the non-display area NDA. In an embodiment, each of the line pads WPD may be disposed in the pad area PDA disposed on the lower side, which is another side of the display area DPA in the first direction DR1. The data lines DTL may be connected to different data line pads WPD_DT. The initialization voltage line VIL may be connected to an initialization line pad WPD_VIL, the first voltage line VL1 may be connected to a first voltage line pad WPD_VL1, and the second voltage line VL2 may be connected to a second voltage line pad WPD_VL2. The external devices may be mounted on the line pads WPD. The external devices may be mounted on the line pads WPD by applying an anisotropic conductive film, ultrasonic bonding or the like. The drawing illustrates that each of the line pads WPD is disposed on the pad area PDA disposed on the lower side of the display area DPA, but embodiments are not limited thereto. Some of the line pads WPD may be disposed in any one area on the upper side or on the left and right sides of the display area DPA.

Each pixel PX or sub-pixel SPXn (where n is an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 10, the pixel driving circuit may have a 3T-1C structure including three transistors and a capacitor. Hereinafter, the pixel driving circuit of the 3T-1C structure will be described as an example, but embodiments are not limited thereto, and various other modified structures such as a 2T-1C structure, a 7T-1C structure, and a 6T-1C structure may be applied.

Figure 3:
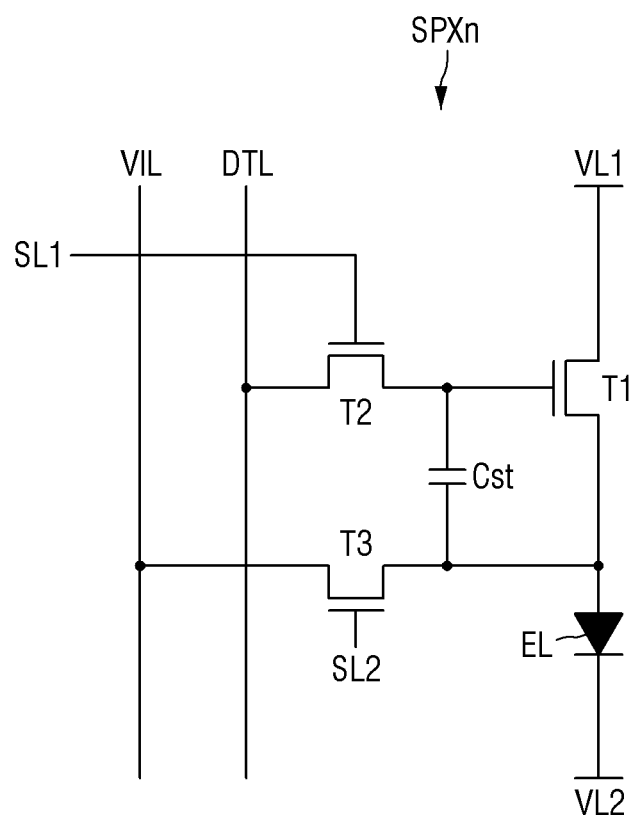
FIG. 3 is a schematic diagram of an equivalent circuit of a sub-pixel disposed in a display device according to an embodiment.

FIG. 3 is a schematic diagram of an equivalent circuit of a sub-pixel disposed in a display device according to an embodiment.

Referring to FIG. 3, each sub-pixel SPXn of the display device 10 according to an embodiment may include three transistors T1, T2 and T3 and a storage capacitor Cst in addition to a light emitting diode EL.

The light emitting diode EL may emit light by a current supplied through a first transistor T1. The light emitting diode EL may include a first electrode, a second electrode, and at least one light emitting element disposed between the first and second electrodes. The light emitting element may emit light of a specific wavelength band by electrical signals transmitted from the first electrode and the second electrode.

An end portion of the light emitting diode EL may be connected to the source electrode of the first transistor T1, and another end portion of the light emitting diode EL may be connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 may be turned on by a scan signal of a first scan line SL1 to connect the data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 may be turned on by a scan signal of the second scan line SL2 to connect the initialization voltage line VIL to an end portion of the light emitting diode EL. The gate electrode of the third transistor T3 may be connected to the second scan line SL2, the drain electrode of the third transistor T3 may be connected to the initialization voltage line VIL, and the source electrode of the third transistor T3 may be connected to an end portion of the light emitting diode EL or to the source electrode of the first transistor T1.

In an embodiment, the source electrode and the drain electrode of each of the transistors T1, T2, and T3 are not limited to those described above, and vice versa. Each of the transistors T1, T2, and T3 may be formed as a thin film transistor. In FIG. 3, each of the transistors T1, T2, and T3 has been described as being formed of an N-type metal oxide semiconductor field effect transistor (MOSFET), but embodiments are not limited thereto. For example, each of the transistors T1, T2, and T3 may be formed of a P-type MOSFET. In another example, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst may store a difference voltage between a gate voltage and a source voltage of the first transistor T1.

Figure 4:
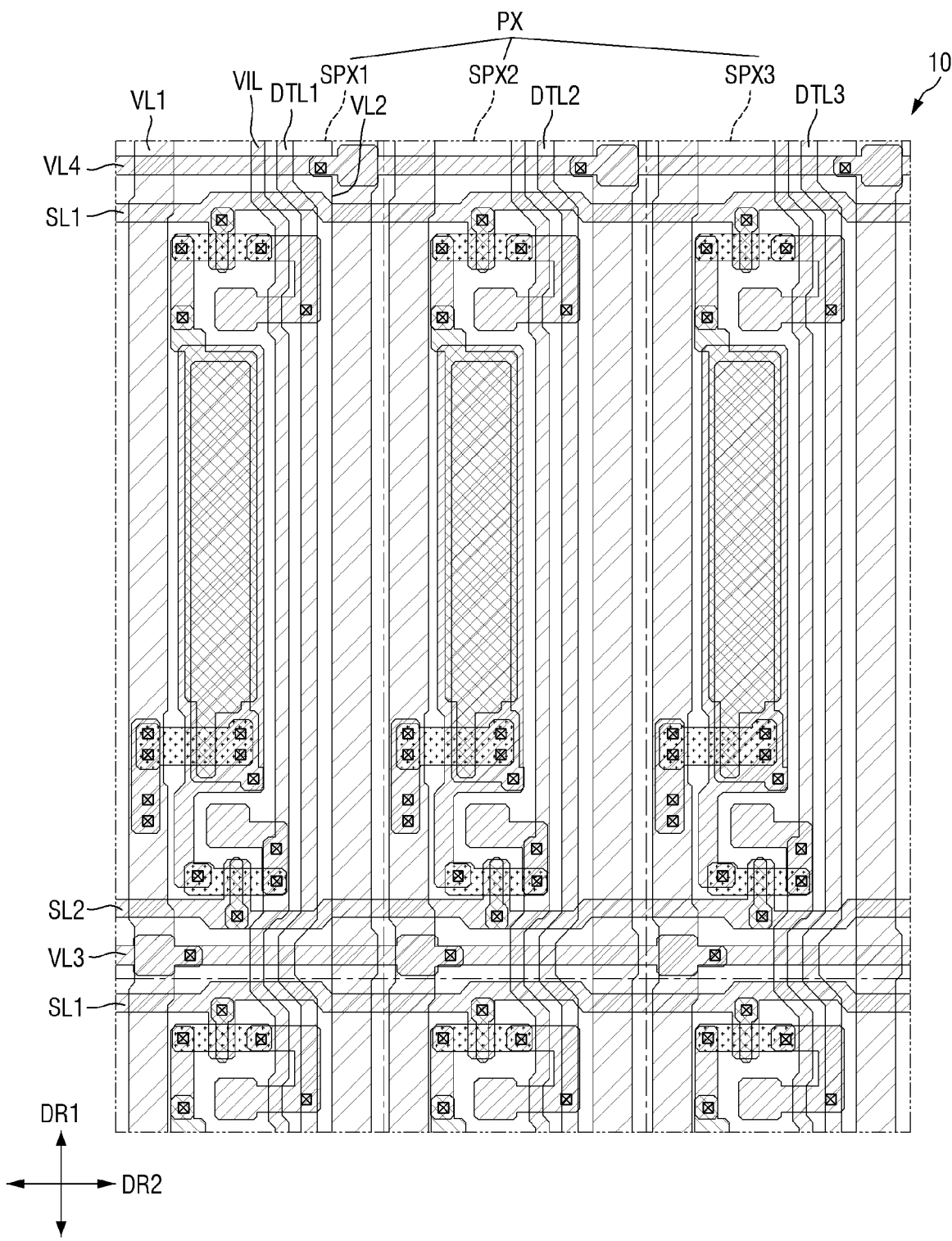
FIG. 4 is a schematic layout view illustrating wires disposed in a pixel of a display device according to an embodiment.
Figure 5:
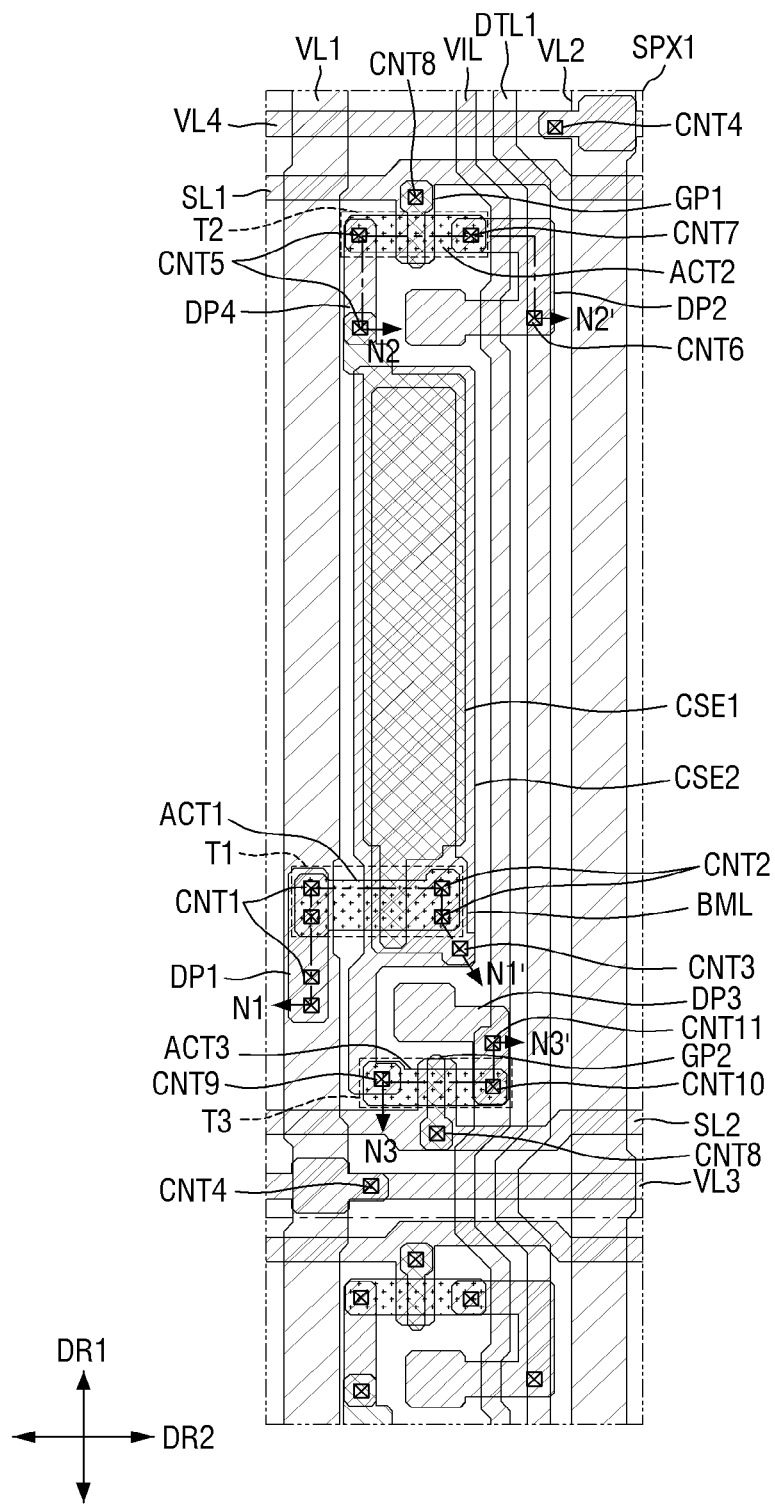
FIG. 5 is a layout diagram of wires disposed in a first sub-pixel of FIG. 4.

FIG. 4 is a schematic layout view illustrating wires disposed in a pixel of a display device according to an embodiment. FIG. 5 is a layout diagram of wires disposed in a first sub-pixel of FIG. 4.

FIGS. 4 and 5 illustrate planar arrangement of a first conductive layer, a semiconductor layer, a second conductive layer, and a third conductive layer of the display device 10. FIG. 4 illustrates conductive layers and a semiconductor layer disposed in a pixel PX, and FIG. 5 is a schematic enlarged view of conductive layers and a semiconductor layer disposed in a first sub-pixel SPX1 of FIG. 4. The planar arrangement of a second sub-pixel SPX2 and a third sub-pixel SPX3 may be substantially the same as that of the first sub-pixel SPX1.

Referring to FIGS. 4 and 5, each of the pixels PX of the display device 10 may include sub-pixels SPXn (where n is 1 to 3). For example, the pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be red, the second color may be green, and the third color may be blue. However, embodiments are not limited thereto, and the sub-pixels SPXn or some of the sub-pixels SPXn may emit light of the same color. For example, the sub-pixels SPXn may emit the same blue light, or two sub-pixels SPXn may emit the same blue light, and another sub-pixel SPXn may emit green light different from the blue light. Although it is illustrated in the drawing that the pixel PX includes three sub-pixels SPXn, embodiments are not limited thereto, and the pixel PX may include a larger number of sub-pixels SPXn.

The sub-pixels SPXn of each pixel PX may be arranged in the second direction DR2 in the pixel PX. The first sub-pixel SPX1 may be disposed on the left side with respect to the center area of the pixel PX, which is a side in the second direction DR2, the second sub-pixel SPX2 may be disposed at the center area of the pixel PX, and the third sub-pixel SPX2 may be disposed on the right side with respect to the center area of the pixel PX, which is another side in the second direction DR2. The structure of the conductive layers and the semiconductor layer disposed in the first sub-pixel SPX1, the second sub-pixel SPX2, and the third sub-pixel SPX3 may be substantially the same. As will be described below, the arrangement of electrodes (shown in FIG. 6), a light emitting element (shown in FIG. 7), and a connection electrode (shown in FIG. 7), or the like disposed on the conductive layers of each sub-pixel SPXn may also be the same. In the pixel PX, a circuit layer connected to the first to third sub-pixels SPX1, SPX2, and SPX3 may be disposed in a specific pattern layer, and the pattern layers may be repeatedly arranged in units of one sub-pixel SPXn.

However, embodiments are not limited thereto. In another example, the structure of conductive layers and a semiconductor layer disposed in the region occupied (or covered) by the sub-pixels SPXn may be different, but the arrangement of electrodes, a light emitting element, a connection electrode, or the like disposed on the conductive layers may be the same. For example, in the pixel PX, a circuit layer connected to the first to third sub-pixels SPX1, SPX2, and SPX3 may be disposed in a specific pattern layer, and the pattern layers may be repeatedly arranged in units of the pixel PX, not the sub-pixel SPXn.

The conductive layers and semiconductor layers disposed in the pixel PX of the display device 10 will be described in detail. The display device 10 may include a first substrate (shown in FIG. 8), and a first conductive layer, a semiconductor layer, a second conductive layer, and a third conductive layer disposed on the first substrate. The display device 10 may further include insulating layers disposed between the conductive layers and the semiconductor layer. The semiconductor layer, the conductive layers, and the insulating layers may each constitute a circuit layer and a display element layer of the display device 10. A cross-sectional structure of the display device 10 will be described below with further reference to other drawings. Hereinafter, the planar arrangement of the conductive layers and the semiconductor layer disposed in the pixel PX or the sub-pixel SPXn of the display device 10 will be described in detail.

The first conductive layer may include a first voltage line VL1 and a second voltage line VL2 extending in the first direction DR1, an initialization voltage line VIL, data lines DTL (e.g., DTL1, DTL2, and DTL3), and a lower metal layer BML.

The first voltage line VL1 and the second voltage line VL2 may extend in the first direction DR1, and each of the first and second voltage lines VL1 and VL2 may be disposed across the pixels PX and sub-pixels SPXn arranged in the first direction DR1. The first voltage line VL1 and the second voltage line VL2 may be spaced apart from each other in the second direction DR2 and disposed for each sub-pixel SPXn. The first voltage line VL1 may be disposed on the left side with respect to the center area of the sub-pixel SPXn, and the second voltage line VL2 may be disposed on the right side with respect to the center area of the sub-pixel SPXn. The first voltage line VL1 and the second voltage line VL2 of two sub-pixels SPXn adjacent in the second direction DR2 may be adjacent to each other. For example, the second voltage line VL2 of the first sub-pixel SPX1 may be closer to the first voltage line VL1 connected to the second sub-pixel SPX2 than to the first voltage line VL1 connected to the first sub-pixel SPX1.

The first voltage line VL1 may be connected (e.g., electrically connected) to the first electrode (shown in FIG. 7) of each sub-pixel SPXn through the first transistor T1, and the second voltage line VL2 may be connected (e.g., electrically connected) to a third electrode (shown in FIG. 7) through the fourth voltage line VL4 disposed on another conductive layer. However, embodiments are not limited thereto. In some embodiments, the first voltage line VL1 and the second voltage line VL2 may not be connected (e.g., electrically connected) to the electrodes (shown in FIG. 7), and may be connected (e.g., directly electrically connected) to the connection electrode (shown in FIG. 7) in contact with the light emitting element (shown in FIG. 7).

The first voltage line VL1 and the second voltage line VL2 may transmit the power voltage applied from the voltage line pads WPD_VL1 and WPD_VL2 to the electrodes (shown in FIG. 7) or the connection electrodes (shown in FIG. 7) disposed in each sub-pixel SPXn, respectively. The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2.

The data lines DTL1, DTL2, and DTL3 may extend in the first direction DR1. The first data line DTL1, the second data line DTL2, and the third data line DTL3 may be disposed in the pixel PX, and each of the data lines DTL1, DTL2, and DTL3 may be disposed over the pixels PX or sub-pixels SPXn arranged in the first direction DR1. Different data lines DTL may be disposed in different sub-pixels SPXn. For example, the first data line DTL1 may be disposed in the first sub-pixel SPX1, the second data line DTL2 may be disposed in the second sub-pixel SPX2, and the third data line DTL3 may be disposed in the third sub-pixel SPX3. Each of the data lines DTL may be disposed between the first voltage line VL1 and the second voltage line VL2 in each sub-pixel SPXn. In an embodiment, each of the data lines DTL may be adjacent to the left side, which is a side of the second voltage line VL2 in the second direction DR2. Each of the data lines DTL1, DTL2, and DTL3 may be connected (e.g., electrically connected) to the second transistor T2 through a conductive pattern layer disposed on a different conductive layer to apply a data signal to the second transistor T2.

The initialization voltage line VIL may extend in the first direction DR1 and may be disposed across the pixels PX arranged in the first direction DR1. Initialization voltage lines VIL may be disposed in the pixel PX, and may be disposed in different sub-pixels SPXn. In an embodiment in which the pixel PX includes three sub-pixels SPXn, three initialization voltage lines VIL may be disposed in the pixel PX. However, embodiments are not limited thereto. In an embodiment, only one initialization voltage line VIL may be disposed in the pixel PX regardless of the number of sub-pixels SPXn included in the pixel PX. For example, the display device 10 may further include an initialization voltage distribution line disposed across the sub-pixels SPXn for each pixel PX and connected (e.g., electrically connected) to the initialization voltage line VIL.

The initialization voltage line VIL may be disposed between the first voltage line VL1 and the data line DTL in each sub-pixel SPXn. In an embodiment, the initialization voltage line VIL may be adjacent to the left side of the data line DTL and may be disposed closer to the data line DTL than to the first voltage line VL1. The initialization voltage line VIL may be connected (e.g., electrically connected) to the third transistor T3 and may apply an initialization voltage to the third transistor T3.

The lower metal layers BML may be disposed between the first voltage line VL1 and the initialization voltage line VIL. Lower metal layers BML may be disposed in the pixel PX, and may be disposed in different sub-pixels SPXn. In an embodiment in which the pixel PX includes three sub-pixels SPXn, three lower metal layers BML may be disposed in the pixel PX.

The lower metal layer BML may overlap a first active layer ACT1 of the semiconductor layer, and a first electrode pattern layer CSE1 of the second conductive layer. The lower metal layer BML may prevent light from being incident on the first active layer ACT1 of the first transistor T1 or may be connected (e.g., electrically connected) to the first active layer ACT1 to stabilize the characteristics of the first transistor T1. For example, the lower metal layer BML may be formed of an opaque metal material that blocks transmission of light. However, embodiments are not limited thereto, and in some cases, the lower metal layer BML may be omitted.

The semiconductor layer may be disposed on the first conductive layer. The semiconductor layer may include active layers ACT1, ACT2, and ACT3 of the transistors T1, T2, and T3. The active layers ACT1, ACT2, and ACT3 may include the first active layer ACT1 of the first transistor T1, the second active layer ACT2 of the second transistor T2, and the third active layer ACT3 of the third transistor T3 that are connected to each sub-pixel SPXn.

The first active layer ACT1 of the first transistor T1 may be shifted downward from the center area of each sub-pixel SPXn. The first active layer ACT1 may overlap the first voltage line VL1 of the first conductive layer, the lower metal layer BML, the first electrode pattern layer CSE1 of the second conductive layer, a second electrode pattern layer CSE2 of the second conductive layer, and a first conductive pattern layer DP1. For example, the first active layer ACT1 may include a first region overlapping the first conductive pattern layer DP1, a second region overlapping the second electrode pattern layer CSE2, and a third region, which is a region other than the first region and the second region, overlapping the first electrode pattern layer CSE1. The first region of the first active layer ACT1 may be in contact with the first conductive pattern layer DP1, and the second region of the first active layer ACT1 may be in contact with the second electrode pattern layer CSE2. The first region of the first active layer ACT1 may be a drain region, the second region of the first active layer ACT1 may be a source region, and the third region of the first active layer ACT1 may be a gate region.

The second active layer ACT2 of the second transistor T2 may be disposed on the upper side with respect to the center area of each sub-pixel SPXn. The second active layer ACT2 may overlap the first electrode pattern layer CSE1 of the second conductive layer, a first gate pattern layer GP1, a second conductive pattern layer DP2 of the second conductive layer, and the first scan line SL1. For example, the second active layer ACT2 may include a first region overlapping the second conductive pattern layer DP2, a second region overlapping the first electrode pattern layer CSE1, and a third region, which is a region other than the first region and the second region, overlapping the first gate pattern layer GP1 and the first scan line SL1. The first region of the second active layer ACT2 may be in contact with the second conductive pattern layer DP2, and the second region of the second active layer ACT2 may be in contact with the first electrode pattern layer CSE1. The first region of the second active layer ACT2 may be a drain region, the second region of the second active layer ACT2 may be a source region, and the third region of the second active layer ACT2 may be a gate region.

The third active layer ACT3 of the third transistor T3 may be disposed on the lower side with respect to the center area of each sub-pixel SPXn. The third active layer ACT3 may be spaced apart from the first active layer ACT1 in the first direction DR1. The third active layer ACT3 may overlap a second gate pattern layer GP2 of the second conductive layer, the second electrode pattern layer CSE2 of the third conductive layer, a third conductive pattern layer DP3, and the second scan line SL2. For example, the third active layer ACT3 may include a first region overlapping the third conductive pattern layer DP3, a second region overlapping the second electrode pattern layer CSE2, and a third region, which is a region other than the first region and the second region, overlapping the second gate pattern layer GP2 and the second scan line SL2. The first region of the third active layer ACT3 may be in contact with the third conductive pattern layer DP3, and the second region of the third active layer ACT3 may be in contact with the second electrode pattern layer CSE2. The first region of the third active layer ACT3 may be a drain region, the second region of the third active layer ACT3 may be a source region, and the third region of the third active layer ACT3 may be a gate region.

In an embodiment, the semiconductor layer may include polycrystalline silicon, monocrystalline silicon, oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

The second conductive layer may be disposed on the semiconductor layer. The second conductive layer may include gate pattern layers GP1 and GP2, and the first electrode pattern layer CSE1.

The first gate pattern layer GP1 may be disposed on the upper side of the sub-pixel SPXn. The first gate pattern layer GP1 may overlap the first scan line SL1 of the third conductive layer, and the second active layer ACT2. The first gate pattern layer GP1 may be in contact with the first scan line SL1 to receive a first scan signal, and may transmit the first scan signal to the second transistor T2.

The second gate pattern layer GP2 may be disposed on the lower side of the sub-pixel SPXn. The second gate pattern layer GP2 may overlap the second scan line SL2 of the third conductive layer, and the third active layer ACT3. The second gate pattern layer GP2 may be in contact with the second scan line SL2 to receive a second scan signal, and may transmit the second scan signal to the third transistor T3.

The first electrode pattern layer CSE1 may be disposed between the first scan line SL1 and the second scan line SL2 of the third conductive layer, between the third voltage line VL3 and the fourth voltage line VL4, or between the second active layer ACT2 and the third active layer ACT3 of the semiconductor layer. The first electrode pattern layer CSE1 may overlap the lower metal layer BML of the first conductive layer, the first active layer ACT1 of the semiconductor layer, and the second electrode pattern layer CSE2 of the second conductive layer.

For example, a portion of the first electrode pattern layer CSE1 may overlap the third region of the first active layer ACT1, and may function as the gate electrode of the first transistor T1. The first electrode pattern layer CSE1 may be connected to a fourth conductive pattern layer DP4 of the third conductive layer, and may transmit the data signal applied through the second transistor T2 to the first transistor T1. The first electrode pattern layer CSE1 may overlap the second electrode pattern layer CSE2 to form the storage capacitor Cst. The first electrode pattern layer CSE1 may be a first capacitance electrode of the storage capacitor Cst, and the second electrode pattern layer CSE2 may be a second capacitance electrode.

The third conductive layer may be disposed on the second conductive layer. The third conductive layer may include the first scan line SL1, the second scan line SL2, the third voltage line VL3, the fourth voltage line VL4, the conductive pattern layers DP1, DP2, DP3, and DP4, and the second electrode pattern layer CSE2.

The first scan line SL1 and the second scan line SL2 may extend in the second direction DR2. A single first scan line SL1 and a single second scan line SL2 may be disposed in a single pixel PX, and each of the scan lines SL1 and SL2 may be disposed over the pixels PX and sub-pixels SPXn arranged in the second direction DR2. The first scan line SL1 and the second scan line SL2 may be spaced apart from each other in the first direction DR1 and may be disposed on sides (e.g., opposite sides) of each pixel PX in the first direction DR1. For example, the first scan line SL1 may be disposed on the upper side of the pixel PX or the sub-pixel SPXn, and the second scan line SL2 may be disposed on the lower side of the pixel PX or the sub-pixel SPXn.

The first scan line SL1 and the second scan line SL2 may be connected (e.g., electrically connected) to the second transistor T2 and the third transistor T3 through the gate pattern layers GP1 and GP2 disposed on different conductive layers, respectively. For example, the first scan line SL1 may be in contact with the first gate pattern layer GP1 through an eighth contact hole CNT8, and may be connected (e.g., electrically connected) to the second transistor T2. The second scan line SL2 may be in contact with the second gate pattern layer GP2 through the eighth contact hole CNT8, and may be connected (e.g., electrically connected) to the third transistor T3. The first scan line SL1 and the second scan line SL2 may transmit a first scan signal or a second scan signal to the second transistor T2 and the third transistor T3, respectively.

The third voltage line VL3 and the fourth voltage line VL4 may extend in the second direction DR2 and may be disposed over the pixels PX and sub-pixels SPXn arranged in the second direction DR2. The third voltage line VL3 may be disposed on the lower side of each pixel PX in a plan view, and the fourth voltage line VL4 may be disposed on the upper side of each pixel PX in a plan view. The third voltage line VL3 may be connected (e.g., electrically connected) to the first voltage line VL1, and the fourth voltage line VL4 may be connected (e.g., electrically connected) to the second voltage line VL2. The third voltage line VL3 may be in contact with the first voltage line VL1 through a fourth contact hole CNT4 formed in a region where the third voltage line VL3 intersects the first voltage line VL1. The fourth voltage line VL4 may be in contact with the second voltage line VL2 through the fourth contact hole CNT4 formed in a region where the fourth voltage line VL4 intersects the second voltage line VL2. The third voltage line VL3 and the fourth voltage line VL4 may be alternately and repeatedly arranged with being spaced apart from each other in the first direction DR1.

The voltage lines VL1, VL2, VL3, and VL4 may extend in the first direction DR1 and the second direction DR2 to form a mesh structure in the display area DPA. The first voltage line VL1 and the second voltage line VL2 may be formed of the first conductive layer and extend in the first direction DR1 to be disposed for each pixel PX. The third voltage line VL3 and the fourth voltage line VL4 may be formed of the third conductive layer and extend in the second direction DR2 to be disposed in the pixels PX of different rows.

The pixels PX adjacent in the first direction DR1 may share the third voltage line VL3 or the fourth voltage line VL4. For example, as shown in FIGS. 4 and 5, in an embodiment in which the third voltage line VL3 disposed in the pixels PX of a first pixel row are disposed on the lower side and the fourth voltage line VL4 disposed in the pixels PX of a first pixel row are disposed on the upper side, respectively, the pixels PX of the first pixel row disposed on the upper side, which is a side in the first direction DR1, may share the fourth voltage line VL4, and the pixels PX of the first pixel row disposed on the lower side, which is another side in the first direction DR1, may share the third voltage line VL3. The first pixel row may include pixels in which the third voltage line VL3 is disposed on the lower side, and another pixel row adjacent to the first pixel row in the first direction DR1 may include pixels in which the third voltage line VL3 is disposed on the upper side. In the display device 10, the number of voltage lines disposed in the display area DPA may be reduced, and a voltage drop of a voltage applied through the voltage line in a large display device may be prevented.

The first conductive pattern layer DP1 may overlap the first voltage line VL1 and the first active layer ACT1. The first conductive pattern layer DP1 may be in contact with the first active layer ACT1 and the first voltage line VL1. The first conductive pattern layer DP1 may be connected (e.g., electrically connected) to the first voltage line VL1 and may partially function as the drain electrode of the first transistor T1.

The second conductive pattern layer DP2 may overlap the data line DTL and the second active layer ACT2. The second conductive pattern layer DP2 may be in contact with the second active layer ACT2 and the data line DTL. The second conductive pattern layer DP2 may be connected (e.g., electrically connected) to the data line DTL and may partially function as the drain electrode of the second transistor T2.

The third conductive pattern layer DP3 may overlap the initialization voltage line VIL and the third active layer ACT3. The third conductive pattern layer DP3 may be in contact with the third active layer ACT3 and the initialization voltage line VIL. The third conductive pattern layer DP3 may be connected (e.g., electrically connected) to the initialization voltage line VIL and may partially function as the drain electrode of the third transistor T3.

The fourth conductive pattern layer DP4 may overlap the second active layer ACT2 and the first electrode pattern layer CSE1. The fourth conductive pattern layer DP4 may be in contact with the second active layer ACT2 and the first electrode pattern layer CSE1. The fourth conductive pattern layer DP4 may be connected (e.g., electrically connected) to the first electrode pattern layer CSE1 and may partially function as the source electrode of the second transistor T2.

The second electrode pattern layer CSE2 may be disposed between the third voltage line VL3 and the fourth voltage line VL4. The second electrode pattern layer CSE2 may overlap the first electrode pattern layer CSE1 and the lower metal layers BML. The second electrode pattern layer CSE2 may overlap the first electrode pattern layer CSE1 with a first interlayer insulating layer (shown in FIG. 8) interposed between the first and second electrode pattern layers CSE1 and CSE2, and the storage capacitor Cst may be formed therebetween.

The second electrode pattern layer CSE2 may overlap (e.g., partially overlap) the first active layer ACT1 and the third active layer ACT3. The second electrode pattern layer CSE2 may be connected to the first active layer ACT1, and may partially function as a first source electrode S1 of the first transistor T1. The second electrode pattern layer CSE2 may be connected to the third active layer ACT3, and may partially function as a third source electrode S3 of the third transistor T3.

The second electrode pattern layer CSE2 may be connected (e.g., electrically connected) to the first electrode (shown in FIG. 7) disposed on a via layer VIA. The fourth voltage line VL4 may be connected (e.g., electrically connected) to the third electrode (shown in FIG. 7). The pattern layers and wires of the third conductive layer may transmit an electrical signal applied from the wires of the first conductive layer to the electrodes on the via layer VIA either directly or through the transistors T1, T2, and T3. The electrical signal transmitted to the electrodes may be transmitted to the light emitting element connected (e.g., electrically connected) to the electrode, and the light emitting element may emit light.

Figure 6:
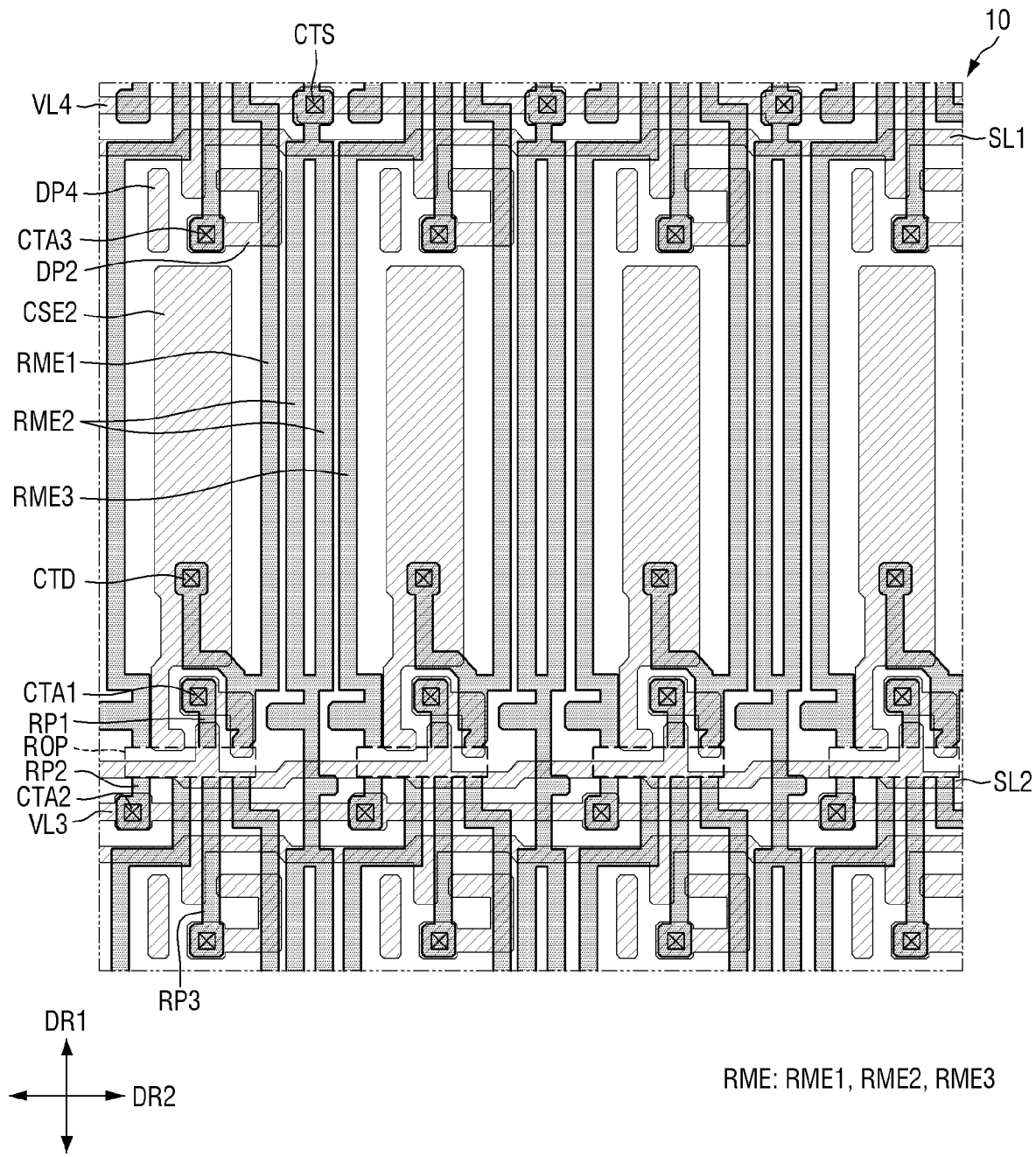
FIG. 6 is a schematic plan view illustrating arrangement of a third conductive layer and electrodes disposed in a pixel of a display device according to an embodiment.
Figure 7:
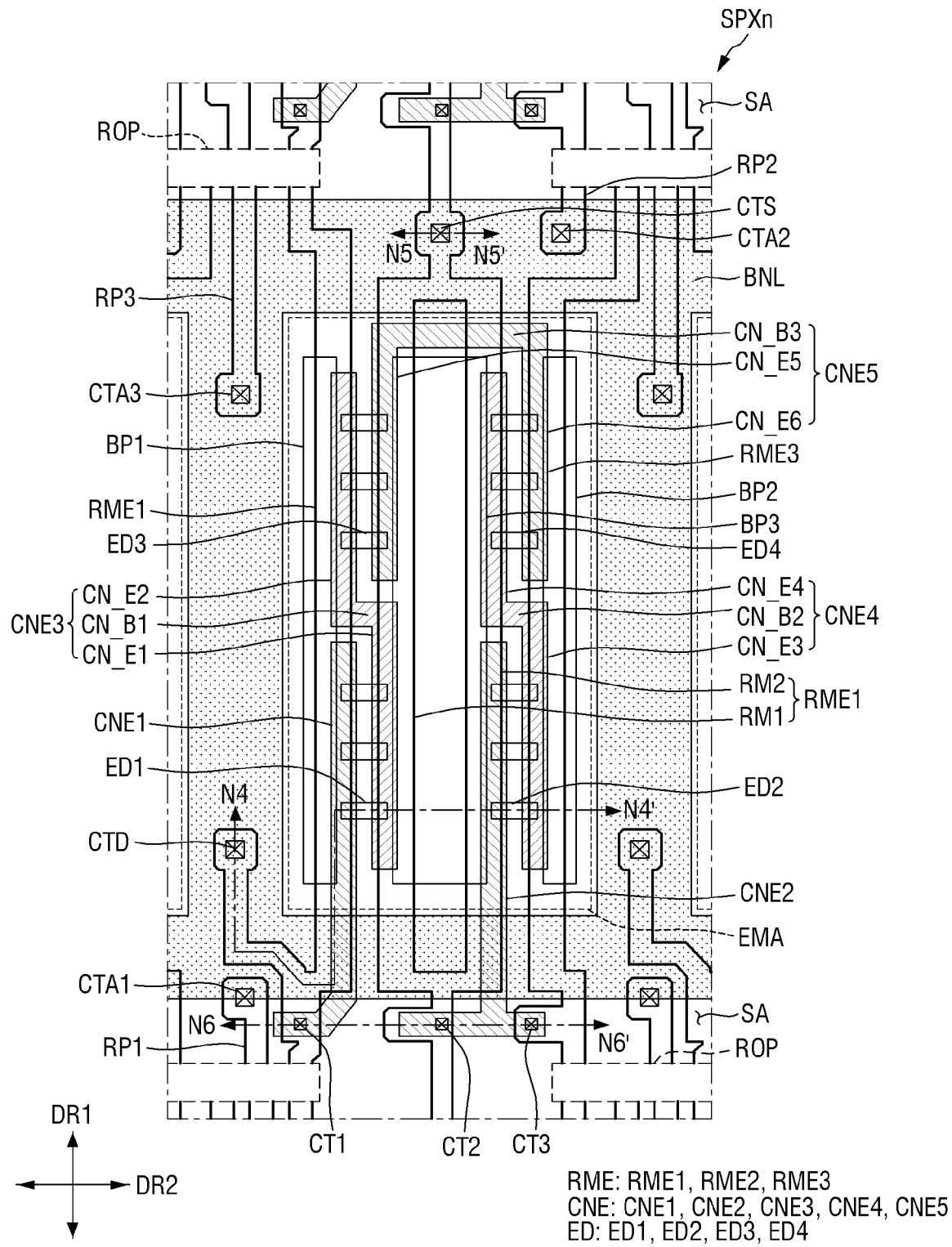
FIG. 7 is a schematic plan view illustrating arrangement of electrodes and a light emitting element disposed in a sub-pixel of a display device according to an embodiment.

FIG. 6 is a schematic plan view illustrating arrangement of a third conductive layer and electrodes disposed in a pixel of a display device according to an embodiment. FIG. 7 is a schematic plan view illustrating arrangement of electrodes and a light emitting element disposed in a sub-pixel of a display device according to an embodiment.

FIG. 6 illustrates relative planar arrangement of wires and conductive pattern layers of the third conductive layer and electrodes RME disposed thereon. FIG. 7 illustrates planar arrangement of electrodes RME (e.g., RME1, RME2, and RME3), light emitting elements ED (e.g., ED1, ED2, ED3, and ED4), and connection electrodes CNE (e.g., CNE1, CNE2, and CNE3, CNE4, and CNE5) disposed in a sub-pixel SPXn. The pixel PX of FIG. 6 may include sub-pixels SPXn having the structure shown in FIG. 7, and the structure of each sub-pixel SPXn may be substantially the same as the structure shown in FIG. 7.

Referring to FIGS. 6 and 7 in addition to FIGS. 4 and 5, the sub-pixels SPXn of the display device 10 may include an emission area EMA and a non-emission area. The emission area EMA may be an area in which the light emitting element ED may generate light of a specific wavelength band. The non-emission area may be a region in which the light emitting element ED is not disposed and a region from which light is not emitted because light emitted from the light emitting element ED does not reach it. The non-emission area of the pixel PX may be an area other than the emission area EMA of each sub-pixel SPXn.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

The pixel PX may further include a sub-region SA disposed in the non-emission area. The sub-region SA may be spaced apart from the emission area EMA in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, the emission area EMA may be repeatedly arranged in the second direction DR2, and the sub-region SA may extend in the second direction DR2. However, embodiments are not limited thereto, and the arrangement of the emission areas EMA and the sub-regions SA in the pixels PX may be different from that shown in FIG. 7.

The emission area EMA may be disposed for each sub-pixel SPXn, and the sub-region SA may be disposed across the sub-pixels SPXn. As will be described below, the emission area EMA and the sub-region SA may be distinguished by a bank layer BNL. The bank layer BNL may surround the emission area EMA for each sub-pixel SPXn, and the sub-region SA may be disposed so as not to be distinguished between different sub-pixels SPXn.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be separated at a separation portion ROP of the sub-region SA.

The display device 10 may include the electrodes RME (e.g., RME1, RME2, and RME3), barrier walls BP1, BP2, and BP3, the bank layer BNL, the light emitting elements ED, and the connection electrodes CNE (e.g., CNE1, CNE2, CNE3, CNE4, and CNE5).

The barrier walls BP1, BP2, and BP3 may be disposed in the emission area EMA of each sub-pixel SPXn. The barrier walls BP1, BP2, and BP3 may substantially extend in the first direction DR1, and may be spaced apart from each other in the second direction DR2.

For example, the barrier walls BP1, BP2, and BP3 may include a first barrier wall BP1, a second barrier wall BP2, and a third barrier wall BP3 spaced apart from each other in the second direction DR2 in the emission area EMA of each sub-pixel SPXn. The first barrier wall BP1 may be disposed on the left side with respect to the center area of the emission area EMA, which is a side in the second direction DR2, and the second barrier walls BP2 may be disposed on the right side with respect to the center area of the emission area EMA, which is another side in the second direction DR2, with being spaced apart from the first barrier wall BP1. The third barrier wall BP3 may be disposed between the first barrier wall BP1 and the second barrier wall BP2. The first barrier wall BP1, the third barrier wall BP3, and the second barrier wall BP2 may be alternately disposed along the second direction DR2 and may be disposed in an island-shaped pattern layer in the display area DPA. The light emitting elements ED may be disposed between the first barrier wall BP1 and the third barrier wall BP3 and between the third barrier wall BP3 and the second barrier wall BP2.

The lengths of the first barrier wall BP1, the second barrier wall BP2, and the third barrier wall BP3 in the first direction DR1 may be the same, and may be smaller than the length of the emission area EMA surrounded by the bank layer BNL in the first direction DR1. The barrier walls BP1, BP2, and BP3 may be spaced apart from a portion of the bank layer BNL extending in the second direction DR2. However, embodiments are not limited thereto, and the barrier walls BP1, BP2, and BP3 may be integral with the bank layer BNL, or may overlap (e.g., partially overlap) the portion of the bank layer BNL extending in the second direction DR2. For example, the lengths of the barrier walls BP1, BP2, and BP3 in the first direction DR1 may be greater than or equal to the length of the emission area EMA surrounded by the bank layer BNL in the first direction DR1.

The widths of some of the barrier walls BP1, BP2, and BP3 in the second direction DR2 may not be the same. For example, the widths of the first barrier wall BP1 and the second barrier wall BP2 in the second direction DR2 may be smaller than the width of the third barrier wall BP3 in the second direction DR2. The electrodes RME may be disposed on the barrier walls BP1, BP2, and BP3. An electrode RME may be disposed on each of the first barrier wall BP1 and the second barrier wall BP2, and two electrode lines RM1 and RM2 branched from an electrode (e.g., the second electrode RME2) may be disposed on the third barrier wall BP3. The third barrier wall BP3 may have a sufficient width so that the two branched electrode lines may be spaced apart from each other However, embodiments are not limited thereto, and the barrier walls BP1, BP2, and BP3 may have the same width.

Although it is illustrated in the drawing that three barrier walls BP1, BP2, and BP3 are arranged for each sub-pixel SPXn, embodiments are not limited thereto. The number and the shape of the barrier walls BP1, BP2, and BP3 may vary according to the number or the arrangement structure of the electrodes RME.

The electrodes RME (e.g., RME1, RME2, and BME3) may have a shape extending in a direction and may be disposed for each sub-pixel SPXn. The electrodes RME1, RME2, and RME3 may extend in the first direction DR1 to be disposed across the emission area EMA of the sub-pixel SPXn and the sub-region SA, and may be spaced apart from each other in the second direction DR2. The electrodes RME may be connected (e.g., electrically connected) to the light emitting elements ED. However, embodiments are not limited thereto, and the electrodes RME may not be connected (e.g., electrically connected) to the light emitting element ED.

The display device 10 may include the first electrode RME1, the second electrode RME2, and the third electrode RME3 disposed in each sub-pixel SPXn. The first electrode RME1 may be disposed on the left side with respect to the center area of the emission area EMA, the third electrode RME3 may be disposed on the right side with respect to the center area of the emission area EMA with being spaced apart from the first electrode RME1 in the second direction DR2, and the second electrode RME2 may be disposed between the first electrode RME1 and the third electrode RME3. A first electrode RME1 may be disposed on the first barrier wall BP1, and a second electrode RME2 may be disposed on the second barrier wall BP2. The first electrode RME1, the second electrode RME2, and the third electrode RME3 may be partially arranged in the corresponding sub-pixel SPXn and the sub-region SA over the bank layer BNL. The first electrode RME1 and the third electrode RME3 of different sub-pixels SPXn may be spaced or separated from each other at the separation portion ROP disposed in the sub-region SA. For example, the second electrode RME2 may extend in the first direction DR1 without being separated at the sub-region SA. A second electrode RME2 may be disposed across the sub-pixels SPXn or the pixels PXs arranged in the first direction DR1.

In accordance with an embodiment, the first electrode RME1 may extend in the first direction DR1 and may be disposed across the separation portion ROP disposed in the sub-region SA and the separation portion ROP of another sub-region SA. An end portion of the first electrode RME1 in the first direction DR1 may be disposed in the sub-region SA disposed on the upper side of the emission area EMA, and another end portion of the first electrode RME1 in the first direction DR1 may be disposed in the sub-region SA disposed on the lower side of the emission area EMA, e.g., in a plan view. The first electrode RME1 may be spaced apart from the first electrode RME1 of another sub-pixel SPXn adjacent in the first direction DR1 at the separation portion ROP.

The third electrode RME3 may also extend in the first direction DR1 from the separation portion ROP disposed in the sub-region SA to the separation portion ROP of another sub-region SA. An end portion of the third electrode RME3 in the first direction DR1 may be disposed in the sub-region SA disposed on the upper side of the emission area EMA, and another end portion of the third electrode RME3 in the first direction DR1 may be disposed in the sub-region SA disposed on the lower side of the emission area EMA. The third electrode RME3 may be spaced apart from the third electrode RME3 of another sub-pixel SPXn adjacent in the first direction DR1 at the separation portion ROP.

The separation portion ROP of the sub-region SA may not be arranged side by side with the emission area EMA in the first direction DR1, and may be arranged side by side with a portion of the bank layer BNL extending in the first direction DR1. Accordingly, the first electrode RME1 and the third electrode RME3 may include portions that are bent in the second direction DR2 from portions disposed in the emission area EMA and then extend in the first direction DR1. The first electrode RME1 and the third electrode RME3 may be spaced apart from another first electrode RME1 and another third electrode RME3 in the first direction DR1, respectively, with respect to the separation portion ROP. The second electrode RME2 may be disposed so as not to overlap the separation portion ROP in the first direction DR1, and may extend in the first direction DR1 at a portion where the separation portion ROP is not disposed or between different separation portions ROP.

In accordance with an embodiment, the first electrode RME1 may include a main portion disposed in the emission area EMA and a bent portion that is connected to the main portion and bent in the second direction DR2 and then bent in the first direction DR1. The main portion of the first electrode RME1 may cross the emission area EMA in the first direction DR1, and the bent portion of the first electrode RME1 may overlap a portion of the bank layer BNL disposed between the emission areas EMA. The main portion of the first electrode RME1 may be a portion in which the light emitting elements ED are disposed, and the bent portion of the first electrode RME1 may be a portion connected (e.g., electrically connected) to the first transistor T1. As will be described below, the bent portion of the first electrode RME1 may be in contact with (e.g., in direct contact with) the source electrode of the first transistor T1 or the second electrode pattern layer CSE2 of the third conductive layer through a first electrode contact hole CTD.

The second electrode RME2 may extend in the first direction DR1 and may be branched into the electrode lines RM1 and RM2 in the emission area EMA. The portion of the second electrode RME2 overlapping the bank layer BNL and the portion of the second electrode RME2 disposed in the sub-region SA may extend in a line, but may be branched into a first electrode line RM1 and a second electrode line RM2 in the emission area EMA. The first electrode line RM1 may face and be spaced apart from the first electrode RME1, and the second electrode line RM2 may face and be spaced apart from the third electrode RME3. The first electrode line RM1 may be disposed on a side of the third barrier wall BP3 facing the first barrier wall BP1, and the second electrode line RM2 may be disposed on another side of the third barrier wall BP3 facing the second barrier wall BP2. The second electrode RME2 may be in contact with the fourth voltage line VL4 of the third conductive layer through a second electrode contact hole CTS formed at a portion overlapping the bank layer BNL. The second electrode RME2 may be connected (e.g., electrically connected) to the second voltage line VL2 through the fourth voltage line VL4.

Although it is illustrated in the drawing that three electrodes RME have a shape extending in the first direction DR1 for each sub-pixel SPXn, embodiments are not limited thereto. For example, the display device 10 may have a shape in which a larger number of electrodes RME are disposed in a sub-pixel SPXn or the electrodes RME have different widths according to positions.

The bank layer BNL may surround the sub-pixels SPXn and the emission area EMA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the sub-pixels SPXn, the emission areas EMA, and the sub-regions SA may vary according to the width of the bank layer BNL.

The bank layer BNL may include portions extending in the first direction DR1 and the second direction DR2 in a plan view to be arranged over the entire surface of the display area DPA. In the bank layer BNL, the portion extending in the second direction DR2 may cross the display area DPA, but the portion extending in the first direction DR1 may not completely cross the display area DPA. For example, the portion of the bank layer BNL extending in the first direction DR1 may be disposed only between the emission areas EMA of the sub-pixels SPXn, and may not be disposed in the sub-region SA. Accordingly, the emission areas EMA of the sub-pixels SPXn may be distinguished by the bank layer BNL, but the sub-region SA may not be distinguished.

The light emitting elements ED may be arranged in the emission area EMA. The light emitting elements ED may be disposed between the barrier walls BP1, BP2, and BP3, and may be arranged to be spaced apart from each other in the first direction DR1. In an embodiment, the light emitting elements ED may have a shape extending in a direction, and end portions (e.g., opposite end portions) of the light emitting elements ED may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, embodiments are not limited thereto, and the light emitting element ED may extend in the second direction DR2 or in a direction oblique to the second direction DR2.

The light emitting elements ED may be arranged between the barrier walls BP1, BP2, and BP3 or on different electrodes RME. Some of the light emitting elements ED may be arranged between the first barrier wall BP1 and the third barrier wall BP3, and some other light emitting elements ED may be arranged between the third barrier wall BP3 and the second barrier wall BP2. In accordance with an embodiment, the light emitting element ED may include a first light emitting element ED1 and a third light emitting element ED3 arranged between the first barrier wall BP1 and the third barrier wall BP3, and a second light emitting element ED2 and a fourth light emitting element ED4 arranged between the third barrier wall BP3 and the second barrier wall BP2. The first light emitting element ED1 and the third light emitting element ED3 may be disposed on the first electrode RME1 and the first electrode line RM1 of the second electrode RME2, respectively, and the second light emitting element ED2 and the fourth light emitting element ED4 may be disposed on the second electrode line RM2 of the second electrode RME2 and the third electrode RME3, respectively. The first light emitting element ED1 and the second light emitting element ED2 may be arranged adjacent to the lower side of the emission area EMA of the corresponding sub-pixel SPXn, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described below. End portions (e.g., opposite end portions) of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The connection electrodes CNE (e.g., CNE1, CNE2, CNE3, CNE4, and CNE5) may be disposed on the electrodes RME and the barrier walls BP1, BP2, and BP3. The connection electrodes CNE may have a shape extending in a direction, and may be spaced apart from each other. Each of the connection electrodes CNE may be in contact with the light emitting element ED, and may be connected (e.g., electrically connected) to the electrode RME or the conductive layer disposed thereunder.

The connection electrodes CNE may include a first connection electrode CNE1, a second connection electrode CNE2, a third connection electrode CNE3, a fourth connection electrode CNE4, and a fifth connection electrode CNE5 disposed in each sub-pixel SPXn. The first connection electrode CNE1 may be disposed on the first electrode RME1, and the second connection electrode CNE2 may be disposed on the second electrode line RM2 of the second electrode RME2. The third connection electrode CNE3, the fourth connection electrode CNE4, and the fifth connection electrode CNE5 may be disposed across the electrodes RME.

The first connection electrode CNE1 may have a shape extending in the first direction DR1 and may be disposed on the first electrode RME1 or the first barrier wall BP1. The second connection electrode CNE2 may have a shape extending in the first direction DR1 and may be disposed on the second electrode line RM2 of the second electrode RME2 or the second barrier wall BP2.

The lengths of the first connection electrode CNE1 and the second connection electrode CNE2 extending in the first direction DR1 may be short. The first connection electrode CNE1 and the second connection electrode CNE2 may be arranged on the lower side with respect to the center area of the emission area EMA. The first connection electrode CNE1 and the second connection electrode CNE2 may be disposed across the sub-region SA over the emission area EMA and the bank layer BNL disposed thereunder, and may be in contact with (e.g., in direct contact with) the electrode RME through contact portions CT1, CT2, and CT3 formed in the sub-region SA. The first connection electrode CNE1 may be in contact with (e.g., in direct contact with) the first electrode RME1 through a first contact portion CT1 formed at a portion overlapping the first electrode RME1 in the sub-region SA. The second connection electrode CNE2 may further include a portion extending from the sub-region SA in the second direction DR2, and may be in contact with the second electrode RME2 and the third electrode RME3 through a second contact portion CT2 and a third contact portion CT3 formed at portions overlapping the second electrode RME2 and the third electrode RME3, respectively. The first connection electrode CNE1 and the second connection electrode CNE2 may be first type connection electrodes in contact with (e.g., in direct contact with) the electrode RME.

The third connection electrode CNE3 may include a first extension portion CN_E1 disposed on the first electrode line RM1 of the second electrode RME2, a second extension portion CN_E2 disposed on the first electrode RME1, and a first connection portion CN_B1 connecting the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the second electrode RME2 at the central portion of the emission area EMA. The third connection electrode CNE3 may have a shape substantially extending in the first direction DR1, and may have a shape that is bent in the second direction DR2 and then extends in the first direction DR1.

The fourth connection electrode CNE4 may include a third extension portion CN_E3 disposed on the third electrode RME3, a fourth extension portion CN_E4 disposed on the second electrode line RM2 of the second electrode RME2, and a second connection portion CN_B2 connecting the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the third electrode RME3 with being adjacent to the center area of the emission area EMA. The fourth connection electrode CNE4 may have a shape substantially extending in the first direction DR1, and may have a shape that is bent in the second direction DR2 and then extends in the first direction DR1.

The fifth connection electrode CNE5 may include a fifth extension portion CN_E5 disposed on the first electrode line RM1 of the second electrode RME2, a sixth extension portion CN_E6 disposed on the third electrode RME3, and a third connection portion CN_B3 connecting the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the second electrode RME2 and the third electrode RME3. The fifth connection electrode CNE5 may surround the fourth extension portion CN_E4 of the fourth connection electrode CNE4 in a plan view.

The third connection electrode CNE3, the fourth connection electrode CNE4, and the fifth connection electrode CNE5 may be second type connection electrodes that are not in contact with the electrodes RME1, RME2, and RME3, respectively. Each of the third connection electrode CNE3, the fourth connection electrode CNE4, and the fifth connection electrode CNE5 may be disposed only in the emission area EMA, and may not extend to the sub-region SA.

The third connection electrode CNE3 and the fourth connection electrode CNE4 may be connection electrodes in which electrode extension portions extending in the first direction DR1 are not parallel to each other in the second direction DR2. The fifth connection electrode CNE5 may be the connection electrode in which electrode extension portions extending in the first direction DR1 are parallel to each other in the second direction DR2. The third connection electrode CNE3 and the fourth connection electrode CNE4 may have a shape that is bent with extending in the first direction DR1, and the fifth connection electrode CNE5 may have a shape surrounding a portion of another connection electrode.

The first connection electrode CNE1 may be in contact with the first end portion of the first light emitting element ED1, and the second connection electrode CNE2 may be in contact with the second end portion of the second light emitting element ED2. The third connection electrode CNE3 may be in contact with the second end portion of the first light emitting element ED1 and the first end portion of the third light emitting element ED3. The fourth connection electrode CNE4 may be in contact with the second end portion of the fourth light emitting element ED4 and the first end portion of the second light emitting element ED2. The fifth connection electrode CNE5 may be in contact with the second end portion of the third light emitting element ED3 and the first end portion of the fourth light emitting element ED4.

The light emitting elements ED may be classified into different light emitting elements ED according to the connection electrodes CNE to be in contact with end portions (e.g., opposite end portions) of the light emitting elements ED to correspond to the arrangement structure of the connection electrodes CNE. The first light emitting element ED1 and the second light emitting element ED2 may have first end portions in contact with the first type connection electrodes and second end portions in contact with the second type connection electrodes. The first light emitting element ED1 may be in contact with the first connection electrode CNE1 and the third connection electrode CNE3, and the second light emitting element ED2 may be in contact with the second connection electrode CNE2 and the fourth connection electrode CNE4. The third light emitting element ED3 and the fourth light emitting element ED4 may have end portions (e.g., opposite end portions) in contact with the second type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

Figure 8:
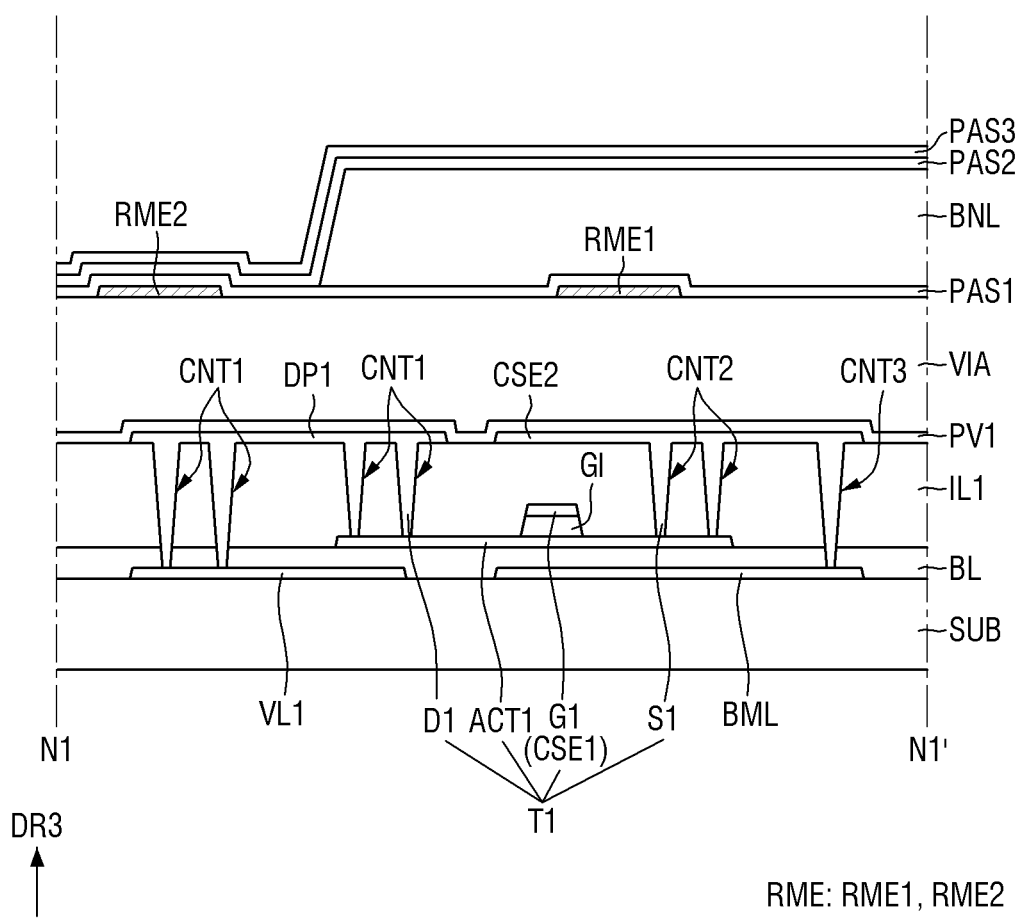
FIG. 8 is a schematic cross-sectional view taken along line N1-N1' of FIG. 5.
Figure 9:
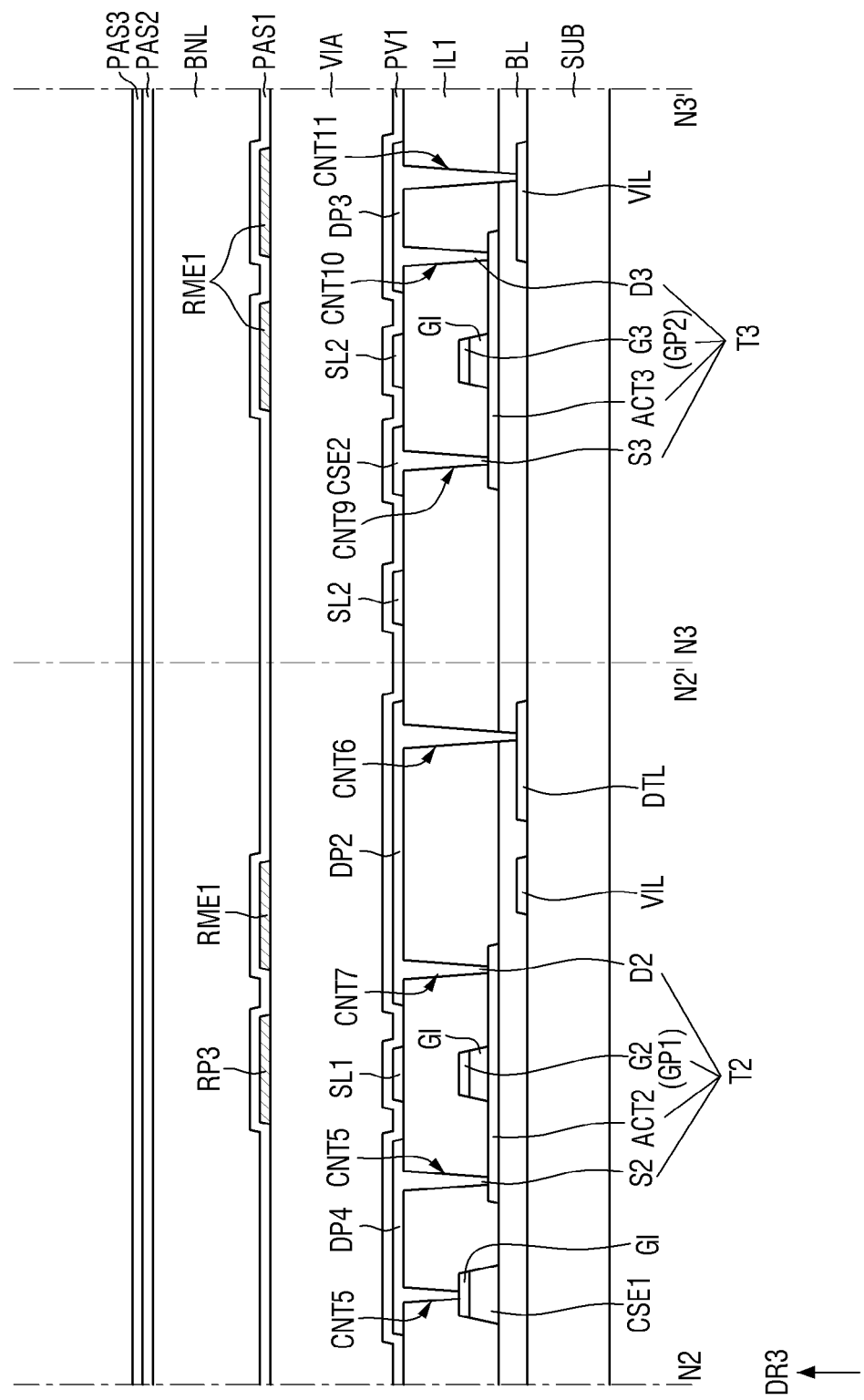
FIG. 9 is a schematic cross-sectional view taken along lines N2-N2' and N3-N3' of FIG. 5.
Figure 10:
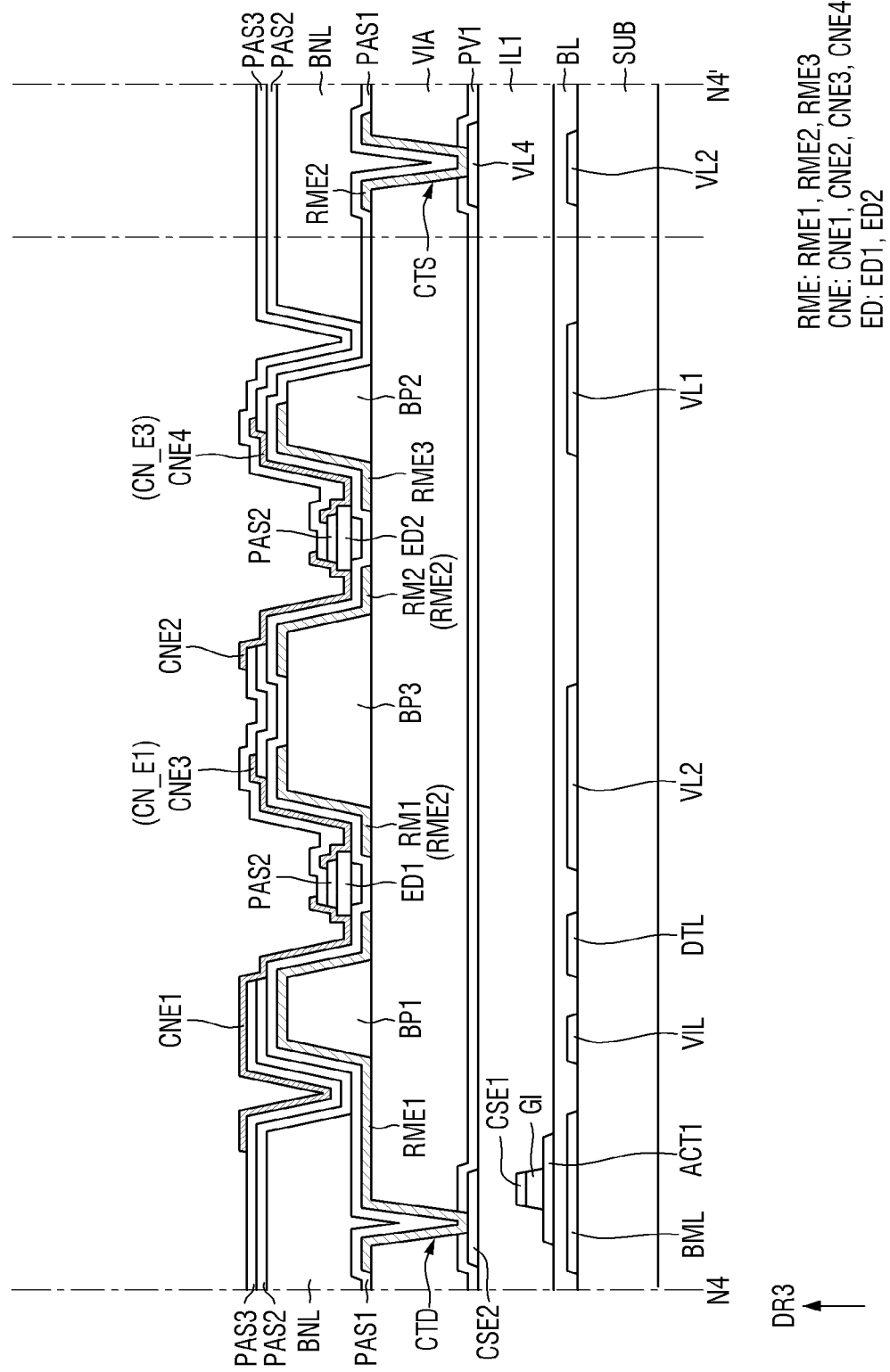
FIG. 10 is a schematic cross-sectional view taken along line N4-N4' of FIG. 7.
Figure 11:
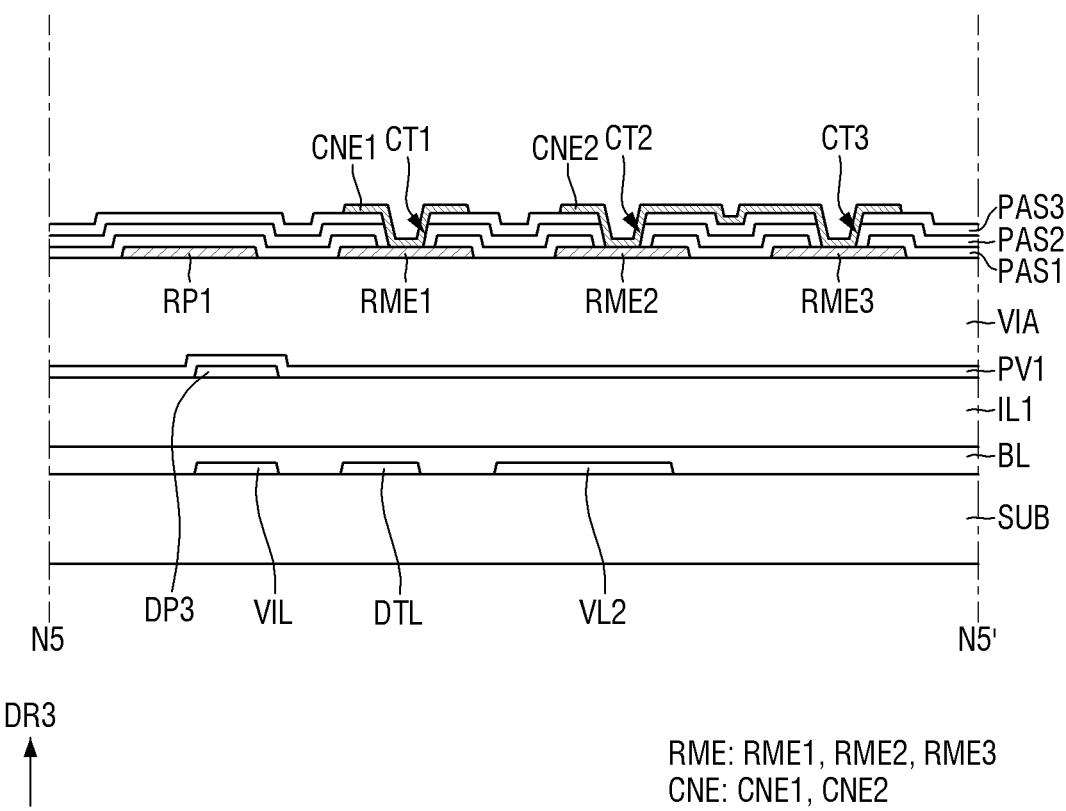
FIG. 11 is a schematic cross-sectional view taken along line N5-N5' of FIG. 7.

FIG. 8 is a schematic cross-sectional view taken along line N1-N1' of FIG. 5. FIG. 9 is a schematic cross-sectional view taken along lines N2-N2' and N3-N3' of FIG. 5. FIG. 10 is a schematic cross-sectional view taken along line N4-N4' of FIG. 7. FIG. 11 is a schematic cross-sectional view taken along line N5-N5' of FIG. 7.

FIG. 8 illustrates a cross section across the first transistor T1 connected to a sub-pixel SPXn, and FIG. 9 illustrates a cross section across the second transistor T2 and the third transistor T3 connected to a sub-pixel SPXn. FIG. 10 is a cross section across the electrodes RME and end portions (e.g., opposite end portions) of the first light emitting element ED1 and the second light emitting element ED2 disposed in a sub-pixel SPXn, and FIG. 11 illustrates a cross section across the contact portions CT1, CT2, and CT3 of a sub-pixel SPXn.

The cross-sectional structure of the display device 10 will be described with reference to FIGS. 4 to 7 in addition to FIGS. 8 to 11. The display device 10 may include a first substrate SUB, and a semiconductor layer, conductive layers, and insulating layers disposed thereon. For example, the display device 10 may include the electrodes RME, the light emitting element ED, and the connection electrodes CNE. The semiconductor layer, the conductive layers, and the insulating layers may each constitute a circuit layer of the display device 10. The description of the planar arrangement of the conductive layer, the semiconductor layer, the electrodes RME, the light emitting element ED, and the connection electrode CNE may be substantially the same as described above. Hereinafter, a connection relationship with other layers will be described as the cross-sectional structure.

The first substrate SUB may be an insulating substrate. The first substrate SUB may be made of an insulating material such as glass, quartz, or polymer resin. Further, the first substrate SUB may be a rigid substrate, but may be a flexible substrate which may be bent, folded or rolled. The first substrate SUB may include the display area DPA and the non-display area NDA surrounding the display area DPA, and the display area DPA may include the emission area EMA and the sub-region SA that is a portion of the non-emission area.

A first conductive layer may be disposed on the first substrate SUB. The first conductive layer may include the lower metal layer BML, the first voltage line VL1, the second voltage line VL2, the data lines DTL, and the initialization voltage line VIL.

The lower metal layer BML may be arranged to overlap an active layer ACT1 of a first transistor T1. The lower metal layer BML may prevent light from entering the first active layer ACT1 of the first transistor T1, or may be connected (e.g., electrically connected) to the first active layer ACT1 to stabilize electrical characteristics of the first transistor T1. In another example, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be connected (e.g., electrically connected) to the first transistor T1 through the first conductive pattern layer DP1 of the third conductive layer. The second voltage line VL2 may be connected (e.g., electrically connected) to the second electrode RME2 through the fourth voltage line VL4 of the third conductive layer.

The data line DTL may be connected (e.g., electrically connected) to the second transistor T2 through the second conductive pattern layer DP2 of the third conductive layer. The initialization voltage line VIL may be connected (e.g., electrically connected) to the third transistor T3 through the third conductive pattern layer DP3 of the third conductive layer.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer may be disposed on the buffer layer BL. The semiconductor layer may include the first active layer ACT1 of the first transistor T1, the second active layer ACT2 of the second transistor T2, and the third active layer ACT3 of the third transistor T3. The first active layer ACT1, the second active layer ACT2, and the third active layer ACT3 may overlap (e.g., partially overlap) pattern layers of the second conductive layer, which will be described below. The pattern layers may function as gate electrodes G1, G2, and G3 of the respective transistors T1, T2, and T3.

A first gate insulating layer G1 may be disposed on the semiconductor layer in the display area DPA. The first gate insulating layer G1 may function as a gate insulating layer of each of the transistors T1, T2, and T3. Although it is illustrated in the drawing that the first gate insulating layer G1 is patterned together with the gate electrodes G1, G2, and G3 of the second conductive layer and partially disposed between the second conductive layer and the active layers ACT1, ACT2, ACT3 of the semiconductor layer, embodiments are not limited thereto. In some embodiments, the first gate insulating layer G1 may be disposed (e.g., entirely disposed) on the buffer layer BL.

The second conductive layer may be disposed on the first gate insulating layer G1. The second conductive layer may include the first electrode pattern layer CSE1, the first gate pattern layer GP1, and the second gate pattern layer GP2. The first electrode pattern layer CSE1 may overlap the first active layer ACT1 of the first transistor T1 with the first gate insulating layer G1 interposed therebetween. The first electrode pattern layer CSE1 may function as the first gate electrode G1 of the first transistor T1.

The first gate pattern layer GP1 may overlap the second active layer ACT2 of the second transistor T2 with the first gate insulating layer G1 interposed between the first gate pattern layer GP1 and the second active layer ACT2. The first gate pattern layer GP1 may function as the second gate electrode G2 of the second transistor T2. The second gate pattern layer GP2 may overlap the third active layer ACT3 of the third transistor T3 with the first gate insulating layer G1 interposed therebetween. The second gate pattern layer GP2 may function as the third gate electrode G3 of the third transistor T3. The first electrode pattern layer CSE1, the first gate pattern layer GP1, and the second gate pattern layer GP2 may overlap the third regions of the active layers ACT1, ACT2, and ACT3 in a third direction DR3 (e.g., a thickness direction of the first substrate SUB), respectively.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include the conductive pattern layers DP1, DP2, DP3, and DP4, the first scan line SL1, the second scan line SL2, the third voltage line VL3, the fourth voltage line VL4, and the second electrode pattern layer CSE2.

The first conductive pattern layer DP1 may overlap the first active layer ACT1 and the first voltage line VL1 in the thickness direction. The first conductive pattern layer DP1 may be in contact with the first active layer ACT1 through the first contact hole CNT1 penetrating the first interlayer insulating layer IL1. Further, the first conductive pattern layer DP1 may be in contact with the first voltage line VL1 through another first contact hole CNT1 penetrating the first interlayer insulating layer IL1 and the buffer layer BL. The first conductive pattern layer DP1 may function as the first drain electrode D1 of the first transistor T1.

The second conductive pattern layer DP2 may overlap the second active layer ACT2 and the data line DTL. The second conductive pattern layer DP2 may be in contact with the second active layer ACT2 through a seventh contact hole CNT7 penetrating the first interlayer insulating layer IL1. Further, the second conductive pattern layer DP2 may be in contact with the data line DTL through a sixth contact hole CNT6 penetrating the first interlayer insulating layer IL1 and the buffer layer BL. The second conductive pattern layer DP2 may function as the second drain electrode D2 of the second transistor T2.

The third conductive pattern layer DP3 may overlap the third active layer ACT3 and the initialization voltage line VIL. The third conductive pattern layer DP3 may be in contact with the third active layer ACT3 through a tenth contact hole CNT10 penetrating the first interlayer insulating layer IL1. Further, the third conductive pattern layer DP3 may be in contact with the initialization voltage line VIL through an eleventh contact hole CNT11 penetrating the first interlayer insulating layer IL1 and the buffer layer BL. The third conductive pattern layer DP3 may function as the third drain electrode D3 of the third transistor T3.

The fourth conductive pattern layer DP4 may overlap the second active layer ACT2 and the first electrode pattern layer CSE1. The fourth conductive pattern layer DP4 may be in contact with the second active layer ACT2 through a fifth contact hole CNT5 penetrating the first interlayer insulating layer IL1. Further, the fourth conductive pattern layer DP4 may be in contact with the first electrode pattern layer CSE1 through another fifth contact hole CNT5 penetrating the first interlayer insulating layer IL1. The fourth conductive pattern layer DP4 may function as the second source electrode S2 of the second transistor T2.

The second electrode pattern layer CSE2 may overlap the first active layer ACT1, the third active layer ACT3, the first electrode pattern layer CSE1, and the lower metal layer BML in the thickness direction. The second electrode pattern layer CSE2 may be in contact with the first active layer ACT1 and the third active layer ACT3 through a second contact hole CNT2 and a ninth contact hole CNT9 penetrating the first interlayer insulating layer IL1. The second electrode pattern layer CSE2 may be in contact with the lower metal layer BML through a third contact hole CNT3 penetrating the first interlayer insulating layer IL1 and the buffer layer BL. The second electrode pattern layer CSE2 may function as the first source electrode S1 of the first transistor T1 and the third source electrode S3 of the third transistor T3. Further, the second electrode pattern layer CSE2 may overlap the first electrode pattern layer CSE1 with the first interlayer insulating layer IL1 interposed therebetween, and a storage capacitor may be formed therebetween.

For example, the first scan line SL1 may be in contact with the first gate pattern layer GP1 through the eighth contact hole CNT8 penetrating the first interlayer insulating layer IL1, and the second scan line SL2 may be in contact with the second gate pattern layer GP2 through another eighth contact hole CNT8 penetrating the first interlayer insulating layer IL1.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer G1, the first interlayer insulating layer IL1, and the first passivation layer PV1 described above may be formed of inorganic layers stacked in an alternating manner. For example, the buffer layer BL, the first gate insulating layer G1, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, embodiments are not limited thereto, and the buffer layer BL, the first gate insulating layer G1, the first interlayer insulating layer IL1, and the first passivation layer PV1 may be formed as a single inorganic layer containing the above-described insulating material. Further, in some embodiments, the first interlayer insulating layer IL1 may be made of an organic insulating material such as polyimide (PI) or the like.

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, embodiments are not limited thereto.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface (e.g., the upper surface). However, in some embodiments, the via layer VIA may be omitted.

The display device 10 may include the display element layer disposed on the via layer VIA. For example, the display element layer may include the barrier walls BP1, BP2 and BP3, the electrodes RME, the bank layer BNL, the light emitting elements ED, and the connection electrodes CNE. For example, the display device 10 may include the insulating layers PAS1, PAS2, and PAS3 disposed on the via layer VIA.

The barrier walls BP1, BP2, and BP3 may be disposed on the via layer VIA. For example, the barrier walls BP1, BP2, and BP3 may be disposed (e.g., directly disposed) on the via layer VIA, and may have a structure in which at least a part of the barrier walls BP1, BP2, and BP3 protrudes from the top surface (e.g., the upper surface) of the via layer VIA. The protruding portions of the barrier walls BP1, BP2, and BP3 may have an inclined surface or a curved surface with a certain curvature, and the light emitted from the light emitting element ED may be reflected by the electrode RME disposed on the barrier walls BP1, BP2, and BP3 and emitted in the upward direction of the via layer VIA. Unlike the example illustrated in the drawing, the barrier walls BP1, BP2, and BP3 may have a shape, e.g., a semicircular or semi-elliptical shape, in which the outer surface is curved with a certain curvature in a cross-sectional view. The barrier walls BP1, BP2, and BP3 may include an organic insulating material such as polyimide (PI), but embodiments are not limited thereto.

The electrodes RME may be disposed on the barrier walls BP1, BP2, and BP3 and the via layer VIA. For example, the first electrode RME1, the second electrode RME2, and the third electrode RME3 may be arranged at least on the inclined surfaces of the barrier walls BP1, BP2, and BP3. The widths of the electrodes RME in the second direction DR2 may be smaller than the widths of the barrier walls BP1, BP2, and BP3 in the second direction DR2, and the gap between the electrodes RME in the second direction DR2 may be smaller than the gap between the barrier walls BP1, BP2, and BP3. The electrodes RME may have at least a portion disposed (e.g., directly disposed) on the via layer VIA, so that the electrodes RME may be disposed on the same plane.

The light emitting element ED disposed between the barrier walls BP1, BP2, and BP3 may emit light toward end portions (e.g., opposite end portions), and the emitted light may be directed toward the electrodes RME disposed on the barrier walls BP1, BP2, and BP3. The electrodes RME may have a structure in which portions of the electrodes RME disposed on the barrier walls BP1, BP2, and BP3 may reflect the light emitted from the light emitting element ED. The electrodes RME may cover at least one side surface of the barrier walls BP1, BP2, and BP3 to reflect light emitted from the light emitting element ED.

The bent portion of the first electrode RME1 overlapping the portion of the bank layer BNL extending in the first direction DR1 may be in contact with the third conductive layer. The bent portion of the first electrode RME1 may be in contact with the second electrode pattern layer CSE2 through the first electrode contact hole CTD penetrating the via layer VIA and the first passivation layer PV1. The first electrode RME1 may be connected (e.g., electrically connected) to the first transistor T1 through the second electrode pattern layer CSE2. The second electrode RME2 may be in contact with the third conductive layer at the portion of the bank layer BNL extending in the second direction DR2. The second electrode RME2 may be in contact with the fourth voltage line VL4 through the second electrode contact hole CTS penetrating the via layer VIA and the first passivation layer PV1. The second electrode RME2 may be connected (e.g., electrically connected) to the second voltage line VL2 through the fourth voltage line VL4.

The first electrode RME1 may be connected (e.g., electrically connected) to the first transistor T1, so that the first power voltage may be applied to the first electrode RME1, and the second electrode RME2 may be connected (e.g., electrically connected) to the second voltage line VL2, so that the second power voltage may be applied to the second electrode RME2. However, embodiments are not limited thereto. In an embodiment, the electrodes RME may not be connected (e.g., electrically connected) to the third conductive layer, and the connection electrode CNE may be connected (e.g., directly connected) to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. In another example, the electrodes RME may have a structure in which a metal layer such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

Embodiments are not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as a layer including them. For example, each electrode RME may have a stacked structure of ITO/Ag/ITO, ITO/Ag/IZO, ITO/Ag/ITZO/IZO, or the like. The electrodes RME may be connected (e.g., electrically connected) to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the electrodes RME. The first insulating layer PAS1 may include an insulating material to protect the electrodes RME and insulate electrodes RME different from each other. The first insulating layer PAS1 may cover the electrodes RME before the bank layer BNL is formed, so that the electrodes RME may be protected from being damaged in a process of forming the bank layer BNL. For example, the first insulating layer PAS1 may protect the light emitting element ED disposed thereon from being damaged by contact with (e.g., direct contact with) other members.

In an embodiment, the first insulating layer PAS1 may have stepped portions such that the top surface (e.g., the upper surface) of the first insulating layer PAS1 may be partially depressed between the electrodes RME spaced apart in the second direction DR2. The light emitting element ED may be disposed on the top surface (e.g., the upper surface) of the first insulating layer PAS1, where the stepped portions are formed, and thus a space may remain between the light emitting element ED and the first insulating layer PAS1.

The first insulating layer PAS1 may include the contact portions CT1, CT2, and CT3 disposed in the sub-region SA. The contact portions CT1, CT2, and CT3 may overlap different electrodes RME, respectively. For example, the contact portions CT1, CT2, and CT3 may include the first contact portion CT1 overlapping the first electrode RME1, the second contact portion CT2 overlapping the second electrode RME2, and the third contact portion CT3 overlapping the third electrode RME3. The contact portions CT1, CT2, and CT3 may penetrate the first insulating layer PAS1 to expose a portion of the top surface (e.g., the upper surface) of the electrode RME disposed thereunder. Each of the contact portions CT1, CT2, and CT3 may further penetrate some of other insulating layers disposed on the first insulating layer PAS1.

The bank layer BNL may be disposed on the first insulating layer PAS1. The bank layer BNL may include portions extending in the first direction DR1 and the second direction DR2, and may surround the sub-pixels SPXn. The bank layer BNL may surround and distinguish the emission area EMA of each sub-pixel SPXn, and may surround the outermost portion of the display area DPA and distinguish the display area DPA and the non-display area NDA.

Similarly to the barrier walls BP1, BP2, and BP3, the bank layer BNL may have a certain height. In some embodiments, the top surface (e.g., the upper surface) of the bank layer BNL may be higher than that of the barrier walls BP1, BP2, and BP3, and the thickness of the bank layer BNL may be equal to or greater than that of the barrier walls BP1, BP2, and BP3. The bank layer BNL may prevent ink from overflowing to adjacent sub-pixels SPXn in an inkjet printing process during the manufacturing process of the display device 10. Similarly to the barrier walls BP1, BP2, and BP3, the bank layer BNL may include an organic insulating material such as polyimide.

The light emitting elements ED may be arranged in the emission area EMA. The light emitting elements ED may be disposed on the first insulating layer PAS1 between the barrier walls BP1, BP2, and BP3. The light emitting element ED may be disposed such that a direction in which the light emitting element ED extends is parallel to the top surface (e.g., the upper surface) of the first substrate SUB. As will be described below, the light emitting element ED may include semiconductor layers arranged along a direction in which the light emitting element ED extends, and the semiconductor layers may be sequentially arranged along the direction parallel to the top surface (e.g., the upper surface) of the first substrate SUB. However, embodiments are not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands according to a material constituting the semiconductor layer. However, embodiments are not limited thereto, and the light emitting elements ED arranged in each sub-pixel SPXn may include the semiconductor layer of the same material and emit light of the same color.

The light emitting elements ED may be connected (e.g., electrically connected) to the conductive layers under the electrode RME and the via layer VIA by contact with the connection electrodes CNE, and may emit light of a specific wavelength band by being applied with an electrical signal.

The second insulating layer PAS2 may be disposed on the light emitting elements ED, the first insulating layer PAS1, and the bank layer BNL. The second insulating layer PAS2 may include a pattern layer portion disposed on the light emitting elements ED with extending in the first direction DR1 between the barrier walls BP1, BP2, and BP3. The pattern layer portion may partially surround the outer surface of the light emitting element ED, and may not cover sides (e.g., opposite sides) or end portions (e.g., opposite end portions) of the light emitting element ED. The pattern layer portion may form a linear or island-like pattern in each sub-pixel SPXn in a plan view. The pattern layer portion of the second insulating layer PAS2 may protect the light emitting element ED and fix the light emitting elements ED during a manufacturing process of the display device 10. Further, the second insulating layer PAS2 may fill the space between the light emitting element ED and the first insulating layer PAS1 thereunder. A portion of the second insulating layer PAS2 may be disposed on the bank layer BNL and in the sub-regions SA.

The second insulating layer PAS2 may include the contact portions CT1, CT2, and CT3 disposed in the sub-region SA. The second insulating layer PAS2 may include the first contact portion CT1 overlapping the first electrode RME1, the second contact portion CT2 overlapping the second electrode RME2, and the third contact portion CT3 overlapping the third electrode RME3. The contact portions CT1, CT2, and CT3 may penetrate the second insulating layer PAS2 in addition to the first insulating layer PAS1. Each of the contact portions CT1, CT2, and CT3 may expose a portion of the top surface (e.g., the upper surface) of the electrode RME disposed thereunder.

The connection electrodes CNE may be disposed on the electrodes RME and the barrier walls BP1, BP2, and BP3. The first connection electrode CNE1 may be disposed on the first electrode RME1 and the first barrier wall BP1. The second connection electrode CNE2 may be disposed on the second electrode line RM2 of the second electrode RME2 and the third barrier wall BP3. The third connection electrode CNE3 may be disposed on the first electrode line RM1 of the second electrode RME2 and the third barrier wall BP3, and the fourth connection electrode CNE4 may be disposed on the third electrode RME3 and the second barrier wall BP2. The fifth connection electrode CNE5 may also be disposed on any one of the electrodes RME.

Each of the connection electrodes CNE may be in contact with the light emitting element ED. A description thereof is substantially the same as described above.

The first connection electrode CNE1 and the second connection electrode CNE2 may be disposed on the second insulating layer PAS2 and the third insulating layer PAS3, and the third connection electrode CNE3, the fourth connection electrode CNE4, and the fifth connection electrode CNE5 may be disposed between the second insulating layer PAS2 and the third insulating layer PAS3. The first connection electrode CNE1 and the second connection electrode CNE2 may be in contact with the electrodes RME through the contact portions CT1, CT2, and CT3 in the sub-region SA. The first connection electrode CNE1 may be in contact with the first electrode RME1 through the first contact portion CT1, and the second connection electrode CNE2 may be in contact with the second electrode RME2 and the third electrode RME3 through the second contact portion CT2 and the third contact portion CT3, respectively.

The first connection electrode CNE1 and the second connection electrode CNE2 may be connected (e.g., electrically connected) to the third conductive layer through the electrodes RME. The first connection electrode CNE1 may be connected (e.g., electrically connected) to the first transistor T1, so that the first power voltage may be applied to the first connection electrode CNE1, and the second connection electrode CNE2 may be connected (e.g., electrically connected) to the second voltage line VL2, so that the second power voltage may be applied to the second connection electrode CNE2. The third connection electrode CNE3, the fourth connection electrode CNE4, and the fifth connection electrode CNE5 may be connected (e.g., electrically connected) to the first connection electrode CNE1 and the second connection electrode CNE2 through the light emitting elements ED. Each connection electrode CNE may be in contact the light emitting element ED in the emission area EMA to transmit the power voltage to the light emitting element ED.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may transmit through the connection electrodes CNE to be emitted.

The third insulating layer PAS3 may be disposed on the third connection electrode CNE3, the fourth connection electrode CNE4, the fifth connection electrode CNE5, and the second insulating layer PAS2. The third insulating layer PAS3 may be disposed on the entire second insulating layer PAS2 to cover the third connection electrode CNE3, the fourth connection electrode CNE4, and the fifth connection electrode CNE5, and the first connection electrode CNE1 and the second connection electrode CNE2 may be disposed on the third insulating layer PAS3. The third insulating layer PAS3 may insulate the connection electrodes CNE of different layers to prevent direct contact therebetween.

The third insulating layer PAS3 may include the contact portions CT1, CT2, and CT3 disposed in the sub-region SA. The contact portions CT1, CT2, and CT3 may penetrate the third insulating layer PAS3 in addition to the first insulating layer PAS1 and the second insulating layer PAS2.

For example, another insulating layer may be further disposed on the third insulating layer PAS3. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may include an inorganic insulating material. In another example, the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may have a structure in which insulating layers are stacked alternately or repeatedly. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In another example, some of them may be made of the same material and some of them may be made of different materials.

In the display device 10, an electrical signal may be applied to the first voltage line VL1 and the second voltage line VL2 of the first conductive layer, and the electrical signal may be transmitted to the light emitting elements ED through the second conductive layer, the third conductive layer, the electrodes RME, and the connection electrode CNE. The conductive layers and the electrodes of the display device 10 may include wires or electrodes involved in the light emission of the light emitting elements ED. However, in the manufacturing process of the display device 10, an electrical signal may be directly applied to only some of the wires and utilized in the alignment process of the light emitting elements ED.

The display device 10 according to an embodiment may include pattern layers that are simultaneously connected (e.g., electrically connected) to different wires and then connected (e.g., electrically connected) to only one wire in the manufacturing process of the display device 10. The pattern layers may be disposed on the same layer as the third conductive layer or the electrodes RME and connected (e.g., electrically connected) to the wires of the first conductive layer. The wires to which the electrical signal for aligning the light emitting elements ED is not directly applied by the pattern layers may also be involved in the alignment process of the light emitting elements ED. After the alignment process of the light emitting elements ED, the wires may be disconnected (e.g., electrically disconnected) from the wires to which the alignment signal is applied, and may receive an electrical signal for driving the light emitting element ED. In the display device 10, a product quality may be improved by preventing misalignment of the light emitting elements ED using the pattern layers. This will be described with reference to other drawings.

Figure 12:
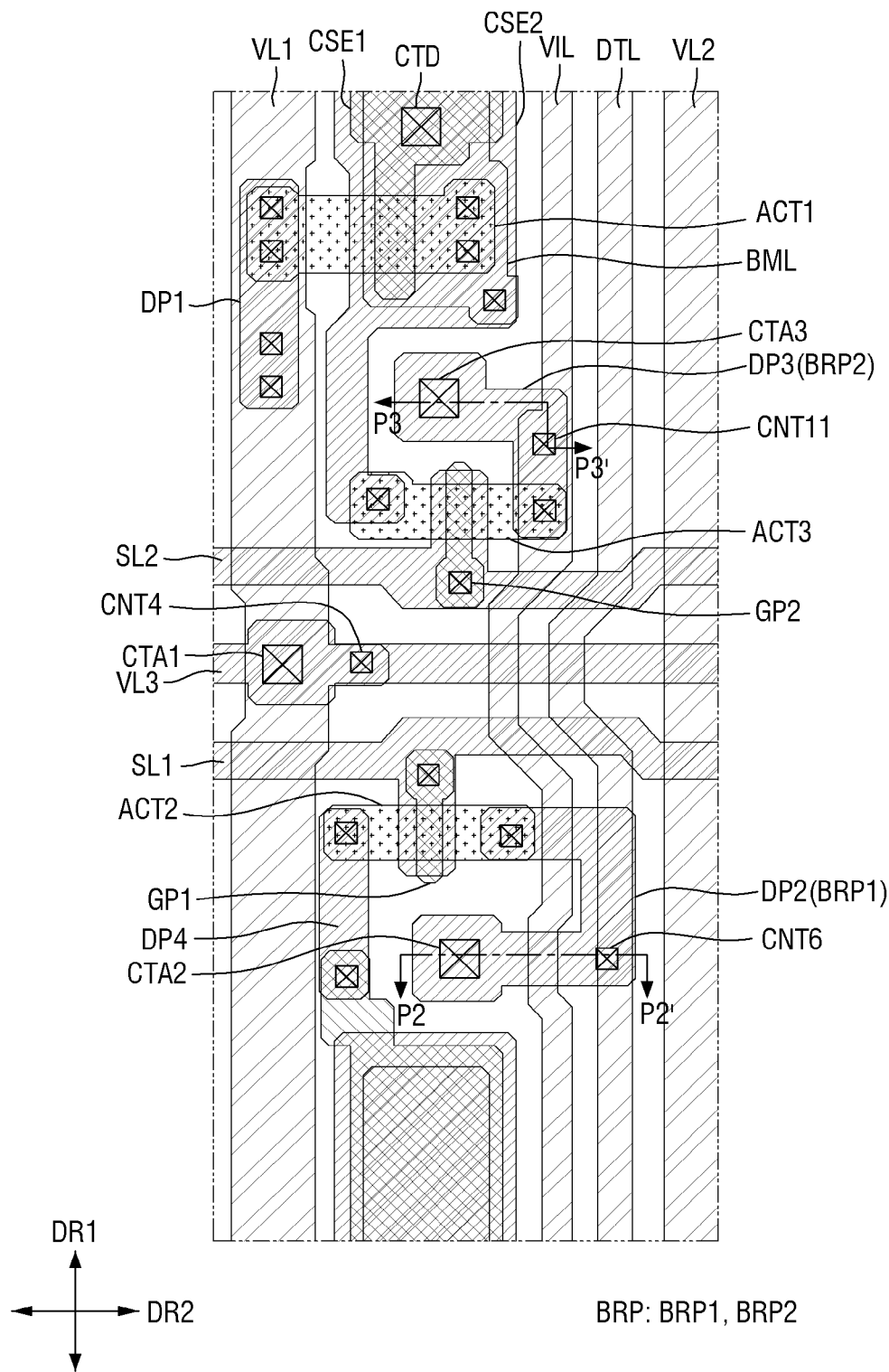
FIG. 12 is a schematic enlarged plan view of a portion in which a voltage line and conductive pattern layers adjacent thereto are disposed in a display device according to an embodiment.
Figure 13:
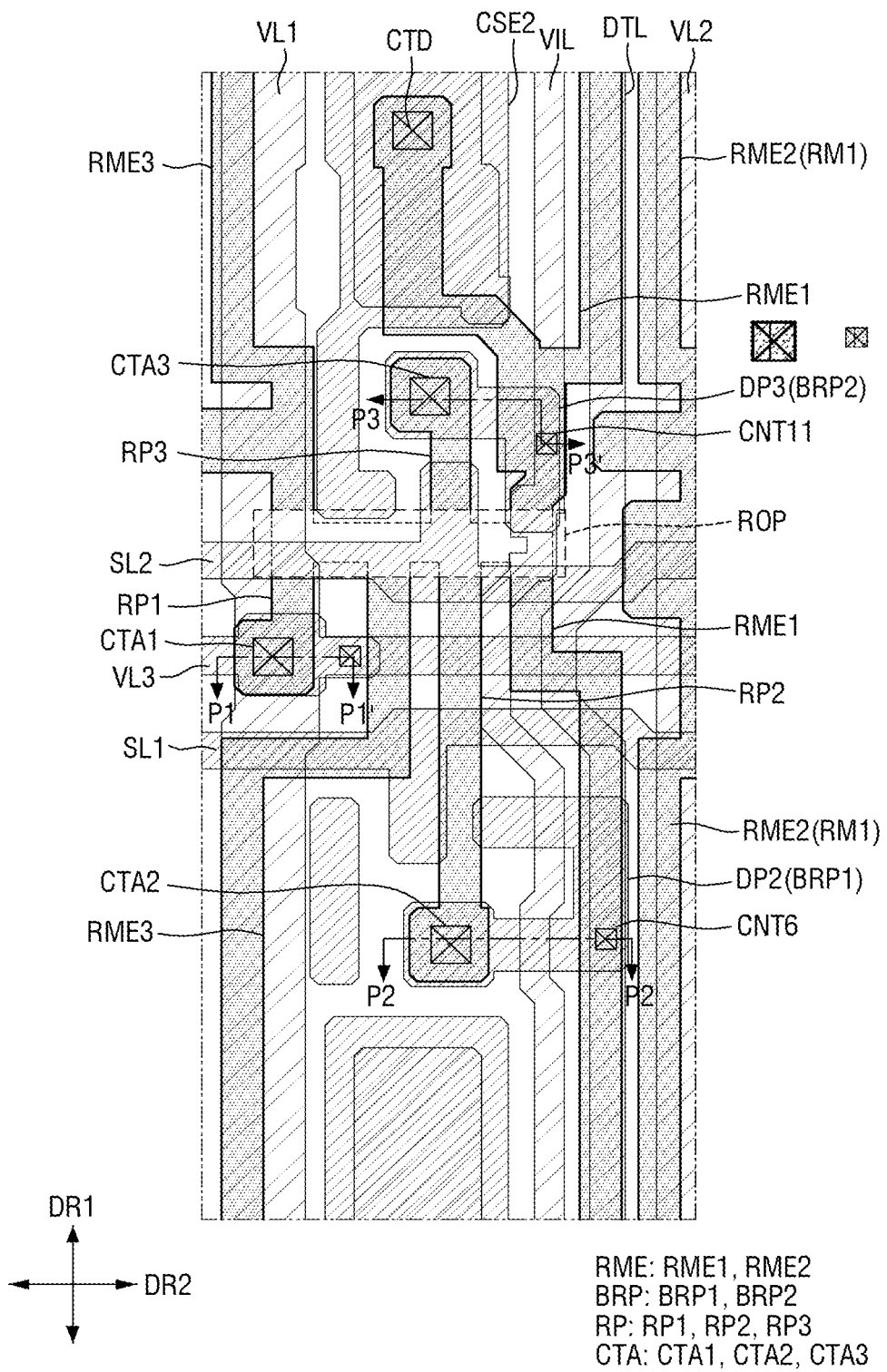
FIG. 13 is a schematic plan view illustrating relative arrangement of the first conductive layer, the third conductive layer, and the electrodes at the portion illustrated in FIG. 12.
Figure 14:
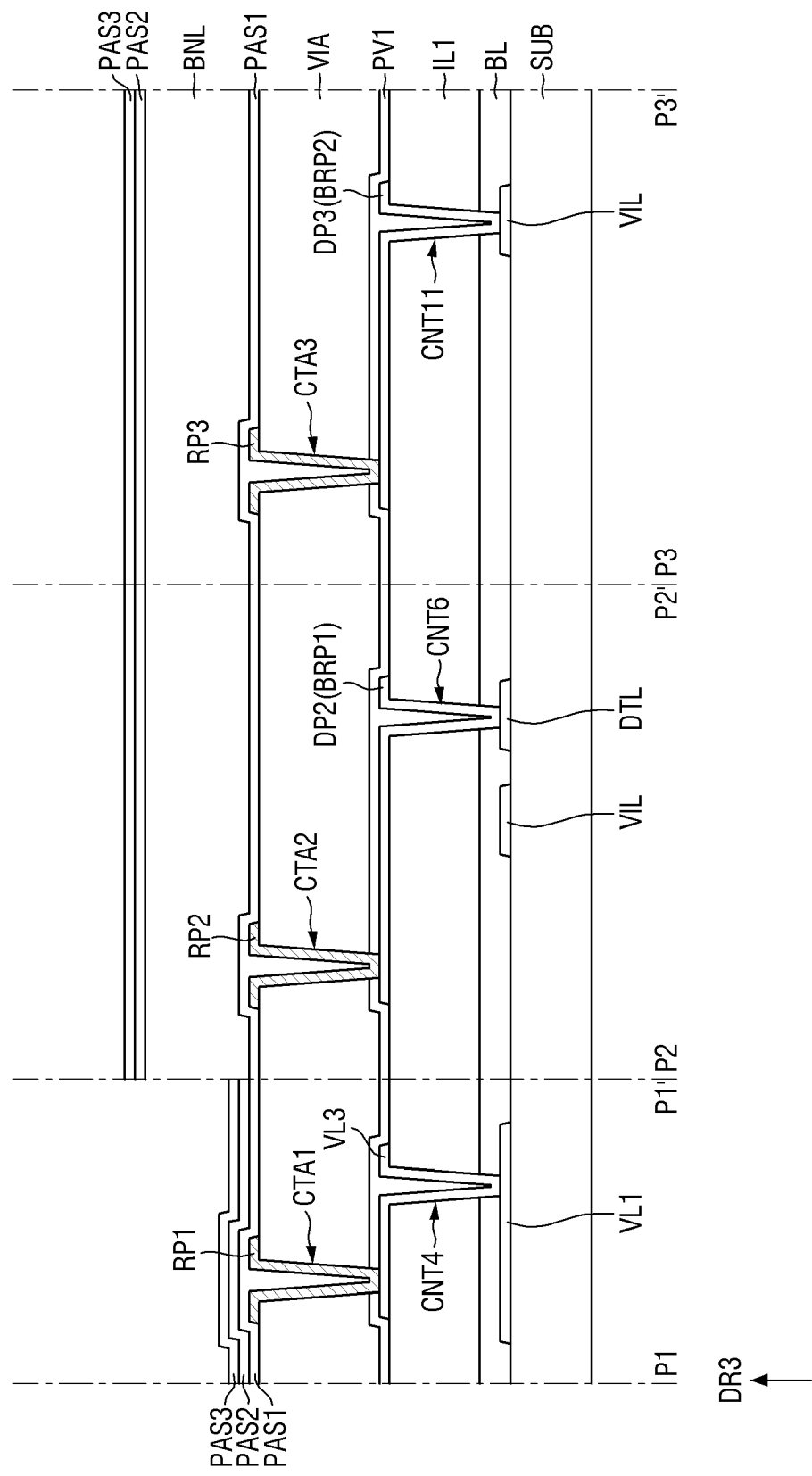
FIG. 14 is a schematic cross-sectional view taken along lines P1-P1', P2-P2', and P3-P3' of FIG. 13.

FIG. 12 is a schematic enlarged plan view of a portion in which a voltage line and conductive pattern layers adjacent thereto are disposed in a display device according to an embodiment. FIG. 13 is a schematic plan view illustrating relative arrangement of the first conductive layer, the third conductive layer, and the electrodes at the portion illustrated in FIG. 12. FIG. 14 is a schematic cross-sectional view taken along lines P1-P1', P2-P2', and P3-P3' of FIG. 13.

FIGS. 12 and 13 illustrate planar arrangement of conductive layers, connection pattern layers RP, and electrodes RME adjacent to the separation portion ROP of the sub-region SA. FIG. 14 illustrates a cross section across a portion in which the connection pattern layers RP and bridge pattern layers BRP are connected.

Referring to FIGS. 12 to 14, the display device 10 according to an embodiment may include pattern layers of other layers that are connected (e.g., electrically connected) to the wires of the first conductive layer. The pattern layers may be connected to each other in the manufacturing process of the display device 10, and then electrically separated from each other after the alignment process of the light emitting element ED. The display device 10 may include the pattern layers connected (e.g., electrically connected) to the wires of the first conductive layer as the trace of the separated pattern layers.

For example, the display device 10 may include the pattern layers connected to the initialization voltage line VIL, the data line DTL, and the first voltage line VL1 of the first conductive layer. For example, the pattern layers may include the bridge pattern layers BRP of the third conductive layer and the connection pattern layers RP. For example, the bridge pattern layers BRP of the third conductive layer, the connection pattern layers RP, and the electrode RME may be disposed on the same layer (e.g., the via layer VIA).

The connection pattern layers RP may be disposed (e.g., directly disposed) on the via layer VIA. For example, the connection pattern layers RP and the electrodes RME may be disposed on the same layer (e.g., the via layer VIA). The connection pattern layers RP and the electrodes RME may contain the same material. For example, the connection pattern layers RP may be integral with the electrodes RME and then separated from the electrodes RME at the separation portion ROP. In the display device 10, the connection pattern layers RP may be separated from each other, and may be connected (e.g., electrically connected) to the wires of the first conductive layer. The connection pattern layers RP may be disposed around the separation portion ROP to correspond to the arrangement of the wires of the first conductive layer to which they are connected (e.g., electrically connected).

The connection pattern layer RP may include a first connection pattern layer RP1 connected (e.g., electrically connected) to the first voltage line VL1, a second connection pattern layer RP2 connected (e.g., electrically connected) to the data line DTL, and a third connection pattern layer RP3 connected (e.g., electrically connected) to the initialization voltage line VIL.

Referring to FIG. 13, the first connection pattern layer RP1 may be adjacent to the left side on the lower side, which is another side of the separation portion ROP in the first direction DR1 e.g., in a plan view. The first connection pattern layer RP1 may be arranged side by side with any one third electrode RME3 in the first direction DR1, and may be spaced apart from another third electrode RME3 in the second direction DR2. The first connection pattern layer RP1 may be spaced apart from the third electrode RME3 disposed on the upper side of the separation portion ROP in the first direction DR1, and may be spaced apart from the third electrode RME3 disposed on the lower side of the separation portion ROP in the second direction DR2.

Referring to FIG. 14, the first connection pattern layer RP1 may overlap the first voltage line VL1 and the third voltage line VL3. The first connection pattern layer RP1 may be in contact with the third voltage line VL3 through a first connection contact hole CTA1 penetrating the via layer VIA and the first passivation layer PV1. Since the third voltage line VL3 is in contact with the first voltage line VL1 through the fourth contact hole CNT4, the first connection pattern layer RP1 may be connected (e.g., electrically connected) to the first voltage line VL1 through the third voltage line VL3. For example, the third voltage line VL3 may be disposed at a higher level than the first voltage line VL1, the second voltage line VL2, and the initialization voltage line VIL, and may be disposed at a lower level than the first connection pattern layer RP1 based on the first substrate SUB (e.g., see FIG. 14).

The second connection pattern layer RP2 may be disposed on the lower side, which is another side of the separation portion ROP in the first direction DR1, with reference to FIG. 13. The second connection pattern layer RP2 may be arranged side by side with a portion in which the bent portion of the first electrode RME1 is disposed, or the first electrode contact hole CTD in the first direction DR1. The second connection pattern layer RP2 may be disposed between the first electrode RME1 and the third electrode RME3 disposed on the lower side of the separation portion ROP, and may be spaced apart from the first electrode RME1 and the third electrode RME3 in the second direction DR2. The second connection pattern layer RP2 may be spaced apart from the third connection pattern layer RP3 in the first direction DR1 with the separation portion ROP interposed therebetween. For example, the second conductive pattern layer DP2 (e.g., the first bridge pattern layer BRP1) may be disposed at a higher level than the first voltage line VL1, the second voltage line VL2, and the initialization voltage line VIL, and may be disposed at a lower level than the second connection pattern layer RP2 based on the first substrate SUB (e.g., see FIG. 14). For example, the third voltage line VL3, the fourth voltage line VL4, and the second conductive pattern layer DP2 (e.g., the first bridge pattern layer BRP1) may be disposed on the same layer such as the first interlayer insulating layer IL1 (e.g., see FIGS. 13, 14, and 26).

The second connection pattern layer RP2 may overlap the second conductive pattern layer DP2 connected to the data line DTL. The second connection pattern layer RP2 may be in contact with the second conductive pattern layer DP2 through the second connection contact hole CTA2 penetrating the via layer VIA and the first passivation layer PV1. Since the second conductive pattern layer DP2 is in contact with the data line DTL through the sixth contact hole CNT6, the second connection pattern layer RP2 may be connected (e.g., electrically connected) to the data line DTL. The second conductive pattern layer DP2 may be a first bridge pattern layer BRP1 connecting (e.g., electrically connecting) the data line DTL of the first conductive layer to the second connection pattern layer RP2 disposed thereabove. The second connection pattern layer RP2 may be disposed substantially adjacent to the second transistor T2.

The third connection pattern layer RP3 may be disposed on the upper side, which is a side of the separation portion ROP in the first direction DR1, with reference to FIG. 13. The third connection pattern layer RP3 may be disposed between the bent portion of the first electrode RME1 and the separation portion ROP, and may be arranged side by side with the first electrode contact hole CTD in the first direction DR1. The third connection pattern layer RP3 may be disposed between the first electrode RME1 and the third electrode RME3 disposed on the upper side of the separation portion ROP, and may be spaced apart from the first electrode RME1 and the third electrode RME3 in the second direction DR2. The third connection pattern layer RP3 may be spaced apart from the second connection pattern layer RP2 in the first direction DR1 with the separation portion ROP interposed therebetween. For example, the third conductive pattern layer DP3 (e.g., the second bridge pattern layer BRP2) may be disposed at a higher level than the first voltage line VL1, the second voltage line VL2, and the initialization voltage line VIL, and may be disposed at a lower level than the third connection pattern layer RP3 based on the first substrate SUB (e.g., see FIG. 14).

The third connection pattern layer RP3 may overlap the third conductive pattern layer DP3 connected to the initialization voltage line VIL. The third connection pattern layer RP3 may be in contact with the third conductive pattern layer DP3 through a third connection contact hole CTA3 penetrating the via layer VIA and the first passivation layer PV1. Since the third conductive pattern layer DP3 is in contact with the initialization voltage line VIL through the eleventh contact hole CNT11, the third connection pattern layer RP3 may be connected (e.g., electrically connected) to the initialization voltage line VIL. The third conductive pattern layer DP3 may be a second bridge pattern layer BRP2 connecting (e.g., electrically connecting) the initialization voltage line VIL of the first conductive layer to the third connection pattern layer RP3 disposed thereabove. The third connection pattern layer RP3 may be disposed substantially adjacent to the third transistor T3.

Among the connection pattern layers RP1, RP2, and RP3, the first connection pattern layer RP1 may be a connection pattern layer connected (e.g., electrically connected) to the first voltage line VL1, and the second connection pattern layer RP2 and the third connection pattern layer RP3 may be connection pattern layers connected (e.g., electrically connected) to the data line DTL and the initialization voltage line VIL, respectively. The bridge pattern layers BRP1 and BRP2 may be pattern layers connected (e.g., directly connected) to the second connection pattern layer RP2, the third connection pattern layer RP3, the data line DTL, and the initialization voltage line VIL. The first connection pattern layer RP1 may be a connection pattern layer to which the electrical signal applied to the first voltage line VL1 is transmitted, and the second connection pattern layer RP2, the third connection pattern layer RP3, and the bridge pattern layers BRP1 and BRP2 may be pattern layers that transmit the electrical signal transmitted to the first connection pattern layer RP1 to the data line DTL and the initialization voltage line VIL.

The connection pattern layers RP may be adjacent to the separation portion ROP. Some of the connection pattern layers RP may be disposed in the sub-region SA, and some other connection pattern layers RP may overlap the bank layer BNL. The first connection pattern layer RP1 may be disposed in the sub-region SA without overlapping the bank layer BNL, and the second connection pattern layer RP2 and the third connection pattern layer RP3 may be partially disposed under the bank layer BNL. The first connection contact hole CTA1 may not overlap the bank layer BNL, but the second connection contact hole CTA2 and the third connection contact hole CTA3 may overlap the bank layer BNL. This may be an arrangement structure obtained by forming the connection pattern layers RP in consideration of the positions of the first voltage line VL1, the data line DTL, and the initialization voltage line VIL.

In an embodiment, the manufacturing process of the display device 10 may include a process of applying an alignment signal to the voltage lines VL1, VL2, VL3, and VL4 to align the light emitting elements ED. In case that the alignment signal is applied to the voltage lines VL1, VL2, VL3, and VL4, an electric field may be generated on the electrode RME connected (e.g., electrically connected) thereto, and the light emitting element ED dispersed in an ink and sprayed onto the electrodes RME may be disposed on the electrodes RME in case that the positions and directions of the light emitting element ED are changed by the electric field.

The first electrode RME1 and the third electrode RME3 may be connected to each other at the separation portion ROP together with the connection pattern layers RP (e.g., a dashed line portion of FIG. 13), and then spaced apart from each other by a separation process after the alignment of the light emitting elements ED. The first electrode RME1 and the third electrode RME3 may be connected (e.g., electrically connected) to the first voltage line VL1 through the first electrode contact hole CTD, and the second electrode RME2 may be connected (e.g., electrically connected) to the second voltage line VL2 through the second electrode contact hole CTS. The alignment signal applied to the voltage lines VL1, VL2, VL3, and VL4 may be transmitted to the electrodes RME, and the light emitting elements ED may be aligned on the electrodes RME.

In the alignment process of the light emitting elements ED, an electrical signal may not be applied to the data line DTL and the initialization voltage line VIL. However, in a state where the electrodes RME are integral with the connection pattern layers RP, the data line DTL and the initialization voltage line VIL may be connected (e.g., electrically connected) to the first voltage line VL1 through the connection pattern layers RP and the bridge pattern layers BRP. For example, since the first connection pattern layer RP1 is connected (e.g., electrically connected) to the first voltage line VL1 through the third voltage line VL3, the second connection pattern layer RP2 and the third connection pattern layer RP3 connected to the first connection pattern layer RP1 may also be connected (e.g., electrically connected) to the first voltage line VL1. The second connection pattern layer RP2 may be connected (e.g., electrically connected) to the data line DTL through the first bridge pattern layer BRP1 or the second conductive pattern layer DP2, and the third connection pattern layer RP3 may be connected (e.g., electrically connected) to the initialization voltage line VIL through the second bridge pattern layer BRP2 or the third conductive pattern layer DP3.

Accordingly, the data line DTL and the initialization voltage line VIL may be connected (e.g., electrically connected) to the first voltage line VL1 in the manufacturing process of the display device 10 or the alignment process of the light emitting element ED. The alignment signal applied to the first voltage line VL1 of the first conductive layer may be transmitted to the first electrode RME1, the third electrode RME3, and the connection pattern layers RP that are integral, the data line DTL, and the initialization voltage line VIL. The alignment signal applied to the second voltage line VL2 may be transmitted to the second electrode RME2. The alignment signal applied to the voltage lines VL1 and VL2 of the first conductive layer may be transmitted to the electrodes RME through the first electrode contact hole CTD, the second electrode contact hole CTS, and the connection contact holes CTA1, CTA2 and CTA3.

In case that the alignment process of the light emitting elements ED is completed, the integrally formed electrode RME may be disconnected at/by the separation portion ROP and separated into the connection pattern layers RP, the first electrode RME1, and the third electrode RME3. The data line DTL and the initialization voltage line VIL may also be disconnected (e.g., electrically disconnected) from the first voltage line VL1, and another electrical signal (e.g., an initialization voltage or a data signal) for driving the light emitting element ED may be applied. At least the first insulating layer PAS1 may not be disposed at the separation portion ROP that is the trace of the separation of the electrodes RME and the connection pattern layers RP.

The connection pattern layers RP and the bridge pattern layer BRP of the display device 10 may have the trace that the connection pattern layers RP and the bridge pattern layer BRP are simultaneously connected (e.g., electrically connected) to different wires and then connected (e.g., electrically connected) to only one wire during the manufacturing process. For example, in the display device 10, the first connection pattern layer RP1 may be connected (e.g., electrically connected) to the first voltage line VL1 and the third voltage line VL3, and may not be directly connected to the first electrode RME1 and the first transistor T1. The second connection pattern layer RP2 may be connected (e.g., electrically connected) to the second transistor T2, and the third connection pattern layer RP3 may be connected to the third transistor T3. The bridge pattern layers BRP1 and BRP2 may function as drain electrodes of the transistors (e.g., the second transistor T2 and the third transistor T3).

During the manufacturing process of the display device 10, in the alignment process of the light emitting elements ED, the first voltage line VL1, the initialization voltage line VIL, and the data lines DTL may be connected (e.g., electrically connected) to each other through the connection pattern layer RP and the bridge pattern layers BRP. After the alignment process of the light emitting element ED, the first voltage line VL1, the initialization voltage line VIL, and the data lines DTL may not be connected (e.g., electrically connected) to each other, and an electrical signal may be applied independently.

In the alignment process of the light emitting element ED, an electric field for aligning the light emitting elements ED may be generated on the electrodes to which different alignment signals are transmitted. Since the same alignment signal is applied to the first electrode RME1 and the third electrode RME3 and another alignment signal is applied to the second electrode RME2, the light emitting elements ED may be disposed on the first electrode RME1 and the second electrode RME2, or on the second electrode RME2 and the third electrode RME3.

As illustrated in FIG. 13, the first electrode RME1 may be adjacent to the initialization voltage line VIL and the data line DTL of the first conductive layer. In an embodiment, the first electrode RME1 may overlap the data line DTL, and the initialization voltage line VIL may be adjacent thereto in a plan view. In case that an electrical signal is not applied to the initialization voltage line VIL and the data line DTL, an electric field hindering the alignment of the light emitting elements ED may be generated between the first electrode RME1 and the wires. However, in the display device 10 according to an embodiment including the connection pattern layers RP, the initialization voltage line VIL and the data line DTL may be connected (e.g., electrically connected) to the first voltage line VL1 in the alignment process of the light emitting elements ED, so that an electric field may not be generated between the first electrode RME1 and the initialization voltage line VIL and the data line DTL. For example, the initialization voltage line VIL and the data line DTL may overlap a region between the first electrode RME1 and the bank layer BNL (shown in FIG. 10). Since the initialization voltage line VIL and the data line DTL are connected (e.g., electrically connected) to the first voltage line VL1, the light emitting elements ED may be prevented from being aligned between the bank layer BNL and the first electrode RME1 in the emission area EMA. In the display device 10, the number of light emitting elements ED that are lost (or misaligned) without being aligned at a specific position may be reduced, and the light emitting elements ED may be disposed on the electrodes RME with a high alignment degree. Accordingly, the display device 10 is advantageous in that a product quality is improved and a manufacturing process yield is improved.

Figure 15:
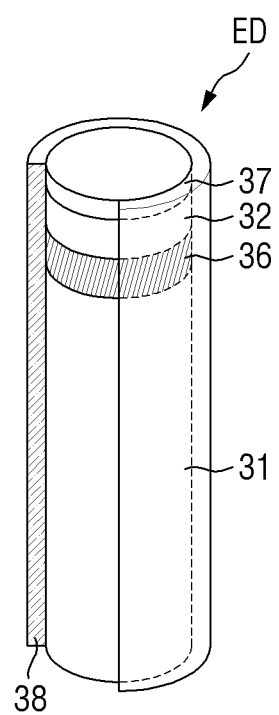
FIG. 15 is a schematic view of a light emitting element according to an embodiment.

FIG. 15 is a schematic view of a light emitting element according to an embodiment.

Referring to FIG. 15, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type dopant (e.g., a p-type dopant or an n-type dopant). The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_x$-

Ga$_y$In$_{1-x-y}$N (0≤x≤1, 0≤y≤1, 0≤x+y≤1). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se, or the like.

The second semiconductor layer 32 may be disposed on the first semiconductor layer 31. For example, the light emitting layer 36 may be disposed between the first semiconductor layer 31 and the second semiconductor layer 32. The second semiconductor layer 32 may be a p-type semiconductor, and the second semiconductor layer 32 may include a semiconductor material having a chemical formula of Al$_x$Ga$_y$In$_{1-x-y}$N (0≤x≤1, 0≤y≤1, 0≤x+y≤1). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as a single layer, embodiments are not limited thereto. According to the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN and SLs doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 may be disposed between the first semiconductor layer 31 and the second semiconductor layer 32. The light emitting layer 36 may include a material having a single quantum well structure or a multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. For example, in case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, embodiments are not limited thereto, and it may be a Schottky connection electrode. The light emitting element ED may include at least one electrode layer 37. The light emitting element ED may include one or more electrode layers 37, but embodiments are not limited thereto, and the electrode layer 37 may be omitted.

In the display device 10, in case that the light emitting element ED is connected (e.g., electrically connected) to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be arranged to surround the outer surfaces of the semiconductor layers and electrode layers described above. For example, the insulating film 38 may surround at least the outer surface of the light emitting layer 36, and may be formed to expose end portions (e.g., opposite end portions) of the light emitting element ED in the longitudinal direction. Further, in a cross-sectional view, the insulating film 38 may have a top surface (e.g., an upper surface), which is rounded in a region adjacent to at least one end portion of the light emitting element ED.

The insulating film 38 may include at least one of materials having insulating properties, for example, silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$). It is illustrated in the drawing that the insulating film 38 is formed as a single layer, but embodiments are not limited thereto. In some embodiments, the insulating film 38 may be formed in a multilayer structure having layers stacked therein.

The insulating film 38 may protect the semiconductor layers and the electrode layer of the light emitting element ED. The insulating film 38 may prevent an electrical short circuit that is likely to occur at the light emitting layer 36 in case that an electrode to which an electrical signal is transmitted is in contact with (e.g., in direct contact with) the light emitting element ED. For example, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, various embodiments of the display device 10 will be described with reference to other drawings.

Figure 16:
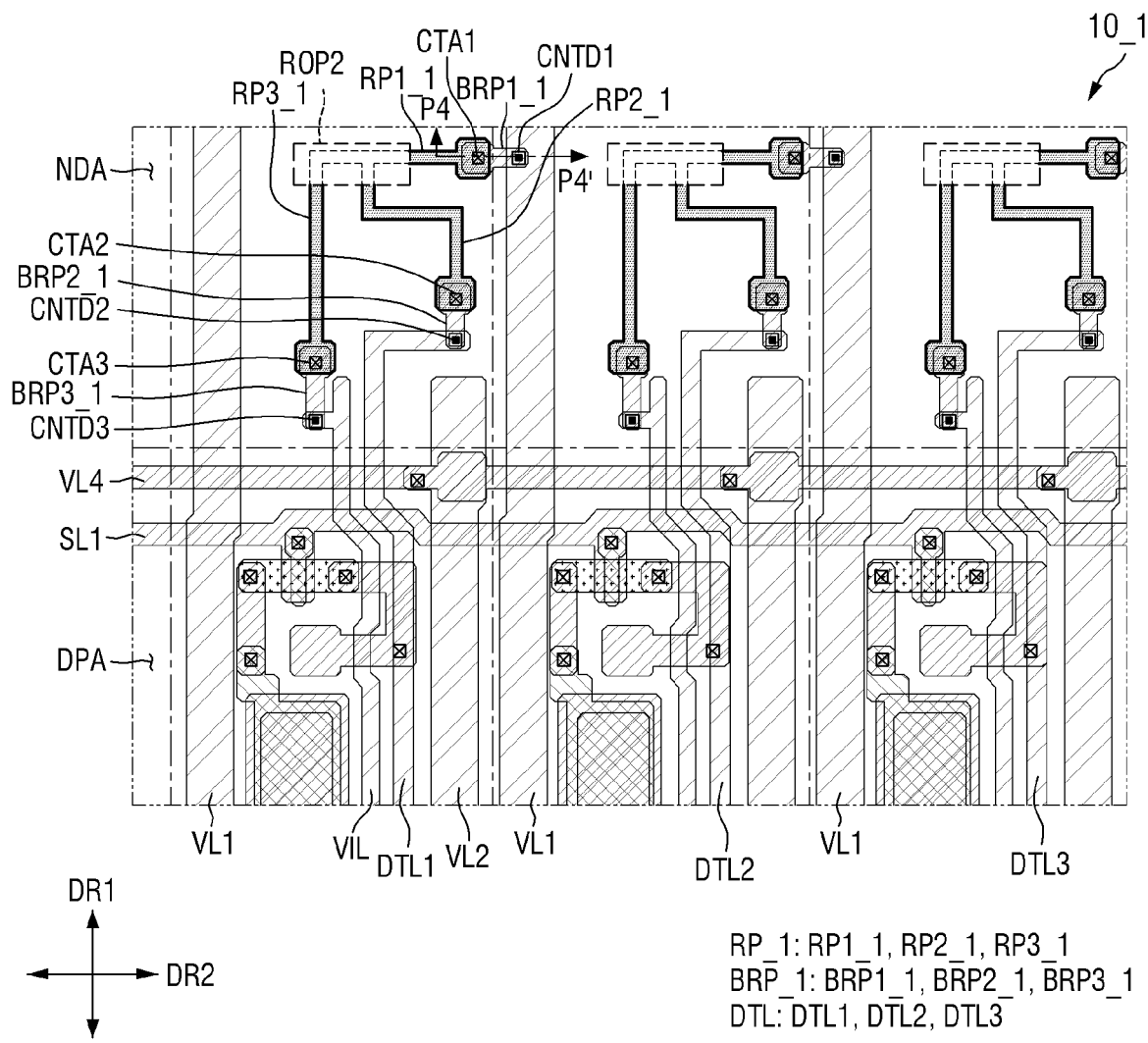
FIG. 16 is a schematic plan view illustrating a pixel adjacent to a non-display area and wires disposed in the non-display area of a display device according to an embodiment.
Figure 17:
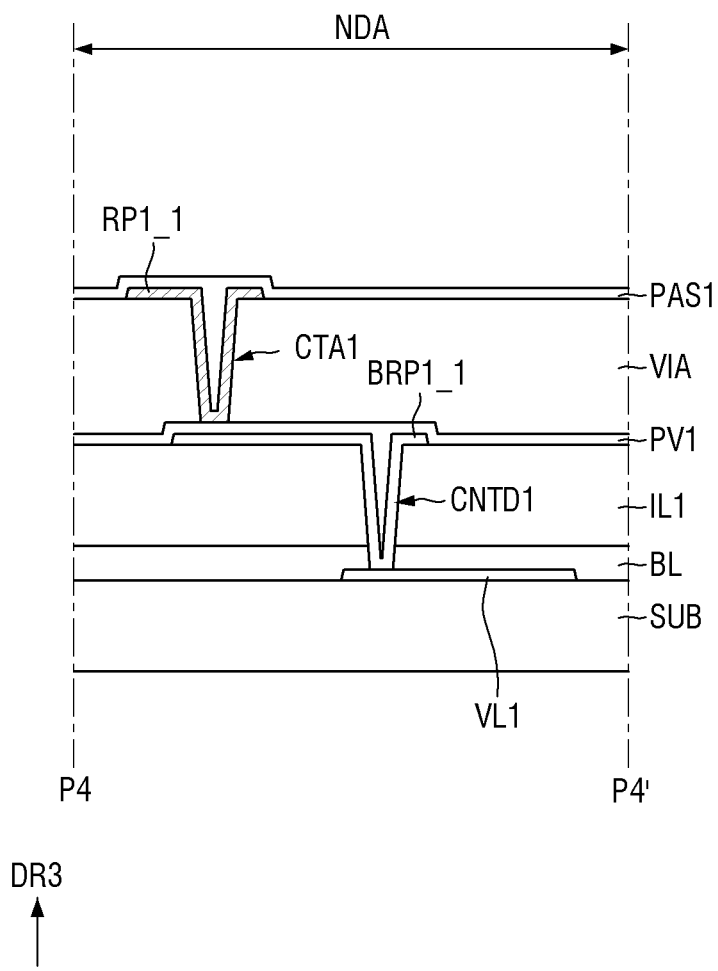
FIG. 17 is a schematic cross-sectional view taken along line P4-P4' in FIG. 16.

FIG. 16 is a schematic plan view illustrating a pixel adjacent to a non-display area and wires disposed in the non-display area of a display device according to an embodiment. FIG. 17 is a schematic cross-sectional view taken along line P4-P4' in FIG. 16.

Referring to FIGS. 16 and 17, a display device 10_1 according to an embodiment may include connection pattern layers RP_1 and bridge pattern layers BRP_1 disposed at an outer portion of the display area DPA. The connection pattern layers RP_1 and the bridge pattern layers BRP_1 may have the trace of the separation of the data line DTL, the initialization voltage line VIL, and the first voltage line VL1 that are connected (e.g., electrically connected) at the outer portion of the display area DPA or in the non-display area NDA.

In the embodiment of FIGS. 12 and 13, the connection pattern layers RP may be disposed in the display area DPA, and may remain in a state of being spaced apart from the electrodes RME. The bridge pattern layers BRP may be disposed in the display area DPA, and may function as source/drain electrodes of the transistors. However, the connection pattern layer RP and the bridge pattern layer BRP may not be necessarily disposed in the display area DPA. In the display device 10_1 according to an embodiment, the connection pattern layer RP_1 and the bridge pattern layer BRP_1 may be disposed in the non-display area NDA and may have the trace that the connection pattern layer RP_1 and the bridge pattern layer BRP_1 are connected (e.g., electrically connected) to the first voltage line VL1, the data line DTL, and the initialization voltage line VIL.

The connection pattern layers RP_1 and the bridge pattern layers BRP_1 of the display device 10_1 may be disposed in the non-display area NDA disposed on the upper side, which is a side of the display area DPA in the first direction DR1. The connection pattern layers RP_1 and the electrodes RME of the display area DPA may be disposed on the same layer (e.g., the via layer VIA). For example, the bridge pattern layers BRP_1 may be disposed on the third conductive layer. The connection pattern layers RP_1 and the bridge pattern layers BRP_1 may be disposed in a region of the non-display area NDA that is arranged side by side with the sub-pixels SPXn in the first direction DR1. As illustrated in the drawing, three groups of the connection pattern layers RP_1 and bridge pattern layers BRP_1 may be disposed in the non-display area NDA that is arranged side by side with a region of the display area DPA where three sub-pixels SPXn are disposed in the first direction DR1.

The bridge pattern layer BRP_1 may include a first bridge pattern layer BRP1_1 overlapping the first voltage line VL1, a second bridge pattern layer BRP2_1 overlapping the data line DTL, and a third bridge pattern layer BRP3_1 overlapping the initialization voltage line VIL. The first bridge pattern layer BRP1_1 may be in contact with the first voltage line VL1 through a first bridge contact hole CNTD1. The second bridge pattern layer BRP2_1 may be in contact with the data line DTL through a second bridge contact hole CNTD2, and the third bridge pattern layer BRP3_1 may be in contact with the initialization voltage line VIL through a third bridge contact hole CNTD3. The first to third bridge contact holes CNTD1, CNTD2, and CNTD3 may penetrate the first interlayer insulating layer IL1 and the buffer layer BL.

The connection pattern layer RP_1 may include a first connection pattern layer RP1_1 overlapping the first bridge pattern layer BRP1_1, a second connection pattern layer RP2_1 overlapping the second bridge pattern layer BRP2_1, and a third connection pattern layer RP3_1 overlapping the third bridge pattern layer BRP3_1. The first connection pattern layer RP1_1 may be in contact with the first bridge pattern layer BRP1_1 through the first connection contact hole CTA1. The second connection pattern layer RP2_1 may be in contact with the second bridge pattern layer BRP2_1 through the second connection contact hole CTA2, and the third connection pattern layer RP3_1 may be in contact with the third bridge pattern layer BRP3_1 through the third connection contact hole CTA3. The first to third connection contact holes CTA1, CTA2, and CTA3 may penetrate the via layer VIA and the first passivation layer PV1.

The display device 10_1 may include a second separation portion ROP2 that is a region disposed in the non-display area NDA and in which the connection pattern layers RP_1 are separated. The connection pattern layers RP_1 may be connected to be integral with each other at the second separation portion ROP2 (e.g., a dashed line portion in the second separation portion ROP2 of FIG. 16) and separated from each other at the second separation portion ROP2 after the alignment process of the light emitting element ED. At least the first insulating layer PAS1 may not be disposed at the second separation portion ROP2 that is the trace of the separation of the connection pattern layers RP_1 that have been connected.

As described above, in case that the connection pattern layers RP_1 are formed to be integral with each other, the data line DTL and the initialization voltage line VIL may be connected (e.g., electrically connected) to the first voltage line VL1 in the alignment process of the display device 10_1. Accordingly, the display device 10_1 may prevent misalignment of the light emitting elements ED in the emission area EMA of the display area DPA as in the above-described embodiment.

In the embodiment in which the display device 10_1 includes the connection pattern layers RP_1 and the bridge pattern layers BRP_1 disposed in the non-display area NDA, the connection pattern layer RP similar to those in the above-described embodiments may not be disposed in the display area DPA, e.g., in the area adjacent to the separation portion ROP. However, embodiments are not limited thereto, and the connection pattern layers RP_1 and the bridge pattern layers BRP_1 may be disposed around the separation portion ROP of the display area DPA and in the non-display area NDA.

Regardless of the arrangement of the connection pattern layers RP in the display area DPA, the separation portion (or the first separation portion) that is the trace of the separation of the first electrode RME1 and the third electrode RME3 that have been integrally formed may be disposed in the display area DPA. A process of disconnecting the electrodes RME or the connection pattern layers RP_1 may be simultaneously performed at the separation portion of the display area DPA and the second separation portion ROP2 of the non-display area NDA. As the trace thereof, at least the first insulating layer PAS1 may not be disposed at the separation portion of the display area DPA and the second separation portion ROP2 of the non-display area NDA.

During the manufacturing process of the display device 10_1, in the alignment process of the light emitting element ED, the first voltage line VL1, the initialization voltage line VIL, and the data lines DTL may be connected (e.g., electrically connected) to each other through the connection pattern layers RP_1 and the bridge pattern layers BRP_1. After the alignment process of the light emitting element ED, the first voltage line VL1, the initialization voltage line VIL, and the data line DTL may not be connected (e.g., electrically connected) to each other, and an electrical signal may be applied independently.

Figure 18:
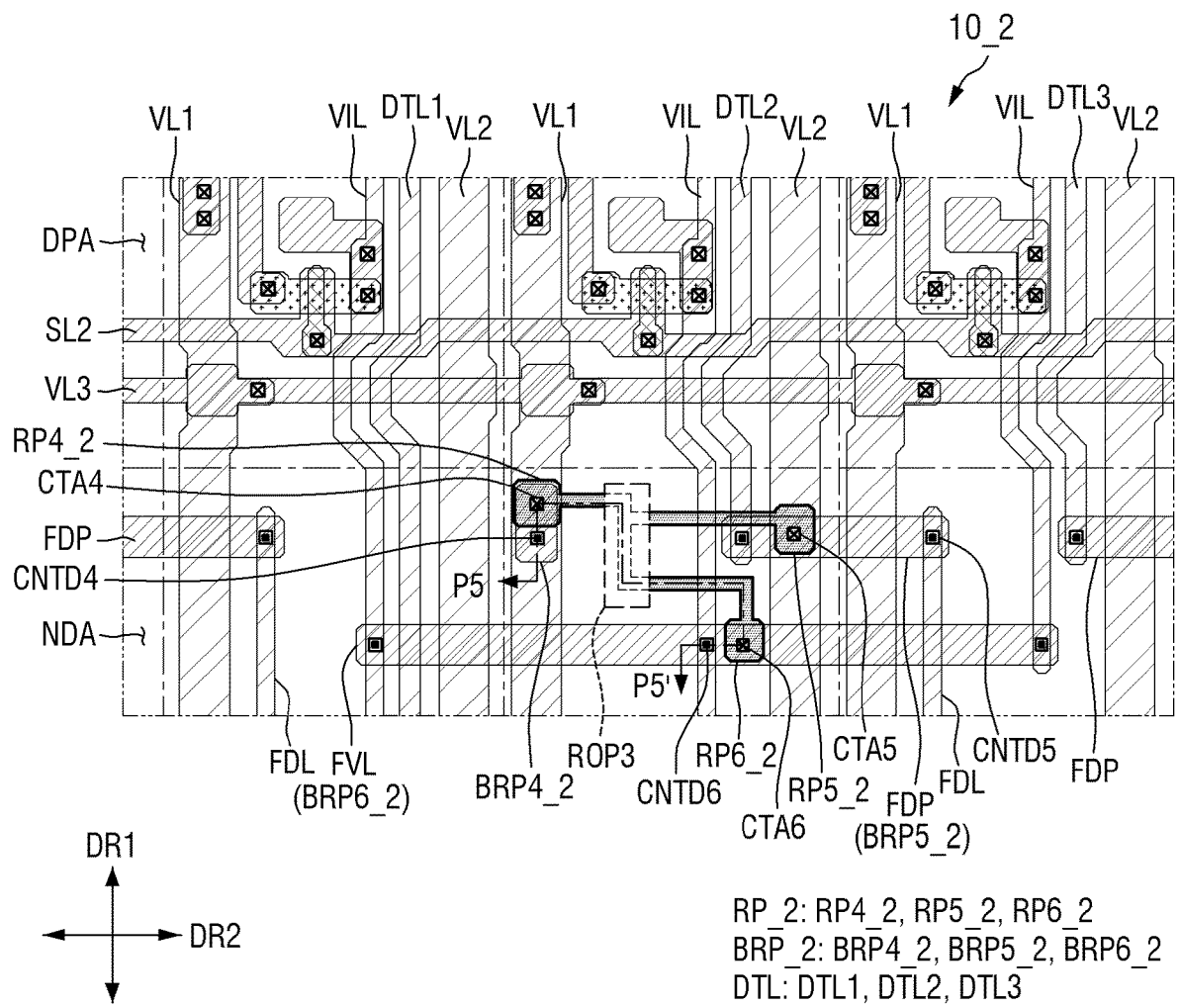
FIG. 18 is a schematic plan view illustrating a pixel adjacent to a non-display area of a display device according to an embodiment, and wires disposed in the non-display area.
Figure 19:
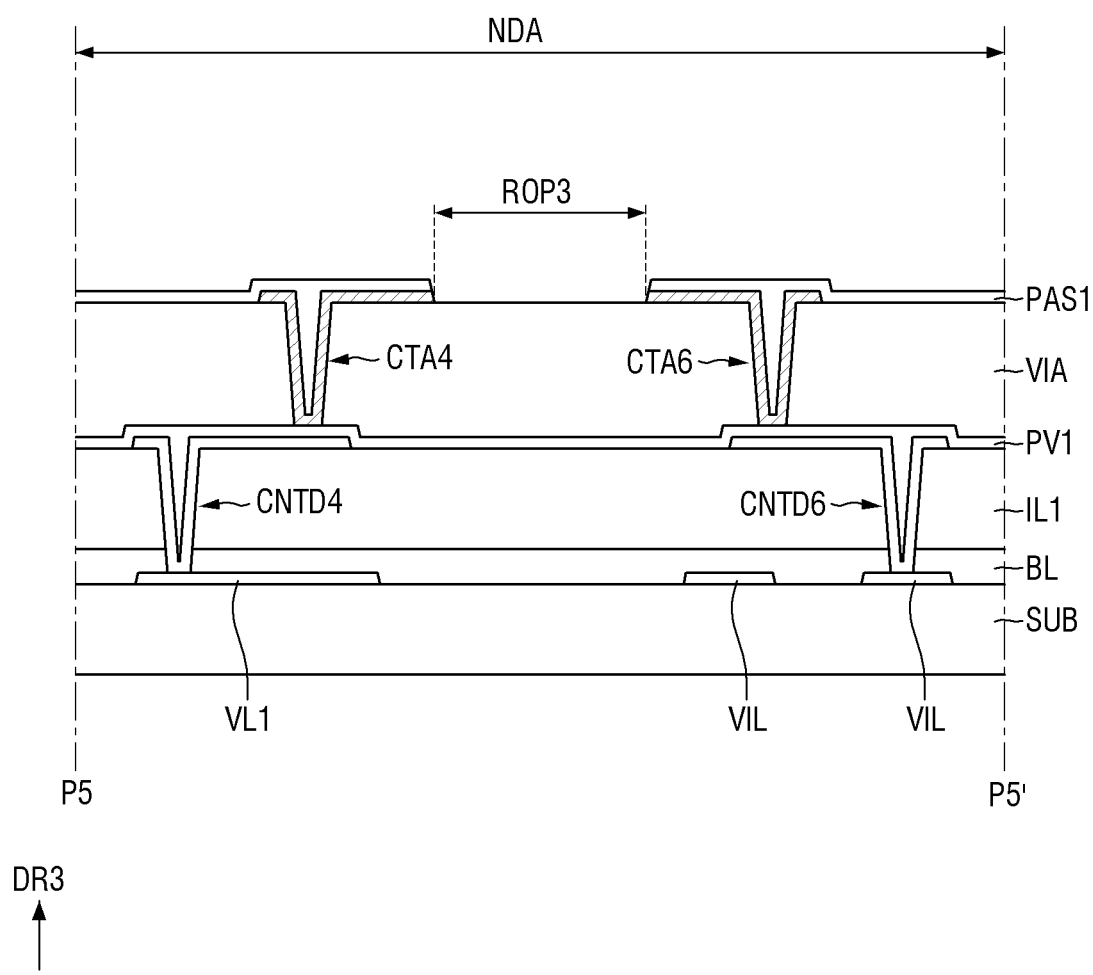
FIG. 19 is a schematic cross-sectional view taken along line P5-P5' of FIG. 18.

FIG. 18 is a schematic plan view illustrating a pixel adjacent to a non-display area of a display device according to an embodiment, and wires disposed in the non-display area. FIG. 19 is a schematic cross-sectional view taken along line P5-P5' of FIG. 18.

Referring to FIGS. 18 and 19, a display device 10_2 according to an embodiment may include connection pattern layers RP_2 and bridge pattern layers BRP_2 disposed at the outer portion of the display area DPA. The connection pattern layers RP_2 and the bridge pattern layers BRP_2 may have the trace of the separation of the data line DTL, the initialization voltage line VIL, and the first voltage line VL1 that have been connected (e.g., electrically connected) at the outer portion of the display area DPA or in the non-display area NDA.

The connection pattern layers RP_2 and the bridge pattern layers BRP_2 of the display device 10_2 may be disposed in the non-display area NDA disposed on the lower side that is another side of the display area DPA in the first direction DR1. The connection pattern layers RP_2 and the electrodes RME of the display area DPA may be disposed on the same layer (e.g., the via layer VIA). For example, the bridge pattern layers BRP_2 may be disposed on the third conductive layer. The embodiment is different from the embodiment of FIGS. 16 and 17 in that the connection pattern layers RP_2 and the bridge pattern layers BRP_2 are disposed in the non-display area NDA disposed on the lower side of the display area DPA. Hereinafter, the redundant description will be omitted and differences will be described for descriptive convenience.

The first voltage line VL1, the second voltage line VL2, the initialization voltage line VIL, and the data lines DTL may extend to the non-display area NDA disposed on the lower side of the display area DPA. In the non-display area NDA disposed on the lower side of the display area DPA, the initialization voltage line VIL and the data lines DTL may be connected (e.g., electrically connected) to other wires.

For example, the data lines DTL may be connected (e.g., electrically connected) to a fan-out data line FDL disposed in the non-display area NDA and extending in the first direction DR1. The fan-out data line FDL may not be arranged side by side with the data lines DTL in the first direction DR1, and may be disposed on the first conductive layer similarly to the data lines DTL. The data line DTL and the fan-out data line FDL may be connected (e.g., electrically connected) to each other with being in contact with a fan-out data pattern layer FDP disposed on the third conductive layer. The fan-out data pattern layer FDP may be in contact with the data line DTL and the fan-out data line FDL through a fifth bridge contact hole CNTD5. Although FIG. 18 illustrates that only the second data line DTL2 and the third data line DTL3 are connected (e.g., electrically connected) to the fan-out data line FDL, the first data line DTL1 may also be connected (e.g., electrically connected) to the fan-out data pattern layer FDP at another position.

The initialization voltage lines VIL may be connected (e.g., electrically connected) to a fan-out initialization line FVL disposed in the non-display area NDA and extending in the second direction DR2. The fan-out initialization line FVL may be disposed on the third conductive layer and may be simultaneously connected to the initialization voltage lines VIL disposed in the sub-pixels SPXn. The initialization voltage line VIL and the fan-out initialization line FVL may be in contact with each other through a sixth bridge contact hole CNTD6.

The display device 10_2 may include a fourth bridge pattern layer BRP4_2 disposed in the non-display area NDA disposed on the lower side of the display area DPA. The fourth bridge pattern layer BRP4_2 may overlap the first voltage line VL1, and may be connected (e.g., electrically connected) to the first voltage line VL1. The fourth bridge pattern layer BRP4_2 may be disposed on the third conductive layer, and may be in contact with the first voltage line VL1 through a fourth bridge contact hole CNTD4. The fan-out data pattern layer FDP and the fan-out initialization line FVL may be connected to the connection pattern layer RP_2. For example, the fan-out data pattern layer FDP may form a fifth bridge pattern layer BRP5_2, and the fan-out initialization line FVL may form a sixth bridge pattern layer BRP6_2. The fifth bridge pattern layer BRP5_2 or the fan-out data pattern layer FDP may be in contact with the data lines DTL through the fifth bridge contact hole CNTD5, and the sixth bridge pattern layer BRP6_2 or the fan-out initialization line FVL may be in contact with the initialization voltage line VIL through the sixth bridge contact hole CNTD6. The fourth to sixth bridge contact holes CNTD4, CNTD5, and CNTD6 may penetrate the first interlayer insulating layer IL1 and the buffer layer BL.

The connection pattern layer RP_2 may include a fourth connection pattern layer RP4_2 overlapping the fourth bridge pattern layer BRP4_2, a fifth connection pattern layer RP5_2 overlapping the fifth bridge pattern layer BRP5_2, and a sixth connection pattern layer RP6_2 overlapping the sixth bridge pattern layer BRP6_2. The fourth connection pattern layer RP4_2 may be in contact with the fourth bridge pattern layer BRP4_2 through a fourth connection contact hole CTA4. The fifth connection pattern layer RP5_2 may be in contact with the fifth bridge pattern layer BRP5_2 through a fifth connection contact hole CTA5, and the sixth connection pattern layer RP6_2 may be in contact with the sixth bridge pattern layer BRP6_2 through a sixth connection contact hole CTA6. The fourth to sixth connection contact holes CTA4, CTA5, and CTA6 may penetrate the via layer VIA and the first passivation layer PV1.

The display device 10_2 may include a third separation portion ROP3 that is a region disposed in the non-display area NDA and in which the connection pattern layers RP_2 are separated. The connection pattern layers RP_2 may be connected to be integral with each other at the third separation portion ROP3 (e.g., a dashed line portion in the third separation portion ROP3 of FIG. 18), and may be separated from each other at the third separation portion ROP3 after the alignment process of the light emitting element ED. At least the first insulating layer PAS1 may not be disposed at the third separation portion ROP3 as the trace of the separation of the connection pattern layers RP_2 that have been connected.

As described above, in case that the connection pattern layers RP_2 are formed to be integral with each other, the data line DTL and the initialization voltage line VIL may be connected (e.g., electrically connected) to the first voltage line VL1 in the alignment process of the display device 10_2. Accordingly, the display device 10_1 may prevent misalignment of the light emitting elements ED in the emission area EMA of the display area DPA as in the above-described embodiment.

Unlike the display device 10_1 of FIG. 16, in the display device 10_2 of an embodiment, the connection pattern layers RP_2 and the bridge pattern layers BRP_2 may be disposed in a region of the non-display area NDA that is arranged side by side with the pixel PX in the first direction DR1. As illustrated in the drawing, a group including the connection pattern layers RP_2 and bridge pattern layers BRP_2 may be disposed in the non-display area NDA arranged side by side in the first direction DR1 with the region of the display area DPA where the pixel PX and three sub-pixels SPXn are disposed.

In the embodiment in which the display device 10_2 includes the connection pattern layers RP_2 and the bridge pattern layers BRP_2 disposed in the non-display area NDA, the connection pattern layer RP similar to those in the above-described embodiments may not be disposed in the display area DPA, e.g., in the area adjacent to the separation portion ROP. However, embodiments are not limited thereto, and the connection pattern layers RP_2 and the bridge pattern layers BRP_2 may be disposed around the separation portion ROP of the display area DPA and in the non-display area NDA. Further, as in the embodiment of FIG. 16, the connection pattern layers RP_1 and the bridge pattern layers BRP_1 may be disposed in the non-display area NDA disposed on the upper side of the display area DPA.

During the manufacturing process of the display device 10_2, in the alignment process of the light emitting element ED, the first voltage line VL1, the initialization voltage line VIL, and the data lines DTL may be connected (e.g., electrically connected) to each other through the connection pattern layer RP_2 and the bridge pattern layers BRP_2. After the alignment process of the light emitting element ED, the first voltage line VL1, the initialization voltage line VIL, and the data line DTL may not be connected (e.g., electrically connected) to each other, and an electrical signal may be applied independently.

In the display device 10 according to an embodiment, the arrangement structure of the wires and the pixels PX in the display area DPA may be different from those in the above-described embodiment. In the display device 10, in case that the pixels PX have different structures, the misalignment of the light emitting element ED may be prevented due to the same wire design structure as that in the above-described embodiment. Hereinafter, the display device 10 having a different pixel structure will be described with reference to other drawings.

Figure 20:
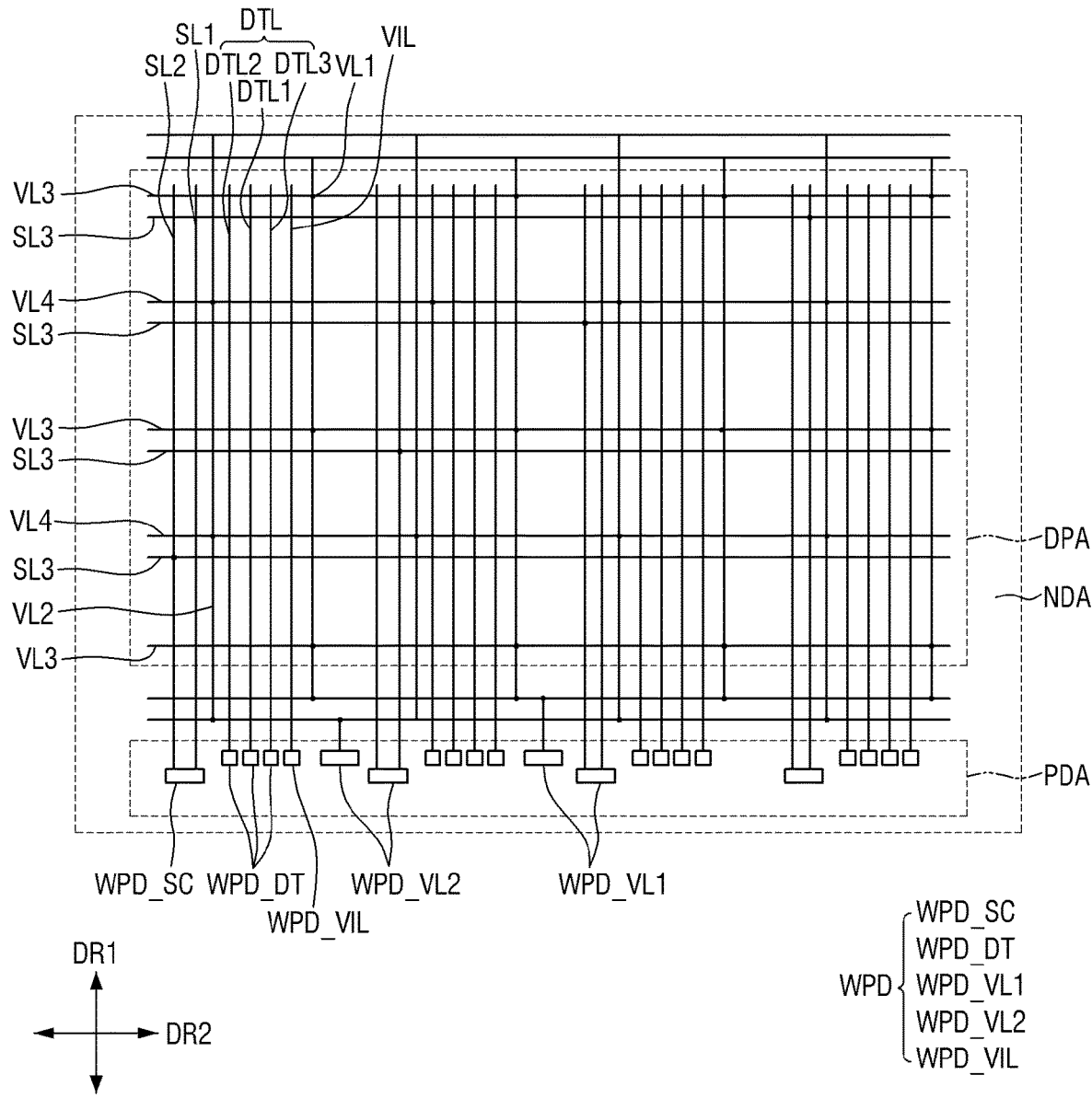
FIG. 20 is a schematic plan view illustrating schematic arrangement of wires of a display device according to an embodiment.

FIG. 20 is a schematic plan view illustrating schematic arrangement of wires of a display device according to an embodiment.

Referring to FIG. 20, the display device 10 may include wires. The display device 10 may include scan lines SL (e.g., SL1, SL2, and SL3), data lines DTL (e.g., DTL1, DTL2, and DTL3), an initialization voltage line VIL, and voltage lines VL (e.g., VL1, VL2, VL3, and VL4). For example, other wires may be further provided in the display device 10. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the first direction DR1. The first scan line SL1 and the second scan line SL2 may be adjacent to each other, and may be spaced apart from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may extend from the pad area PDA disposed in the non-display area NDA to the display area DPA.

The third scan line SL3 may extend in the second direction DR2, and may be spaced apart from another third scan line SL3 in the first direction DR1. A single third scan line SL3 may be connected to one or more first scan lines SL1 or one or more second scan lines SL2. The scan lines SL may have a mesh structure in the entire surface of the display area DPA, but embodiments are not limited thereto.

The data lines DTL may extend in the first direction DR1. The data line DTL may include a first data line DTL1, a second data line DTL2, and a third data line DTL3, and each one of the first to third data lines DTL1, DTL2, and DTL3 may form a pair and is adjacent to each other. Each of the data lines DTL1, DTL2, and DTL3 may extend from the pad area PDA disposed in the non-display area NDA to the display area DPA. However, embodiments are not limited thereto, and the data lines DTL may be spaced apart from each other at equal intervals between a first voltage line VL1 and a second voltage line VL2.

The initialization voltage line VIL may extend in the first direction DR1. The initialization voltage line VIL may be disposed between the data lines DTL and the first voltage line VL1. The initialization voltage line VIL may extend from the pad area PDA disposed in the non-display area NDA to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DPA. For example, some wires of the third voltage line VL3 and the fourth voltage line VL4 may be disposed in the display area DPA and the other wires of the third voltage line VL3 and the fourth voltage line VL4 may be disposed in the non-display area NDA disposed on sides (e.g., opposite sides) of the display area DPA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the voltage lines VL may have a mesh structure in the entire display area DPA. However, embodiments are not limited thereto.

The first scan line SL1, the second scan line SL2, the data line DTL, the initialization voltage line VIL, the first voltage line VL1, and the second voltage line VL2 may be connected (e.g., electrically connected) to at least one line pad WPD. Each wiring pad WPD may be disposed in the non-display area NDA. In an embodiment, each of the line pads WPD may be disposed in the pad area PDA disposed on the lower side, which is another side of the display area DPA in the first direction DR1. The first scan line SL1 and the second scan line SL2 may be connected to the scan line pad WPD_SC disposed in the pad area PDA, and the data lines DTL may be connected to the data line pads WPD_DT different from each other, respectively. The initialization voltage line VIL may be connected to an initialization line pad WPD_VIL, the first voltage line VL1 may be connected to a first voltage line pad WPD_VL1, and the second voltage line VL2 may be connected to a second voltage line pad WPD_VL2. The external devices may be mounted on the line pads WPD. The external devices may be mounted on the line pads WPD by applying an anisotropic conductive film, ultrasonic bonding or the like. The drawing illustrates that each of the line pads WPD is disposed on the pad area PDA disposed on the lower side of the display area DPA, but embodiments are not limited thereto. Some of the line pads WPD may be disposed in any one area on the upper side or on the left and right sides of the display area DPA.

Figure 21:
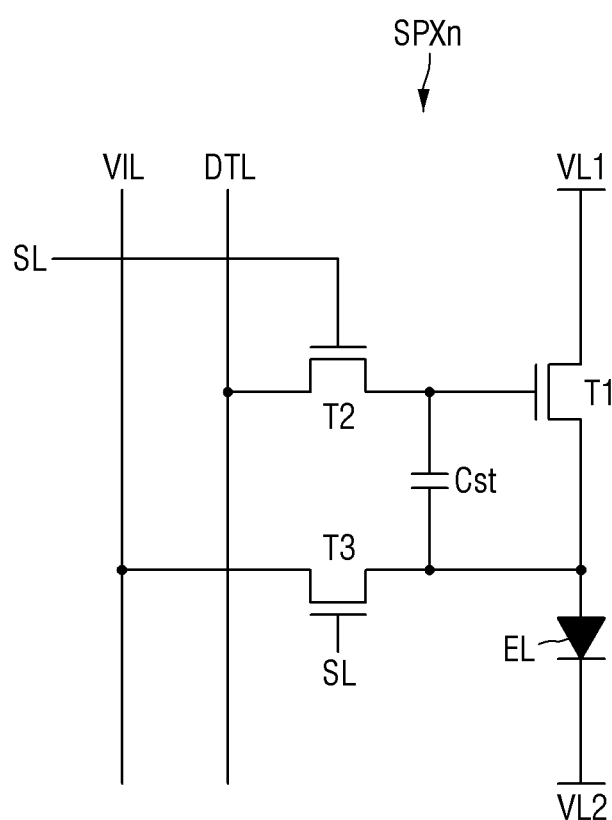
FIG. 21 is a schematic diagram of an equivalent circuit of a sub-pixel disposed in a display device according to an embodiment.

FIG. 21 is a schematic diagram of an equivalent circuit of a sub-pixel disposed in a display device according to an embodiment.

Referring to FIG. 21, each sub-pixel SPXn of the display device 10 according to an embodiment may include three transistors T1, T2 and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between the first and second electrodes. The light emitting element may emit light of a specific wavelength band by electrical signals transmitted from the first electrode and the second electrode.

An end portion of the light emitting diode EL may be connected to the source electrode of the first transistor T1, and another end portion of the light emitting diode EL may be connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 may be turned on by a scan signal of the scan line SL to connect the data line DTL to the gate electrode of the first transistor T1. The gate electrode of the second transistor T2 may be connected to the scan line SL, the source electrode of the second transistor T2 may be connected to the gate electrode of the first transistor T1, and the drain electrode of the second transistor T2 may be connected to the data line DTL.

The third transistor T3 may be turned on by a scan signal of the scan line SL to connect the initialization voltage line VIL to an end portion of the light emitting diode EL. The gate electrode of the third transistor T3 may be connected to the scan line SL, the drain electrode of the third transistor T3 may be connected to the initialization voltage line VIL, and the source electrode of the third transistor T3 may be connected to an end portion of the light emitting diode EL or to the source electrode of the first transistor T1.

The gate electrodes of the second transistor T2 and the third transistor T3 may be connected to the same scan line SL. The second transistor T2 and the third transistor T3 may be simultaneously turned on by a scan signal applied from the same scan line.

In an embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but embodiments are not limited thereto. For example, each of the transistors T1, T2, and T3 may be formed of a P-type MOSFET. In another example, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst may store a difference voltage between a gate voltage and a source voltage of the first transistor T1.

Figure 22:
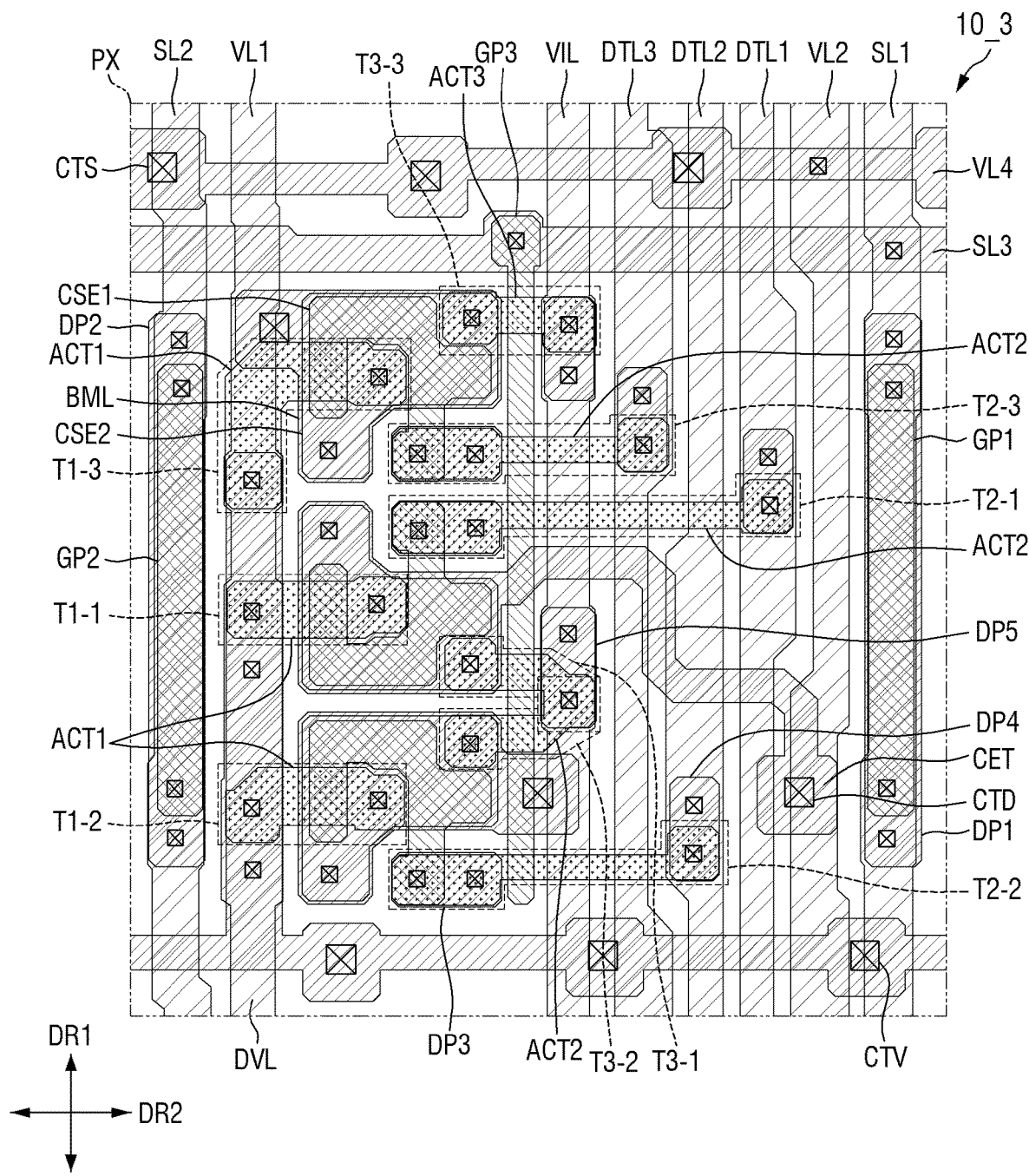
FIG. 22 is a schematic layout view illustrating wires disposed in a pixel of a display device according to an embodiment.

FIG. 22 is a schematic layout view illustrating wires disposed in a pixel of a display device according to an embodiment.

Referring to FIG. 22, the display device 10 may include a first substrate SUB and a semiconductor layer, conductive layers, and insulating layers disposed on the first substrate SUB. The semiconductor layer, the conductive layers, and the insulating layers may each constitute a circuit layer and a display element layer of the display device 10.

A first conductive layer may be disposed on the first substrate SUB. The first conductive layer may include the first scan line SL1 and the second scan line SL2 extending in the first direction DR1, the data lines DTL (e.g., DTL1, DTL2, and DTL3), the first voltage line VL1, the second voltage line VL2, the initialization voltage line VIL, and lower metal layers BML.

The scan lines SL1 and SL2 may extend in the first direction DR1. The first scan line SL1 and the second scan line SL2 may be disposed in the pixel PX, and each of the scan lines SL1 and SL2 may be disposed over the pixels PX arranged in the first direction DR1. The first scan line SL1 and the second scan line SL2 may be spaced apart from each other in the second direction DR2. The first scan line SL1 may be disposed on the right side of the pixel PX, and the second scan line SL2 may be disposed on the left side of the pixel PX. Any one scan line of the first scan line SL1 and the second scan line SL2 may be connected to the pixel PX, and the scan line connected to the pixel PX may be connected to each of the first to third sub-pixels SPX1, SPX2, and SPX3. The scan lines SL1 and SL2 may be connected to the second transistor T2 and the third transistor T3 through a conductive pattern layer disposed on a different conductive layer, and a scan signal may be applied to the second transistor T2 and the third transistor T3.

Among the first and second scan lines SL1 and SL2, the scan lines SL1 and SL2 disposed on the left side may be connected to the sub-pixels SPXn of a corresponding pixel PX, and the scan lines SL1 and SL2 disposed on the right side may be connected to another pixel PX adjacent to the right side of the corresponding pixel PX.

The data lines DTL1, DTL2, and DTL3 may extend in the first direction DR1. The first data line DTL1, the second data line DTL2, and the third data line DTL3 may be disposed in the pixel PX, and each of the data lines DTL1, DTL2, and DTL3 may be disposed over the pixels PX arranged in the first direction DR1. The first data line DTL1, the second data line DTL2, and the third data line DTL3 may be spaced apart from each other in the second direction DR2, and may be adjacent to each other. The third data line DTL3, the second data line DTL2, and the first data line DTL1 may be sequentially arranged along the second direction DR2, and may each be connected to the first sub-pixel SPX1, the second sub-pixel SPX2, and the third sub-pixel SPX3. Each of the data lines DTL1, DTL2, and DTL3 may be connected to the second transistor T2 through a conductive pattern layer disposed on a different conductive layer to apply a data signal to the second transistor T2.

The initialization voltage line VIL may extend in the first direction DR1 and may be disposed across the pixels PX arranged in the first direction DR1. The initialization voltage line VIL may the left side of the third data line DTL3 in a plan view and between the third data line DTL3 and the lower metal layers BML, but embodiments are not limited thereto. The initialization voltage line VIL may be connected to a conductive pattern layer disposed on a different conductive layer to be connected to the pixel PX. The initialization voltage line VIL may be connected (e.g., electrically connected) to the drain electrode of the third transistor T3, and may apply the initialization voltage to the third transistor T3.

The first voltage line VL1 and the second voltage line VL2 may extend in the first direction DR1, and each of them may be disposed across the pixels PX arranged in the first direction DR1. The first voltage line VL1 may be disposed between the lower metal layers BML and the second scan line SL2, and the second voltage line VL2 may be disposed between the second data line DTL2 and the first scan line SL1. Each of the first voltage line VL1 and the second voltage line VL2 may be connected to the sub-pixels SPXn included in the pixel PX. The first voltage line VL1 may be connected (e.g., electrically connected) to the first electrode RME1 of each sub-pixel SPXn through the first transistor T1, and the second voltage line VL2 may be connected (e.g., electrically connected) to the second electrode RME2 through the fourth voltage line VL4 disposed in a different conductive layer. The first voltage line VL1 and the second voltage line VL2 may transmit the power voltage applied from the voltage line pads WPD_VL1 and WPD_VL2 to the electrodes RME1 and RME2 disposed in each sub-pixel SPXn, respectively. The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2.

The lower metal layers BML may be disposed between the first voltage line VL1 and the initialization voltage line VIL. The lower metal layers BML may overlap the first active layer ACT1 of the semiconductor layer and the first electrode pattern layer CSE1 of the second conductive layer, which will be described below. The lower metal layers BML may be spaced apart from each other in the first direction DR1 at the central portion of each pixel PX in a plan view.

The lower metal layers BML may include a material of blocking light to prevent light from reaching the first active layer ACT1 of the first transistor T1. For example, the lower metal layer BML may be formed of an opaque metal material that blocks transmission of light. However, embodiments are not limited thereto, and in some cases, the lower metal layer BML may be omitted, and may overlap the active layers of the other transistors T1, T2, and T3.

The semiconductor layer may include active layers ACT1, ACT2, and ACT3 of the transistors T1, T2, and T3. The first active layers ACT1 of the first transistors T1_1, T1_2, and T1_3 connected to each of the sub-pixels SPX1, SPX2, and SPX3 of the pixel PX may be disposed on the left side from the center area of each pixel PX. The first active layers ACT1 may be spaced apart from each other in the first direction DR1, and may overlap (or partially overlap) the lower metal layer BML, the first electrode pattern layer CSE1 of the second conductive layer, and a first voltage branch portion DVL and the second electrode pattern layer CSE2 of the third conductive layer. For example, each of the first active layers ACT1 may include a first region overlapping the first voltage branch portion DVL, a second region overlapping the first electrode pattern layer CSE1, and a first region, which is a region other than the first region and the second region, overlapping the second electrode pattern layer CSE2.

The second active layers ACT2 of second transistors T2_1, T2_2, and T2_3 connected to each of the sub-pixels SPX1, SPX2, and SPX3 may be adjacent to the center area of each pixel PX. The second active layers ACT2 may be spaced apart from each other in the first direction DR1, and may overlap (e.g., partially overlap) the third gate pattern layer GP3 of the second conductive layer, and the third conductive pattern layer DP3 and the fourth conductive pattern layer DP4 of the third conductive layer. For example, the second active layer ACT2 may include a first region overlapping the third conductive pattern layer DP3, a second region overlapping the third gate pattern layer GP3, and a third region, which is a region other than the first region and the second region, overlapping the fourth conductive pattern layer DP4. The first region of the second active layer ACT2 may be in contact with the third conductive pattern layer DP3, and the third region of the second active layer ACT2 may be in contact with the fourth conductive pattern layer DP4.

The second active layers ACT2 of the second transistors T2 may have lengths different from each other according to the disposition of the data lines DTL1, DTL2, and DTL3. For example, the first regions of the second active layers ACT2 may be arranged side by side in the first direction DR1, and the third data line DTL3, the second data line DTL2, and the first data line DTL1 may be sequentially disposed in the second direction DR2 from the first regions of the second active layers ACT2. The second active layer ACT2 of the second transistor T2_1 connected to the first sub-pixel SPX1 may have the longest length in the second direction DR2 as the first data line DTL1 may be spaced apart most, and the second active layer ACT2 of the third transistor T2_3 connected to the third sub-pixel SPX3 may have the shortest length in the second direction DR2 as the third data line DTL3 is most adjacently disposed. However, the relationship between the lengths of the second active layers ACT2 may vary according to the disposition of the sub-pixels SPXn and the disposition of the data lines DTL.

The third active layers ACT3 of the third transistors T3_1, T3_2, and T3_3 connected to each of the sub-pixels SPX1, SPX2, and SPX3 may also be disposed at the center area of the pixel PX. The third active layers ACT3 may be spaced apart in the first direction DR1, and may be disposed side by side with the second active layers ACT2 in the first direction DR1. The third active layers ACT3 may overlap (e.g., partially overlap) the third gate pattern layer GP3 of the second conductive layer, and a fifth conductive pattern layer DP5 and the second electrode pattern layers CSE2 of the third conductive layer. For example, the third active layer ACT3 may include a first area overlapping the fifth conductive pattern layer DP5, a second area overlapping the third gate pattern layer GP3, and a third area, which is a portion other than the first area and the second area, overlapping the second electrode pattern layer CSE2. The first area of the third active layer ACT3 may be in contact with the fifth conductive pattern layer DP5, and the third area may be in contact with the second electrode pattern layer CSE2.

The third active layer ACT3 of the third transistors T3_1 and T3_2 connected to the first sub-pixel SPX1 and the second sub-pixel SPX2 is such that the first areas, which overlap the fifth conductive pattern layer DP5, may be integral with each other. Since the third transistors T3 of each of the sub-pixels SPXn may be turned on at the same time, the third active layers ACT3 of different transistors (e.g., the third transistors T3_1 and T3_2) may be partially integral with each other.

The second conductive layer may include gate pattern layers GP1, GP2, and GP3, and the first electrode pattern layer CSE1.

The first gate pattern layer GP1 and the second gate pattern layer GP2 may have a shape extending in the first direction DR1 and may be disposed on the right side of each pixel PX. The first gate pattern layer GP1 and the second gate pattern layer GP2 may overlap the first scan line SL1 and the second scan line SL2, respectively. The first gate pattern layer GP1 may be connected (e.g., directly connected) to the first scan line SL1 through the contact hole penetrating the buffer layer BL and the first gate insulating layer G1, and the second gate pattern layer GP2 may be connected (e.g., directly connected) to the second scan line SL2 through the contact hole penetrating the buffer layer BL and the first gate insulating layer G1. Each of the first gate pattern layer GP1 and the second gate pattern layer GP2 may prevent the intensity of the scan signal, which is applied from the pad area PDA through the first scan line SL1 and the second scan line SL2, from being lowered according to the position of the display area DPA. In case that the scan lines SL1 and SL2 are cut off in the middle with extending in the first direction DR1, the scan signal may flow through the first and second gate pattern layers GP1 and GP2.

The third gate pattern layer GP3 may have a shape extending in the first direction DR1 and may be disposed at the center area of each pixel PX. The third gate pattern layer GP3 may extend from the upper side of the pixel PX in the first direction DR1 to overlap the second active layers ACT2 and third active layers ACT3. For example, the third gate pattern layer GP3 may overlap the second area of the second active layers ACT2 and the second area of the third active layers ACT3. The third gate pattern layer GP3 may function as a second gate electrode G2 of the second transistor T2 and a third gate electrode G3 of the third transistor T3. As will be described below, the third gate pattern layer GP3 may be connected (e.g., electrically connected) to the first scan line SL1 or the second scan line SL2 through the third scan line SL3, and the scan signal may be transferred to the second transistor T2 and the third transistor T3 through the third gate pattern layer GP3.

The first electrode pattern layers CSE1 may be spaced apart from each other in the first direction DR1 to be disposed between the third gate pattern layer GP3 and the first voltage line VL1. Each of the first electrode pattern layers CSE1 may overlap (e.g., partially overlap) the lower metal layer BML, the first active layer ACT1, and the second electrode pattern layer CSE2 of the third conductive layer. For example, each of the first electrode pattern layers CSE1 may overlap (e.g., partially overlap) the second area of the first active layer ACT1 and function as the first gate electrode G1 of the first transistor T1. The first electrode pattern layer CSE1 may be connected to the third conductive pattern layer DP3 as will be described below, and may transmit the data signal applied through the second transistor T2 to the first gate electrode G1 of the first transistor T1. Further, the first electrode pattern layer CSE1 may overlap the second electrode pattern layer CSE2 to form the storage capacitor Cst.

The third conductive layer may include a third scan line SL3, the third voltage line VL3, the fourth voltage line VL4, and conductive pattern layers DP1, DP2, DP3, DP4, and DP5.

The third scan line SL3 may extend in the second direction DR2 and may be disposed over the pixels PX arranged in the second direction DR2. The third scan line SL3 may be disposed on the upper side of each pixel PX in a plan view and may be disposed across each sub-pixel SPXn. The third scan line SL3 may be connected to the first scan line SL1 or the second scan line SL2 of the first conductive layer. The third scan line SL3 may be connected to the first scan line SL1 or the second scan line SL2 through the contact hole penetrating the buffer layer BL and the first interlayer insulating layer IL1.

In case that the third scan line SL3 is connected to the first scan line SL1 disposed in the pixel PX, the corresponding third scan line SL3 may not be connected to the other second scan lines SL2 disposed in the same row as the corresponding pixel PX. The corresponding third scan line SL3 and another third scan line SL3 spaced apart in the first direction DR1 may be connected to the other scan lines SL1 and SL2 except for the first scan line SL1 disposed in the pixel PX.

The third scan line SL3 may be connected to the third gate pattern layer GP3 of the second conductive layer and may be connected to the second transistor T2 and the third transistor T3. The third scan line SL3 may be connected to the third gate pattern layer GP3 through a contact hole penetrating the first interlayer insulating layer IL1. A third scan line SL3 may be connected to each of the third gate pattern layers GP3 disposed on the pixels PX in the same row. The third scan line SL3 may transmit a scan signal to the gate electrode of the second transistor T2 and the third transistor T3 through the first scan line SL1 or the second scan line SL2 and the third gate pattern layer GP3.

The third voltage line VL3 and the fourth voltage line VL4 may extend in the second direction DR2 and may be disposed over the pixels PX arranged in the second direction DR2. The third voltage line VL3 may be disposed on the lower side of each pixel PX in a plan view and may be disposed across the non-emission area of each sub-pixel SPXn. The fourth voltage line VL4 may the upper side of the third scan line SL3, which is on the upper side of each pixel PX in a plan view. The third voltage line VL3 may be connected (e.g., electrically connected) to the first voltage line VL1, and the fourth voltage line VL4 may be connected (e.g., electrically connected) to the second voltage line VL2. The third voltage line VL3 and the fourth voltage line VL4 may be alternately and repeatedly arranged with being spaced apart from each other in the first direction DR1.

The voltage lines VL1, VL2, VL3, and VL4 may extend in the first direction DR1 and the second direction DR2 to be disposed in a mesh structure in the entire surface of the display area DPA. The first voltage line VL1 and the second voltage line VL2 may be formed of a first conductive layer and extend in the first direction DR1 to be disposed for each pixel PX, and the third voltage line VL3 and the fourth voltage line VL4 may be formed of the third conductive layer and extend in the second direction DR2 to be disposed in the pixels PXs in rows different from each other, and thus the wires may be disposed in a mesh shape in the entire surface of the display area DPA.

Pixel rows may be distinguished from each other according to the relative arrangement of the third voltage line VL3 and the fourth voltage line VL4. For example, as shown in the drawings, in case that the third voltage line VL3 is disposed on the lower side and the fourth voltage line VL4 is disposed on the upper side in the pixels PX of a certain pixel row, the third voltage line VL3 may be disposed on the upper side and the fourth voltage line VL4 may be disposed on the lower side in pixel rows adjacent in the first direction DR1 to the above pixel row. For example, the third voltage line VL3 and the fourth voltage line VL4 may be disposed between different pixel rows adjacent in the first direction DR1, and the pixels PX of the pixel row adjacent in the first direction DR1 may share the third voltage line VL3 or the fourth voltage line VL4.

In the pixel row in which the third voltage line VL3 is disposed on the lower side, the third voltage line VL3 may include the first voltage branch portion DVL extending in the first direction DR1. The third voltage line VL3 may be connected to the first voltage line VL1 through the first voltage branch portion DVL. In the pixel row in which the first voltage line VL1 is disposed on the upper side, the first voltage branch portion DVL may be disposed in a conductive pattern layer separated from the third voltage line VL3.

The second electrode pattern layers CSE2 may be spaced apart from each other in the first direction DR1 to overlap the first electrode pattern layers CSE1 and the lower metal layers BML. The second electrode pattern layer CSE2 may be spaced apart from the first electrode pattern layer CSE1 with the first interlayer insulating layer IL1 interposed therebetween, and the storage capacitor Cst may be formed between the first and second electrode pattern layers CSE1 and CSE2.

The second electrode pattern layer CSE2 may overlap (e.g., partially overlap) the first active layer ACT1 and the third active layer ACT3. Each second electrode pattern layer CSE2 may be connected to the first active layer ACT1 through the contact hole penetrating the first interlayer insulating layer IL1 at the portion overlapping the first active layer ACT1, and may function as the first source electrode S1 of the transistor T1. The second electrode pattern layer CSE2 may also be connected to the lower metal layer BML through the contact hole penetrating the buffer layer BL and the first interlayer insulating layer IL1. The second electrode pattern layer CSE2 may be connected to the third active layer ACT3 through the contact hole penetrating the first interlayer insulating layer IL1 at the portion overlapping the third active layer ACT3, and may function as the third source electrode S3 of the third transistor T3.

Each second electrode pattern layer CSE2 may be connected to the first electrode RME1 disposed on the via layer VIA. The second electrode pattern layers CSE2 included in the storage capacitor Cst connected to some sub-pixels SPXn may be disposed so as not to overlap the region occupied by the corresponding sub-pixels SPXn in the third direction DR3 (e.g., the thickness direction). The third conductive layer may include electrode connection portions CET connected to any one of the second electrode pattern layers CSE2. The first electrode RME1 disposed in any first sub-pixel SPX1 may be connected (e.g., directly connected) to at least one of the electrode connection portions CET. For example, the second electrode pattern layer CSE2 included in the storage capacitor Cst connected to the second sub-pixel SPX2 and the third sub-pixel SPX3 may overlap the region occupied by the corresponding sub-pixel SPXn in the third direction DR3, and the first electrode RME1 disposed in the second sub-pixel SPX2 and the third sub-pixel SPX3 may be connected (e.g., directly connected) to the second electrode pattern layer CSE2 of the corresponding sub-pixel SPXn.

The first conductive pattern layer DP1 and the second conductive pattern layer DP2 may have a shape extending in the first direction DR1 and may be disposed on sides (e.g., opposite sides) of each pixel PX. The first conductive pattern layer DP1 may overlap the first scan line SL1 and the first gate pattern layer GP1, and the second conductive pattern layer DP2 may overlap the second scan line SL2 and the second gate pattern layer GP2. The first conductive pattern layer DP1 may be connected (e.g., directly connected) to the first scan line SL1 through the contact hole penetrating the buffer layer BL and the first interlayer insulating layer IL1, and the second conductive pattern layer DP2 may be connected (e.g., directly connected) to the second scan line SL2 through the contact hole penetrating the buffer layer BL and the first interlayer insulating layer IL1.

The first voltage branch portion DVL may have a shape extending in the first direction DR1 and may be disposed between the second electrode pattern layers CSE2 and the second scan line SL2. The first voltage branch portion DVL may overlap (e.g., partially overlap) the first voltage line VL1 and the first active layer ACT1, and may be connected thereto. The first voltage branch portion DVL may be in contact with the first voltage line VL1 through the contact hole penetrating the buffer layer BL and the first interlayer insulating layer IL1, and may be in contact with the first active layer ACT1 through the contact hole penetrating the first interlayer insulating layer IL1. The first voltage branch portion DVL may function as the first drain electrode D1 of the first transistor T1. As described above, the first voltage branch portion DVL may be connected to the third voltage line VL3, or may be spaced apart from the third voltage line VL3.

The third conductive pattern layers DP3 may overlap the second active layer ACT2 and the first electrode pattern layer CSE1, and the fourth conductive pattern layers DP4 may overlap the second active layer ACT2 and any one of the data lines DTL. The third conductive pattern layers DP3 may be in contact with the first electrode pattern layer CSE1 through the contact hole penetrating the first gate insulating layer G1 and the first interlayer insulating layer IL1, and may be in contact with the second active layer ACT2 through the contact hole penetrating the first interlayer insulating layer IL1. The third conductive pattern layer DP3 may function as a second source electrode S2 of the second transistor T2. The fourth conductive pattern layers DP4 may be in contact with the data line DTL through the contact hole penetrating the buffer layer BL and the first interlayer insulating layer IL1, and may be in contact with the second active layer ACT2 through the contact hole penetrating the first interlayer insulating layer IL1. The fourth conductive pattern layer DP4 may function as the second drain electrode D2 of the second transistor T2.

The fifth conductive pattern layers DP5 may overlap the initialization voltage line VIL and the third active layer ACT3. The fifth conductive pattern layers DP5 may be in contact with the initialization voltage line VIL through the contact hole penetrating the buffer layer BL and the first interlayer insulating layer IL1, and may be in contact with the third active layer ACT3 through the contact hole penetrating the first interlayer insulating layer IL1. The fifth conductive pattern layer DP5 may function as a third drain electrode D3 of the third transistor T3.

The first passivation layer (shown in FIG. 24) and the via layer (shown in FIG. 24) may be disposed on the third conductive layer. The electrodes (shown in FIG. 23), the light emitting elements (shown in FIG. 23), and the connection electrodes (shown in FIG. 23) may be disposed on the via layer VIA.

Figure 23:
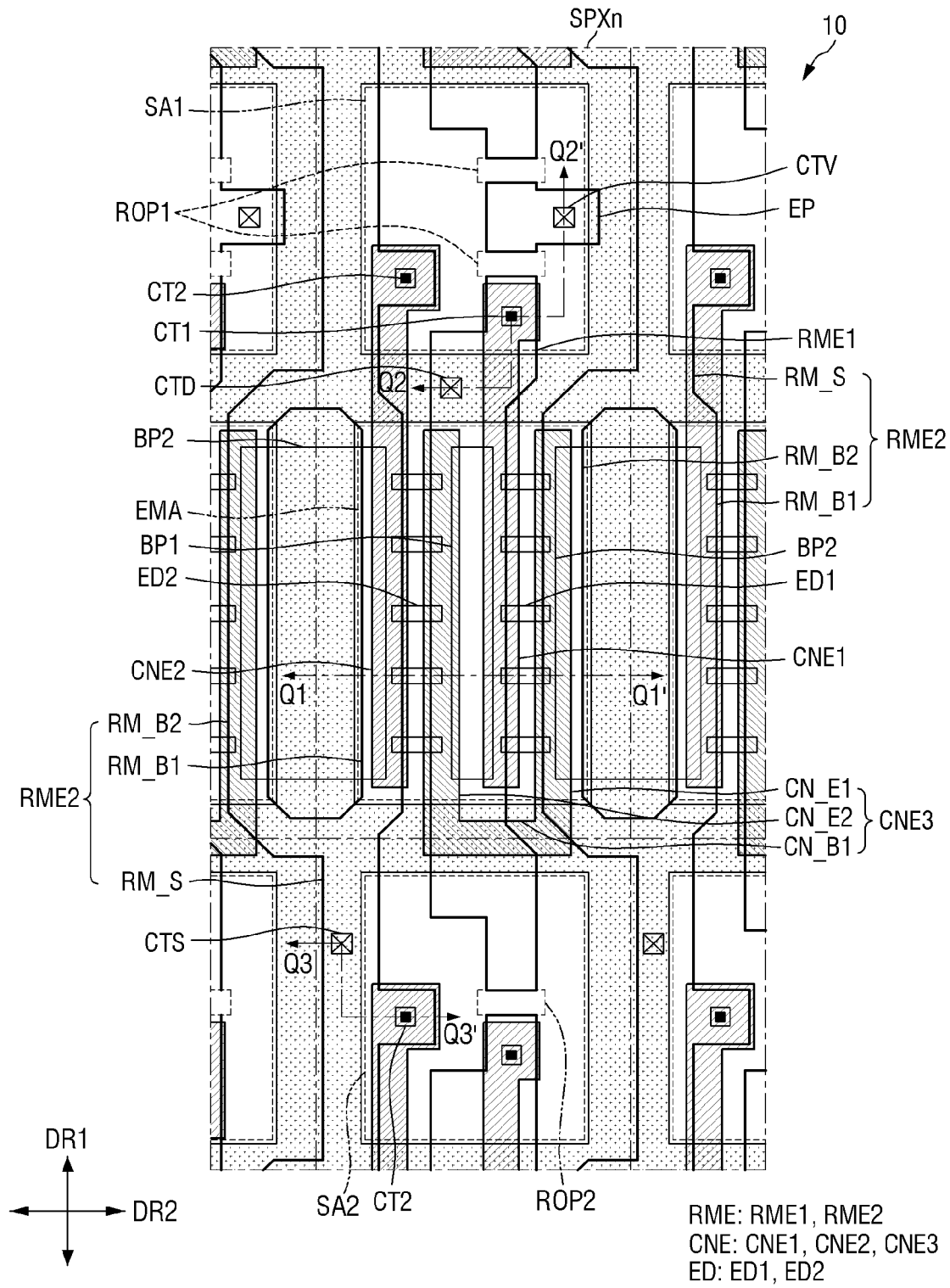
FIG. 23 is a schematic plan view illustrating arrangement of electrodes and a light emitting element disposed in a sub-pixel of a display device according to an embodiment.
Figure 24:
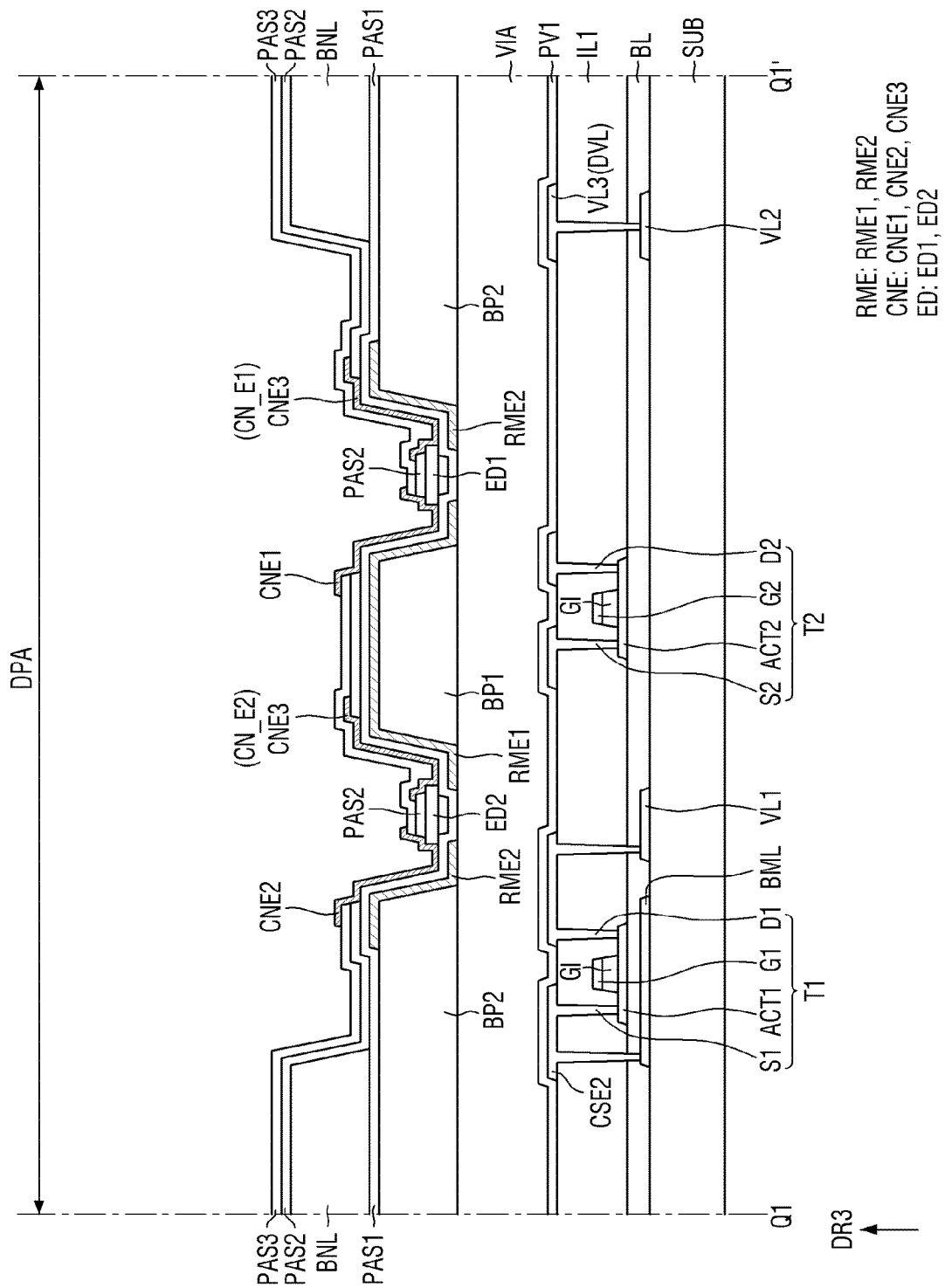
FIG. 24 is a schematic cross-sectional view taken along line Q1-Q1' of FIG. 23.
Figure 25:
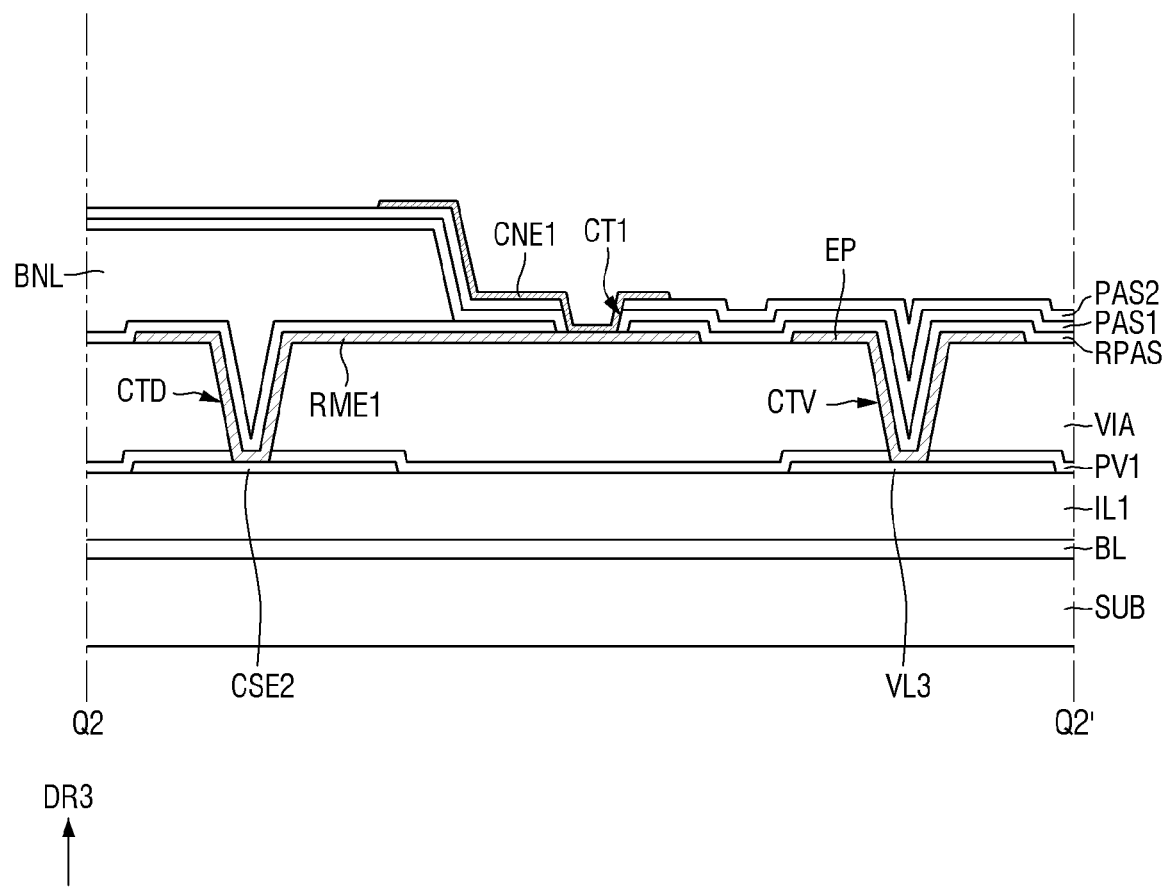
FIG. 25 is a schematic cross-sectional view taken along line Q2-Q2' of FIG. 23.
Figure 26:
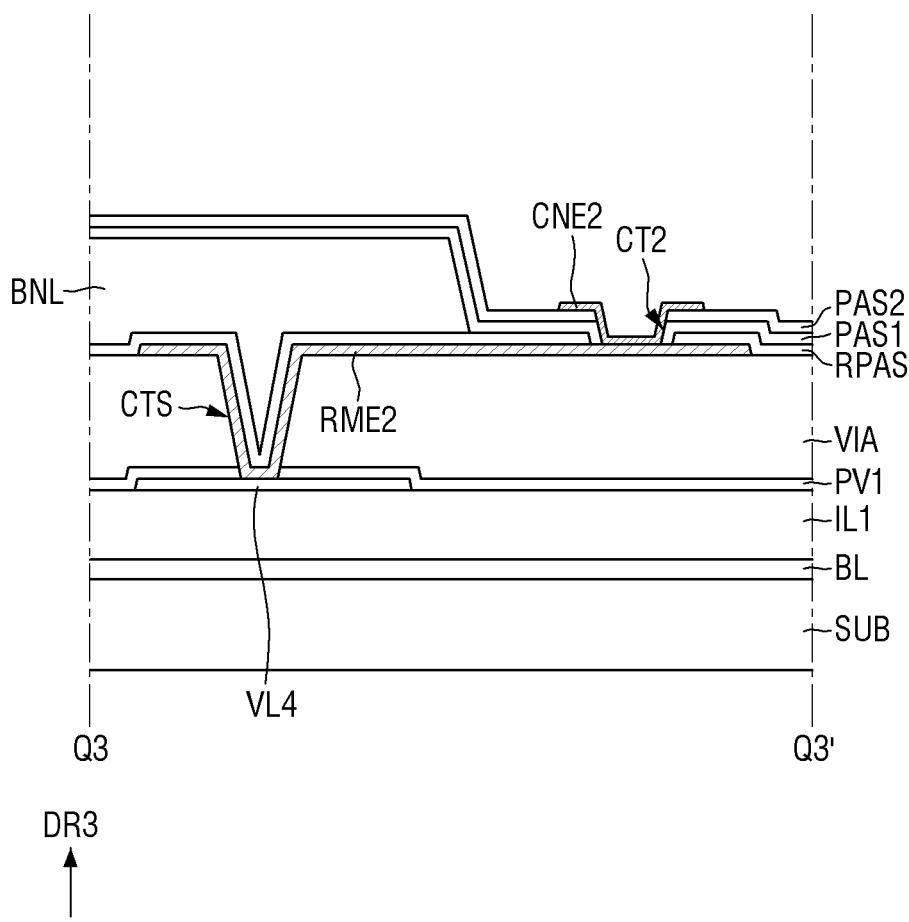
FIG. 26 is a schematic cross-sectional view taken along line Q3-Q3' of FIG. 23.

FIG. 23 is a schematic plan view illustrating arrangement of electrodes and a light emitting element disposed in a sub-pixel of a display device according to an embodiment. FIG. 24 is a schematic cross-sectional view taken along line Q1-Q1' of FIG. 23. FIG. 25 is a schematic cross-sectional view taken along line Q2-Q2' of FIG. 23. FIG. 26 is a schematic cross-sectional view taken along line Q3-Q3' of FIG. 23.

FIG. 23 shows planar arrangement of the electrodes RME (e.g., RME1 and RME2), the barrier walls BP1 and BP2, the bank layer BNL, the light emitting elements ED1 and ED2, and the connection electrode CNE (e.g., CNE1, CNE2, and CNE3) disposed in a sub-pixel SPXn of the display device 10. FIG. 24 illustrates a cross section across end portions (e.g., opposite end portions) of the light emitting elements ED1 and ED2 disposed on different electrodes RME1 and RME2. FIGS. 25 and 26 illustrate cross sections across the electrode contact holes CTD, CTS, and CTV, and the contact portions CT1 and CT2.

Referring to FIGS. 23 to 26, in the display device 10 according to an embodiment, the structures of the electrode RME, the connection electrode CNE, and the barrier walls BP1 and BP2 may be different from those in the above-described embodiments. Hereinafter, the redundant description of the above-described embodiments will be omitted with focusing on differences for descriptive convenience.

The barrier walls BP1 and BP2 may have a shape extending in the first direction DR1, and may have different widths in the second direction DR2. Any one of the barrier walls BP1 and BP2 may be disposed across the sub-pixels SPXn adjacent in the second direction DR2. For example, the barrier walls BP1 and BP2 may include the first barrier wall BP1 disposed in the emission area EMA of each sub-pixel SPXn and the second barrier wall BP2 disposed across the emission areas EMA of different sub-pixels SPXn.

The first barrier wall BP1 may be disposed in the center area of the emission areas EMA, and the second barrier walls BP2 may be spaced apart from the first barrier wall BP1 interposed therebetween. The first barrier wall BP1 and the second barrier wall BP2 may be alternately disposed along the second direction DR2. The light emitting elements ED may be arranged between the first barrier wall BP1 and the second barrier wall BP2 spaced apart from each other.

The first barrier wall BP1 and the second barrier wall BP2 may have the same length in the first direction DR1, but may have different widths in the second direction DR2. In the bank layer BNL, a portion extending in the first direction DR1 may overlap the second barrier wall BP2 in the thickness direction. The first barrier wall BP1 may overlap the first electrode RME1, and the second barrier wall BP2 may overlap electrode branch portions RM_B1 and RM_B2 of the second electrode RME2 and the bank layer BNL.

The first barrier wall BP1 and the second barrier wall BP2 may have the same length in the first direction DR1, but may have different widths in the second direction DR2. In the bank layer BNL, a portion extending in the first direction DR1 may overlap the second barrier wall BP2 in the thickness direction. The barrier walls BP1 and BP2 may be disposed in an island-like pattern layer on the entire surface of the display area DPA.

The electrodes RME may include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center area of the sub-pixel SPXn, and the portion of the first electrode RME1 disposed in the emission area EMA may be disposed on the first barrier wall BP1. The first electrode RME1 may extend from the sub-region SA in the first direction DR1 to the sub-region SA of another sub-pixel SPXn. The first electrode RME1 may have a shape in which the width in the second direction DR2 changes according to positions, and at least a portion of the first electrode RME1 overlapping the first barrier wall BP1 in the emission area EMA may have a width greater than that of the first barrier wall BP1.

The second electrode RME2 may include a portion extending in the first direction DR1 and portions branched near the emission area EMA. In an embodiment, the second electrode RME2 may include an electrode stem portion RM_S extending in the first direction DR1, the electrode branch portions RM_B1 and RM_B2 branched from the electrode stem portion RM_S to be bent in the second direction DR2 and then to extend in the first direction DR1. The electrode stem portion RM_S may overlap the portion of the bank layer BNL extending in the first direction DR1, and may be disposed at a side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2, and may be bent toward sides (e.g., opposite sides) in the second direction DR2. The electrode branch portions RM_B1 and RM_B2 may be disposed across the emission area EMA in the first direction DR1, and may be bent to be integrally connected to the electrode stem portion RM_S. For example, the electrode branch portions RM_B1 and RM_B2 of the second electrode RME2 may be branched on the upper side of the emission area EMA of any one sub-pixel SPXn, and may be connected to each other on the lower side thereof, e.g., in a plan view.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in a second electrode RME2 may be disposed in the emission areas EMA of the sub-pixels SPXn adjacent in the second direction DR2, and the electrode branch portions RM_B1 and RM_B2 of different second electrodes RME2 may be disposed in a sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap a side of the second barrier wall BP2. The first electrode branch portion RM_B1 may overlap (e.g., partially overlap) the second barrier wall BP2 disposed on the left side of the first barrier wall BP1, and the second electrode branch portion RM_B2 may overlap (e.g., partially overlap) the second barrier wall BP2 disposed on the right side of the first barrier wall BP1. Sides (e.g., opposite sides) of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different barrier walls BP1 and BP2.

The width of the first electrode RME1 in the second direction DR2 may be greater than the widths of the electrode stem portion RM_S and the electrode branch portions RM_B1 and RM_B2 of the second electrode RME2. The first electrode RME1 may have a width greater than that of the first barrier wall BP1 and overlap sides (e.g., opposite sides) of the first barrier wall BP1, but the second electrode RME2 may have a small width so that the electrode branch portions RM_B1 and RM_B2 may overlap only one side of the second barrier wall BP2.

The first electrode RME1 may be in contact with the first conductive pattern layer DP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, but the second electrode RME2 may not be separated in the sub-region SA. A second electrode RME2 may include electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with an embodiment, the display device 10 may include a wire connection electrode EP disposed between the first electrodes RME1 of different sub-pixels SPXn in the first sub-region SA1 among the sub-regions SA1 and SA2 of each sub-pixel SPXn. The wire connection electrode EP may not be disposed in the second sub-region SA2 of the sub-pixel SPXn, and the first electrodes RME1 of different sub-pixels SPXn adjacent in the first direction DR1 may be spaced apart from each other. In the sub-pixel SPXn illustrated in FIG. 23 among the sub-pixels SPXn, the first sub-region SA1 in which the wire connection electrode EP is disposed may be disposed on the upper side of the emission area EMA, and the second sub-region SA2 may be disposed on the lower side of the emission area EMA. For example, in the sub-pixel SPXn adjacent to the sub-pixel SPXn of FIG. 23 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced apart from the wire connection electrode EP with the first separation portion ROP1 interposed therebetween in the first sub-region SA1. Two first separation portions ROP1 may be disposed in the first sub-region SA1. The wire connection electrode EP may be spaced apart from the first electrode RME1 disposed in the corresponding sub-pixel SPXn with a lower first separation portion ROP1 interposed therebetween, and may be spaced apart from the first electrode RME1 disposed in another sub-pixel SPXn with an upper first separation portion ROP1 interposed therebetween. The second separation portion ROP2 may be disposed in the second sub-region SA2, and different first electrodes RME1 may be spaced apart from each other in the first direction DR1.

In an embodiment, the wire connection electrode EP may be connected to the first voltage line VL1 of the third conductive layer through the third electrode contact hole CTV penetrating the via layer VIA. The first electrode RME1 may be connected to the wire connection electrode EP, and the electrical signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

For example, a relative arrangement of the second electrode contact hole CTS may be different from that of the third electrode contact hole CTV. The second electrode contact hole CTS may be disposed at the portion of the bank layer BNL surrounding the second sub-region SA2, and the third electrode contact hole CTV may be disposed in the first sub-region SA1. Since the second electrode contact hole CTS and the third electrode contact hole CTV expose the top surfaces (e.g., the upper surface) of different voltage lines VL1 and VL2, respectively, the positions of the electrode contact holes may be determined to correspond to the voltage lines VL1 and VL2.

The bank layer BNL may surround the emission area EMA and the sub-regions SA1 and SA2 similarly to the above-described embodiment. However, in the embodiment in which the display device 10 includes the sub-regions SA1 and SA2 distinguished from each other, the areas surrounded by the bank layer BNL may be distinguished from each other. The bank layer BNL is substantially the same as that in the above-described embodiment except that it surrounds different sub-regions SA1 and SA2.

The light emitting elements ED may be disposed on different electrodes RME between different barrier walls BP1 and BP2. The light emitting element ED may include the first light emitting element ED1 having end portions (e.g., opposite end portions) disposed on the first electrode RME1 and the second electrode branch portion RM_B2 of the second electrode RME2, and the second light emitting element ED2 having end portions (e.g., opposite end portions) disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (e.g., CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first barrier wall BP1 may overlap the first electrode RME1, and may extend in the first direction DR1 to be disposed in the first sub-region SA1 disposed on the upper side of the emission area EMA over the bank layer BNL. The first connection electrode CNE1 may be in contact with the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second barrier wall BP2 may overlap the second electrode RME2, and may extend in the first direction DR1 to be disposed in the first sub-region SA1 disposed on the upper side of the emission area EMA over the bank layer BNL. The second connection electrode CNE2 may be in contact with the second electrode RME2 through the second contact portion CT2 in the first sub-region SA1.

In the sub-pixel SPXn adjacent to the sub-pixel SPXn of FIG. 23 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 with facing the first connection electrode CNE1 in the emission area EMA, and the second extension portion CN_E2 may be disposed on the first electrode RME1 with facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be directly connected to the electrode RME. The second electrode branch portion RM_B2 disposed under the first extension portion CN_E1 may be connected (e.g., electrically connected) to the second voltage line VL2, and the second power voltage applied to the second electrode branch portion RM_B2 may not be transmitted to the third connection electrode CNE3.

As illustrated in FIG. 20, in the pixel PX of the display device 10, the wires, e.g., the data lines DTL1, DTL2, and DTL3 and the initialization voltage line VIL, may be disposed at the portion overlapping the region where the light emitting elements ED are disposed. The wires may generate a parasitic electric field that causes misalignment of the light emitting elements ED in the manufacturing process of the display device 10. To this end, the display device 10 may include the connection pattern layers as the trace of electrical connection between the first voltage line VL1 and the second voltage line VL2 and the data lines DTL and the initialization voltage line VIL. Similarly to the embodiment of FIGS. 16 and 18, the display device 10 may have a structure in which the connection pattern layers are disposed in the non-display area NDA adjacent to the outermost pixels of the display area DPA.

Figure 27:
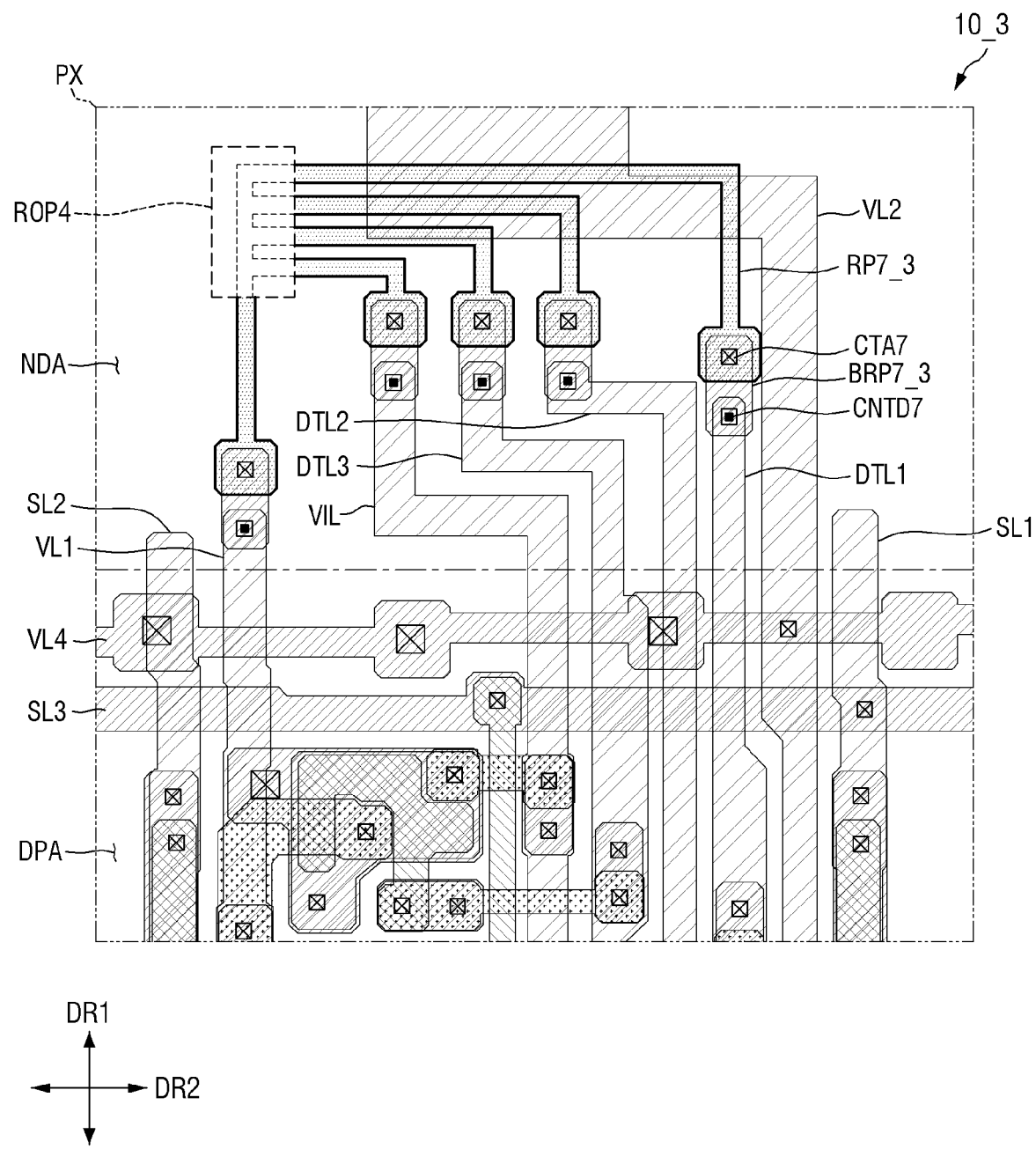
FIG. 27 is a schematic plan view illustrating a pixel adjacent to a non-display area of the display device of FIG. 21, and wires disposed in the non-display area.

FIG. 27 is a schematic plan view illustrating a pixel adjacent to a non-display area of the display device of FIG. 21, and wires disposed in the non-display area.

Referring to FIG. 27, a display device 10_3 according to an embodiment may include connection pattern layers RP_3 and bridge pattern layers BRP_3 disposed at the outer portion of the display area DPA. The connection pattern layers RP_3 and the bridge pattern layers BRP_3 may have the trace that of the connection pattern layers RP_3 and the bridge pattern layers BRP_3 are connected (e.g., electrically connected) to the data lines DTL1, DTL2 and DTL3, the initialization voltage line VIL, and the first voltage line VL1 and then separated from each other at the outer portion of the display area DPA or in the non-display area NDA.

The connection pattern layers RP_3 and the bridge pattern layers BRP_3 of the display device 10_3 may be disposed in the non-display area NDA disposed on the upper side that is a side of the display area DPA in the first direction DR1. The connection pattern layers RP_3 and the electrodes RME of the display area DPA may be disposed on the same layer. For example, the bridge pattern layers BRP_3 may be disposed on the third conductive layer. The connection pattern layers RP_3 and the bridge pattern layers BRP_3 may be disposed in a region of the non-display area NDA that is arranged side by side with the pixel PX in the first direction DR1.

The bridge pattern layer BRP_3 may include seventh bridge pattern layers BRP7_3. Each of the seventh bridge pattern layers BRP7_3 may overlap the first voltage line VL1, the initialization voltage line VIL, and the first to third data lines DTL1, DTL2, and DTL3. Each of the seventh bridge pattern layers BRP7_3 may be in contact with the first voltage line VL1, the initialization voltage line VIL, and the first to third data lines DTL1, DTL2, and DTL3 through a seventh bridge contact hole CNTD7. Each of the seventh bridge contact holes CNTD7 may penetrate the first interlayer insulating layer IL1 and the buffer layer BL.

The connection pattern layer RP_3 may include seventh connection pattern layers RP7_3 disposed to respectively overlap the seventh bridge pattern layers BRP7_3. Each of the seventh connection pattern layers RP7_3 may be in contact with each of the seventh bridge pattern layers BRP7_3 through a seventh connection contact hole CTA7. One seventh connection pattern layer RP7_3 and one seventh bridge pattern layer BRP7_3 may form a pair and be connected (e.g., electrically connected) to the first voltage line VL1, the initialization voltage line VIL, and any one of the first to third data lines DTL1, DTL2, and DTL3. Five seventh connection pattern layers RP7_3 and five seventh bridge pattern layers BRP7_3 may be disposed in the non-display area NDA to correspond to a pixel column of the display area DPA.

The display device 10_3 may include a fourth separation portion ROP4 that is a region disposed in the non-display area NDA and in which the connection pattern layers RP_3 are separated. The connection pattern layers RP_3 may be connected to be integral with each other at the fourth separation portion ROP4 (e.g., a dashed line portion in the fourth separation portion ROP4 of FIG. 27), and separated from each other at the fourth separation portion ROP4 after the alignment process of the light emitting element ED. During the manufacturing process of the display device 10_3, in the alignment process of the light emitting element ED, the first voltage line VL1, the initialization voltage line VIL, and the data lines DTL1, DTL2, and DTL3 may be connected (e.g., electrically connected) to each other through the connection pattern layers RP_3 and the bridge pattern layers BRP_3. After the alignment process of the light emitting element ED, the first voltage line VL1, the initialization voltage line VIL, and the data lines DTL1, DTL2, and DTL3 may not be connected (e.g., electrically connected) to each other, and an electrical signal may be applied independently.

Figure 28:
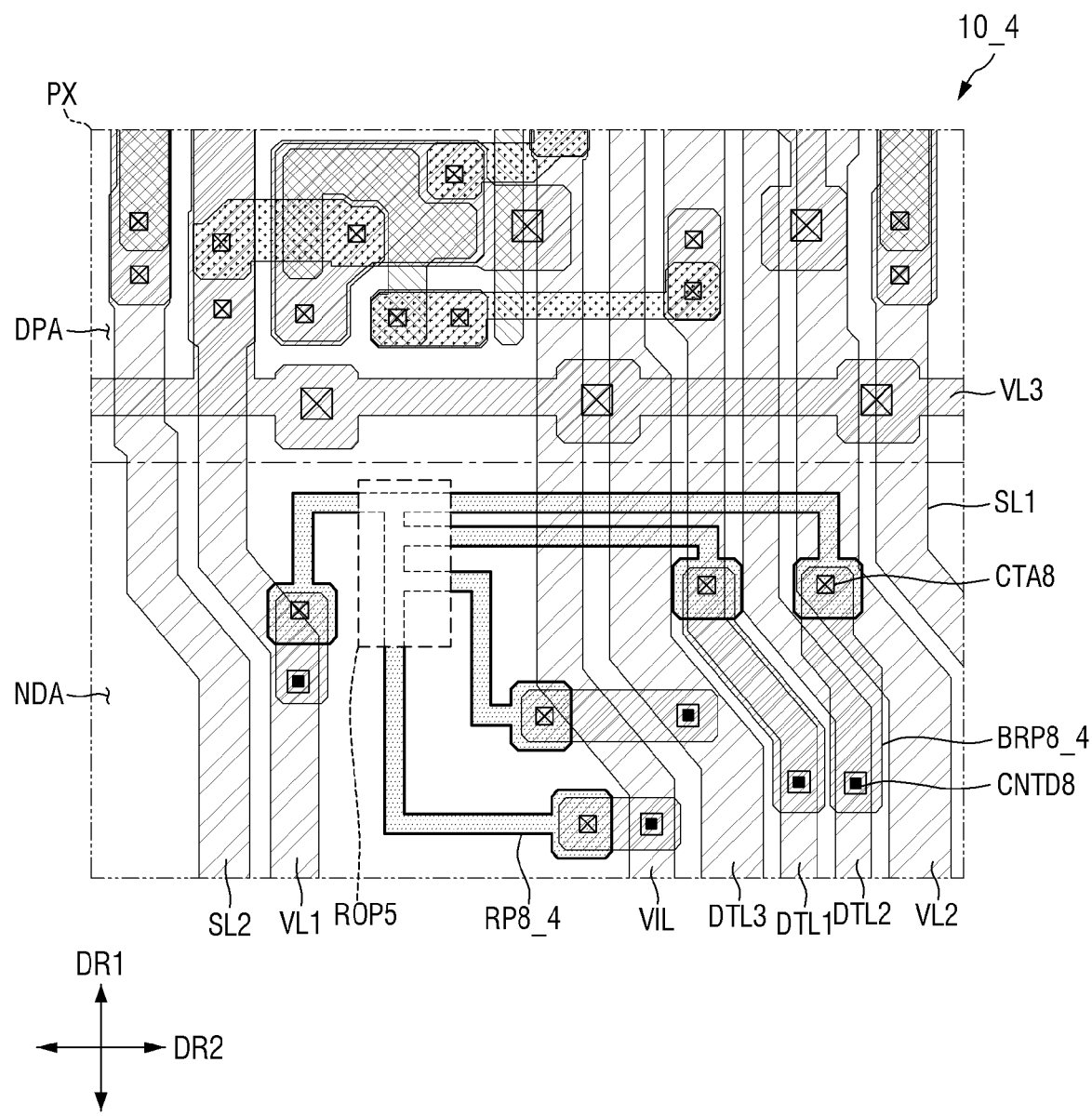
FIG. 28 is a schematic plan view illustrating a pixel adjacent to a non-display area of the display device of FIG. 21, and wires disposed in the non-display area.

FIG. 28 is a schematic plan view illustrating a pixel adjacent to a non-display area of the display device of FIG. 21, and wires disposed in the non-display area.

Referring to FIG. 28, a display device 10_4 according to an embodiment may include connection pattern layers RP_4 and bridge pattern layers BRP_4 disposed at the outer portion of the display area DPA. The connection pattern layers RP_4 and the bridge pattern layers BRP_4 may have the trace that the connection pattern layers RP_4 and the bridge pattern layers BRP_4 are connected (e.g., electrically connected) to the data lines DTL1, DTL2 and DTL3, the initialization voltage line VIL, and the first voltage line VL1 and then separated from each other at the outer portion of the display area DPA or in the non-display area NDA.

The connection pattern layers RP_4 and the bridge pattern layers BRP_4 of the display device 10_4 may be disposed in the non-display area NDA disposed on the lower side that is another side of the display area DPA in the first direction DR1. The connection pattern layers RP_4 and the electrodes RME of the display area DPA may be disposed on the same layer, and the bridge pattern layers BRP_4 may be disposed on the third conductive layer. The connection pattern layers RP_4 and the bridge pattern layers BRP_4 may be disposed in a region of the non-display area NDA that is arranged side by side with the pixel PX in the first direction DR1.

The bridge pattern layer BRP_4 may include eighth bridge pattern layers BRP8_4. Each of the eighth bridge pattern layers BRP8_4 may overlap the first voltage line VL1, the initialization voltage line VIL, and the first to third data lines DTL1, DTL2, and DTL3. The eighth bridge pattern layers BRP8_3 may be in contact with the first voltage line VL1, the initialization voltage line VIL, and the first to third data lines DTL1, DTL2, and DTL3 through eighth bridge contact holes CNTD8. Each of the eighth bridge contact holes CNTD8 may penetrate the first interlayer insulating layer IL1 and the buffer layer BL.

The connection pattern layer RP_4 may include eighth connection pattern layers RP8_4 disposed to respectively overlap the eighth bridge pattern layers BRP8_4. Each of the eighth connection pattern layers RP7_4 may be in contact with each of the eighth bridge pattern layers BRP8_4 through an eighth connection contact hole CTA8. An eighth connection pattern layer RP8_4 and an eighth bridge pattern layer BRP8_4 may form a pair and be connected (e.g., electrically connected) to the first voltage line VL1, the initialization voltage line VIL, and any one of the first to third data lines DTL1, DTL2, and DTL3. Five eighth connection pattern layers RP8_4 and five eighth bridge pattern layers BRP8_4 may be disposed in the non-display area NDA to correspond to a pixel column of the display area DPA.

The display device 10_4 may include a fifth separation portion ROP5 that is a region disposed in the non-display area NDA and in which the connection pattern layers RP_4 are separated. The connection pattern layers RP_4 may be connected to be integral with each other at the fifth separation portion ROP5 (e.g., a dashed line portion in the fifth separation portion ROP5 of FIG. 28), and separated from each other at the fifth separation portion ROP5 after the alignment process of the light emitting element ED. During the manufacturing process of the display device 10_4, in the alignment process of the light emitting element ED, the first voltage line VL1, the initialization voltage line VIL, and the data lines DTL1, DTL2, and DTL3 may be connected (e.g., electrically connected) to each other through the connection pattern layers RP_4 and the bridge pattern layers BRP_4. After the alignment process of the light emitting element ED, the first voltage line VL1, the initialization voltage line VIL, and the data lines DTL1, DTL2, and DTL3 may not be connected (e.g., electrically connected) to each other, and an electrical signal may be applied independently.

Figure 29:
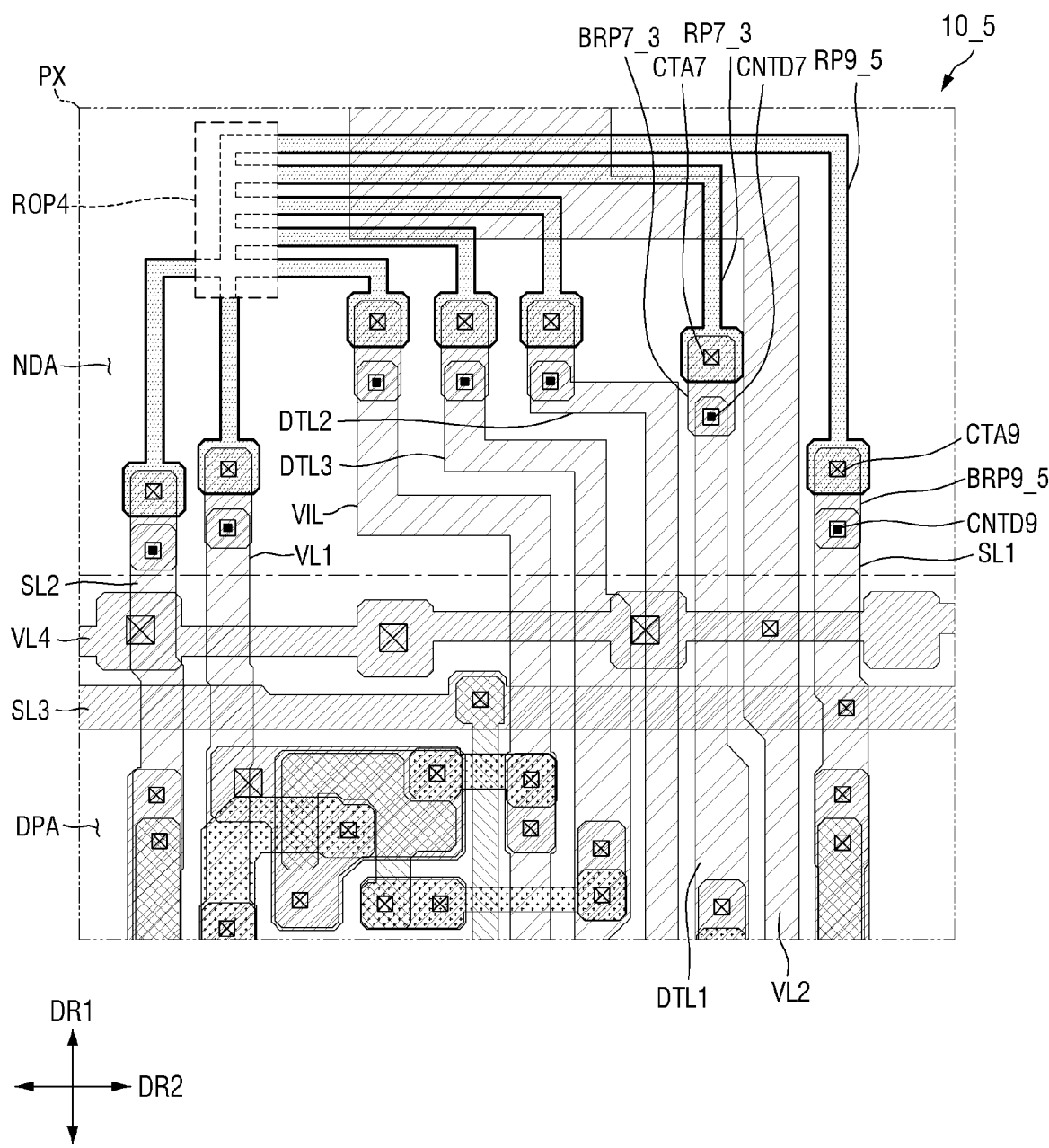
FIG. 29 is a schematic plan view illustrating a pixel adjacent to a non-display area of a display device according to an embodiment, and wires disposed in the non-display area.

FIG. 29 is a schematic plan view illustrating a pixel adjacent to a non-display area of a display device according to an embodiment, and wires disposed in the non-display area.

Referring to FIG. 29, a display device 10_5 according to an embodiment may include connection pattern layers RP_5 and bridge pattern layers BRP_5 disposed at the outer portion of the display area DPA. The connection pattern layers RP_5 and the bridge pattern layers BRP_5 may have the trace that the connection pattern layers RP_5 and the bridge pattern layers BRP_5 are connected (e.g., electrically connected) to the data lines DTL1, DTL2 and DTL3, the initialization voltage line VIL, and the first voltage line VL1 and then separated from each other at the outer portion of the display area DPA or in the non-display area NDA.

The connection pattern layers RP_5 and the bridge pattern layers BRP_5 of the display device 10_5 may be disposed in the non-display area NDA disposed on the upper side that is a side of the display area DPA in the first direction DR1. The connection pattern layers RP_5 and the electrodes RME of the display area DPA may be disposed on the same layer, and the bridge pattern layers BRP_5 may be disposed on the third conductive layer. The connection pattern layers RP_5 and the bridge pattern layers BRP_5 may be disposed in a region of the non-display area NDA that is arranged side by side with the pixel PX in the first direction DR1.

The display device 10_5 may include the first scan line SL1 and the second scan line SL2 disposed on the first conductive layer, so that the first and second scan lines SL1 and SL2 may also be connected (e.g., electrically connected) to the first voltage line VL1 during the manufacturing process. The bridge pattern layer BRP_5 may include ninth bridge pattern layers BRP9_5. The ninth bridge pattern layers BRP9_5 may overlap the first voltage line VL1, the initialization voltage line VIL, the first to third data lines DTL1, DTL2, and DTL3, the first scan line SL1, and the second scan lines SL2. The ninth bridge pattern layers BRP9_5 may be in contact with the first voltage line VL1, the initialization voltage line VIL, the first to third data lines DTL1, DTL2, and DTL3, the first scan line SL1, and the second scan line SL2 through ninth bridge contact holes CNTD9. Each of the ninth bridge contact holes CNTD9 may penetrate the first interlayer insulating layer IL1 and the buffer layer BL.

The connection pattern layer RP_5 may include ninth connection pattern layers RP9_5 disposed to respectively overlap the ninth bridge pattern layers BRP9_5. Each of the ninth connection pattern layers RP9_5 may be in contact with each of the ninth bridge pattern layers BRP9_5 through a ninth connection contact hole CTA9. A ninth connection pattern layer RP9_5 and a ninth bridge pattern layer BRP9_5 may form a pair and be connected (e.g., electrically connected) to the first voltage line VL1, the initialization voltage line VIL, the first to third data lines DTL1 and DTL2, and DTL3, and any one of the first scan line SL1 and the second scan line SL2. Seven ninth connection pattern layers RP9_5 and seven ninth bridge pattern layers BRP9_5 may be disposed in the non-display area NDA to correspond to a pixel column of the display area DPA.

The display device 10_5 may include a sixth separation portion ROP6 that is a region disposed in the non-display area NDA and in which the connection pattern layers RP_5 are separated. The connection pattern layers RP_5 may be connected to be integral with each other at the sixth separation portion ROP6 (e.g., a dashed line portion in the sixth separation portion ROP6 of FIG. 29), and separated from each other at the sixth separation portion ROP6 after the alignment process of the light emitting element ED. During the manufacturing process of the display device 10_5, in the alignment process of the light emitting element ED, the first voltage line VL1, the initialization voltage line VIL, the data lines DTL1, DTL2, and DTL3, the first scan line SL1, and the second scan line SL2 may be connected (e.g., electrically connected) to each other through the connection pattern layers RP_5 and the bridge pattern layers BRP_5. After the alignment process of the light emitting element ED, the first voltage line VL1, the initialization voltage line VIL, the data lines DTL1, DTL2, and DTL3, the first scan line SL1, and the second scan line SL2 may not be connected (e.g., electrically connected) to each other, and an electrical signal may be applied independently.

In concluding the detailed description, those skilled in the art will appreciate that many variations and modifications may be made to the embodiments without substantially departing from the principles of the invention. Therefore, the disclosed embodiments of the invention are used in a generic and descriptive sense only and not for purposes of limitation.

What is claimed is:

1. A display device comprising:
a first voltage line and a second voltage line extending in a first direction and spaced apart from each other in a second direction intersecting the first direction;
a data line disposed between the first voltage line and the second voltage line and extending in the first direction;
a first electrode extending in the first direction and electrically connected to the first voltage line;
a second electrode spaced apart from the first electrode in the second direction and extending in the first direction and electrically connected to the second voltage line;
a plurality of light emitting elements disposed between the first electrode and the second electrode;
a first connection pattern layer spaced apart from the first electrode and the second electrode and electrically connected to the first voltage line; and
a second connection pattern layer electrically connected to the data line, wherein
the first connection pattern layer, the second connection pattern layer, the first electrode, and the second electrode are disposed on a same layer, and
the first connection pattern layer and the second connection pattern layer are spaced apart from each other.

2. The display device of claim 1, further comprising:
a third voltage line extending in the second direction to intersect the first voltage line and in contact with the first voltage line; and
a first bridge pattern layer overlapping the data line, wherein
the first connection pattern layer overlaps the first voltage line and the third voltage line and is in contact with the third voltage line, and
the second connection pattern layer overlaps the first bridge pattern layer and is in contact with the first bridge pattern layer.

3. The display device of claim 2, wherein
the third voltage line and the first bridge pattern layer are disposed at a higher level than the first voltage line and the second voltage line, and
the third voltage line and the first bridge pattern layer are disposed at a lower level than a layer below the first connection pattern layer and the second connection pattern layer.

4. The display device of claim 2, further comprising:
a fourth voltage line extending in the second direction; and
an electrode pattern layer disposed between the third voltage line and the fourth voltage line, wherein
the third voltage line, the fourth voltage line, and the first bridge pattern layer are disposed on a same layer,
the first electrode is in contact with the electrode pattern layer, and
the second electrode is in contact with the fourth voltage line.

5. The display device of claim 1, further comprising:
an initialization voltage line extending in the first direction, the initialization voltage line disposed between the first voltage line and the data line;
a second bridge pattern layer overlapping the initialization voltage line, the second bridge pattern layer being in contact with the initialization voltage line; and
a third connection pattern layer overlapping the second bridge pattern layer, the third connection pattern layer being in contact with the second bridge pattern layer.

6. The display device of claim 5, wherein
the third connection pattern layer, the first electrode, the second electrode, the first connection pattern layer, and the second connection pattern layer are disposed on a same layer, and
the third connection pattern layer is spaced apart from the first connection pattern layer and the second connection pattern layer.

7. The display device of claim 6, wherein
the third connection pattern layer is spaced apart from the second connection pattern layer in the first direction, and
the first connection pattern layer is spaced apart from the second connection pattern layer in the second direction.

8. The display device of claim 5, further comprising:
a third electrode spaced apart from the first electrode in the second direction, wherein
the first electrode and the third electrode extend in the first direction and are spaced apart from another first electrode and another third electrode in the first direction by a first separation portion, and
the second electrode is disposed so as not to overlap the first separation portion in the first direction.

9. The display device of claim 8, wherein
the first connection pattern layer and the second connection pattern layer are spaced apart from each other in the second direction by the third electrode on a side of the first separation portion in the first direction, and
the third connection pattern layer is disposed on another side of the first separation portion in the first direction and disposed between the first electrode and the third electrode.

10. The display device of claim 8, further comprising:
a bank layer comprising portions extending in the first direction and the second direction and surrounding a region where the light emitting elements are disposed, wherein
the second electrode intersects the portion of the bank layer extending in the second direction, and
the first separation portion is disposed outside the region surrounded by the bank layer.

11. The display device of claim 1, further comprising:
a display area in which the light emitting elements and the first and second electrodes are disposed;
a non-display area disposed around the display area;
a first bridge pattern layer overlapping the first connection pattern layer and the first voltage line in the non-display area; and a second bridge pattern layer overlapping the second connection pattern layer and the data line in the non-display area.

12. The display device of claim 11, wherein the first connection pattern layer and the second connection pattern layer are spaced apart from each other by a second separation portion, the second separation portion being disposed in the non-display area.

13. The display device of claim 11, wherein the first bridge pattern layer and the second bridge pattern layer are respectively disposed above the first voltage line and the data line and are disposed on a layer disposed below the first connection pattern layer and the second connection pattern layer.

14. A display device comprising:
a display area and a non-display area surrounding the display area;
a first voltage line and a second voltage line extending in a first direction in the display area and the non-display area, the first voltage line and the second voltage line spaced apart from each other in a second direction intersecting the first direction;
at least one data line extending in the first direction and disposed between the first voltage line and the second voltage line;
an initialization voltage line extending in the first direction and disposed between the first voltage line and the data line;
a plurality of bridge pattern layers disposed in the non-display area, the plurality of bridge pattern layers being in contact with any one of the first voltage line, the data line, and the initialization voltage line;
a plurality of connection pattern layers electrically connected to any one of the first voltage line, the data line, and the initialization voltage line, the plurality of connection pattern layers being in contact with any one of the plurality of bridge pattern layers in the non-display area;
a first electrode and a second electrode extending in the first direction in the display area, the first electrode and the second electrode spaced apart from each other in the second direction; and
a plurality of light emitting elements disposed on the first electrode and the second electrode,
wherein the connection pattern layers, the first electrode, and the second electrode are disposed on a same layer as.

15. The display device of claim 14, wherein the plurality of bridge pattern layers are disposed at a higher level than the first voltage line and disposed at a lower level than the connection pattern layers.

16. The display device of claim 15, wherein
the first electrode and the plurality of bridge pattern layers are disposed on a same layer,
the first electrode is in direct contact with an electrode pattern layer electrically connected to the first voltage line,
the second electrode and the plurality of bridge pattern layers are disposed on a same layer, and
the second electrode is in direct contact with a third voltage line in contact with the second voltage line.

17. The display device of claim 16, wherein
the data line includes a plurality of data lines disposed between the initialization voltage line and the second voltage line,
each of the plurality of bridge pattern layers comprises:
  a first bridge pattern layer in contact with the first voltage line,
  a plurality of second bridge pattern layers respectively in contact with the plurality of data lines, and
  a third bridge pattern layer in contact with the initialization voltage line, the connection pattern layer comprises:
  a first connection pattern layer in contact with the first bridge pattern layer,
  a plurality of second connection pattern layers respectively in contact with the plurality of second bridge pattern layers, and
  a third connection pattern layer in contact with the third bridge pattern layer, and
the first connection pattern layer, the second connection pattern layers, and the third connection pattern layer are spaced apart from each other.

18. The display device of claim 17, further comprising a plurality of scan lines extending in the first direction and disposed across the display area and the non-display area,
wherein any one of the plurality of bridge pattern layers is in contact with any one of the scan lines, and any one of the connection pattern layers is in direct contact with the plurality of bridge pattern layers in contact with the scan line.

19. The display device of claim 16, further comprising a plurality of sub-pixels arranged in the first direction and the second direction in the display area, the sub-pixel comprising the first electrode, the second electrode, and the light emitting elements,
wherein each of the connection pattern layers and the plurality of bridge pattern layers is disposed in the non-display area disposed on a side of the display area in the first direction, and corresponds to each column of the sub-pixels arranged in the second direction.

20. The display device of claim 16, further comprising a plurality of pixels arranged in the first direction and the second direction in the display area, the pixel comprising the first electrode, the second electrode, and the light emitting elements,
wherein each of the connection pattern layers and the plurality of bridge pattern layers is disposed in the non-display area disposed on another side of the display area in the first direction, and corresponds to each column of the pixels arranged in the second direction.

* * * * *